(12) United States Patent
Williams et al.

(10) Patent No.: US 6,307,755 B1
(45) Date of Patent: Oct. 23, 2001

(54) SURFACE MOUNT SEMICONDUCTOR PACKAGE, DIE-LEADFRAME COMBINATION AND LEADFRAME THEREFOR AND METHOD OF MOUNTING LEADFRAMES TO SURFACES OF SEMICONDUCTOR DIE

(76) Inventors: Richard K. Williams, 10292 Norwich Ave., Cupertino, CA (US) 95014; Allen K. Lam, 34373 Eucalyptus Terrace, Fremont, CA (US) 94555; Alexander K. Choi, 10366 Heney Creek Pl., Cupertino, CA (US) 95014

(*) Notice: Subject to any disclaimer, the term of this patent is extended or adjusted under 35 U.S.C. 154(b) by 0 days.

(21) Appl. No.: 09/322,127

(22) Filed: May 27, 1999

(51) Int. Cl.[7] ...................................................... H05K 1/18
(52) U.S. Cl. ........................ 361/813; 361/820; 361/760; 361/764; 257/666; 257/668; 257/669; 257/670; 257/676; 174/52.1; 174/260; 174/261
(58) Field of Search ..................................... 361/813, 820, 361/760, 764, 767; 257/666, 668, 669, 670, 672, 673, 676; 174/52.1, 52.4, 260, 261

(56) References Cited

U.S. PATENT DOCUMENTS

| | | |
|---|---|---|
| 4,935,803 | 6/1990 | Kalfus et al. ............................ 357/68 |
| 5,099,306 * | 3/1992 | Dunaway et al. ..................... 257/666 |
| 5,302,849 | 4/1994 | Cavasin ................................ 257/666 |
| 5,409,866 * | 4/1995 | Sato et al. .............................. 29/827 |
| 5,544,412 | 8/1996 | Romero et al. ........................ 29/832 |
| 5,598,033 | 1/1997 | Behlen et al. ......................... 257/686 |
| 5,638,596 | 6/1997 | McCormick ............................ 29/827 |
| 5,665,996 | 9/1997 | Williams et al. ..................... 257/401 |
| 5,677,569 * | 10/1997 | Choi et al. ............................ 257/686 |
| 5,714,792 * | 2/1998 | Przano ................................... 257/670 |
| 5,723,899 * | 3/1998 | Shin ....................................... 257/666 |
| 5,917,242 * | 6/1999 | Ball ....................................... 257/737 |
| 5,998,857 * | 12/1999 | Tzu ........................................ 257/670 |
| 6,040,626 | 3/2000 | Cheah et al. .......................... 257/735 |
| 6,066,515 * | 5/2000 | Schoenfeld ............................ 438/123 |
| 6,072,228 * | 6/2000 | Hinkle et al. ......................... 257/666 |

\* cited by examiner

Primary Examiner—Jeffrey Gaffin
Assistant Examiner—David Foster
(74) Attorney, Agent, or Firm—Skjerven Morrill MacPherson LLP; David E. Steuber

(57) ABSTRACT

A leadframe for making an electric connection to a semiconductor die contains a plurality of notches which correspond to the edges of the die. Shorts are thereby prevented between the leadframe and electrical elements near the edge of the die, even when the leadframe is bent in the direction of the die to make a surface mount package. Alternatively or additionally, the leads in the leadframe may contain moats which prevent the epoxy or solder used to attach the leadframe to a die from spreading outward and thereby creating electrical shorts with other leads.

13 Claims, 56 Drawing Sheets

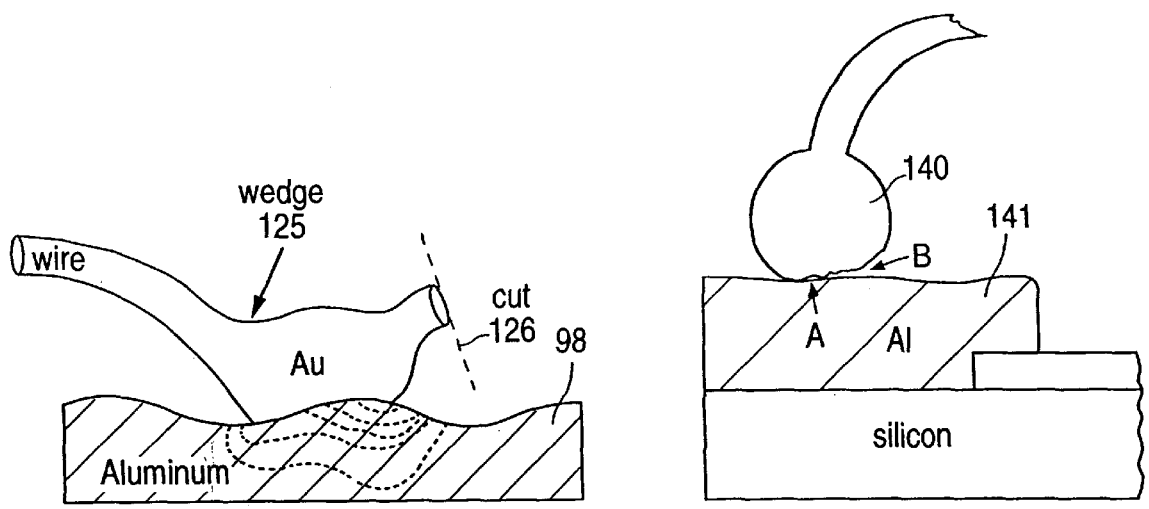
Fig. 9B
(Prior Art)
Fig. 9D
(Prior Art)
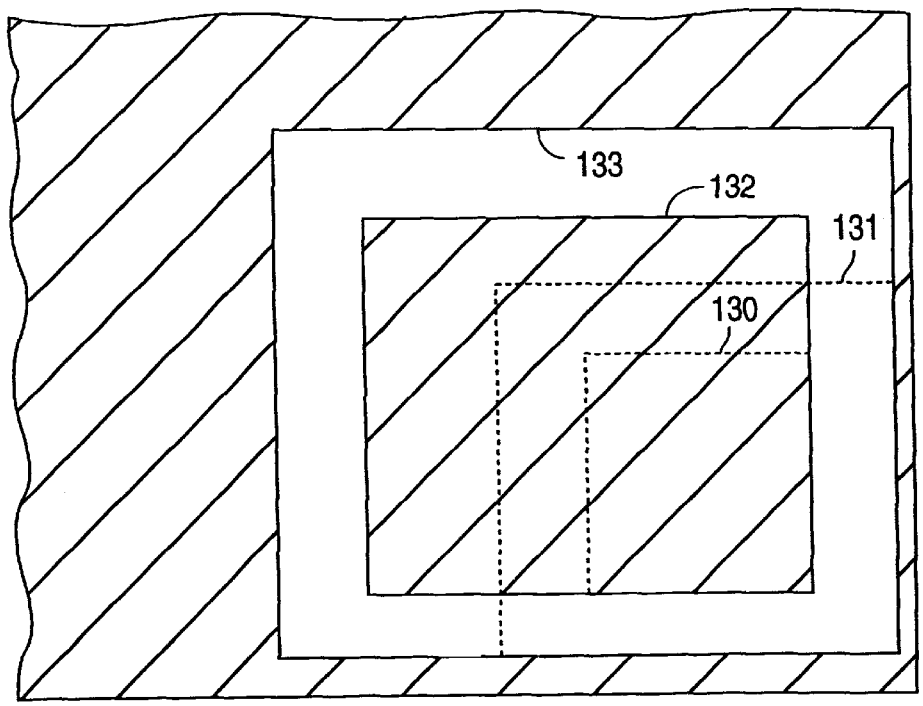
Fig. 9C
(Prior Art)

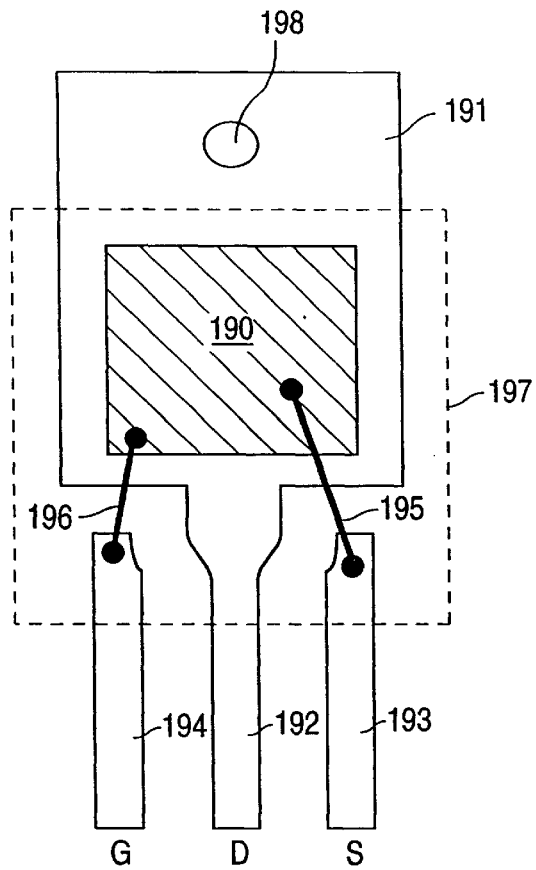
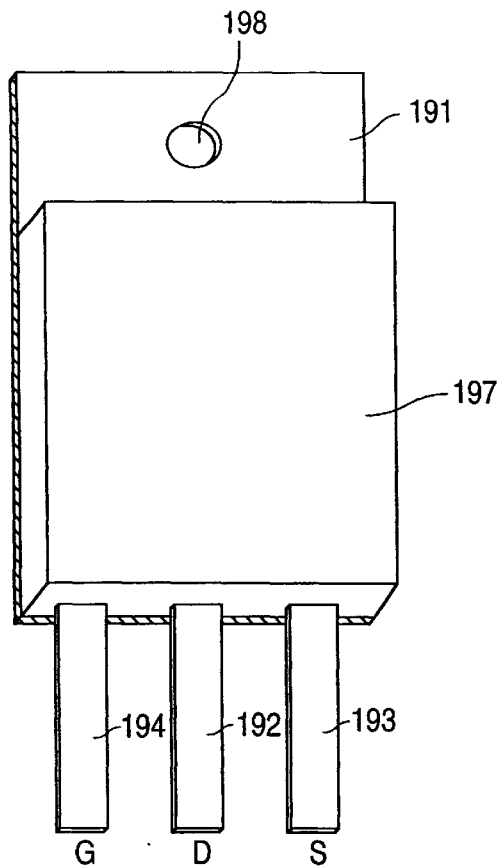
Fig. 12A
(Prior Art)
Fig. 12B
(Prior Art)
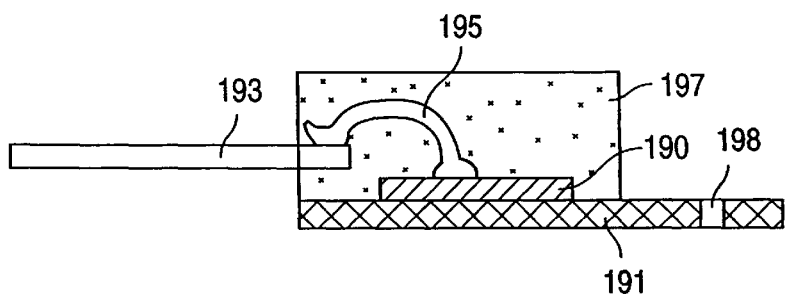
Fig. 12C
(Prior Art)
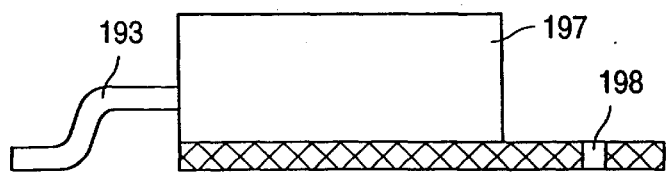
Fig. 12D
(Prior Art)

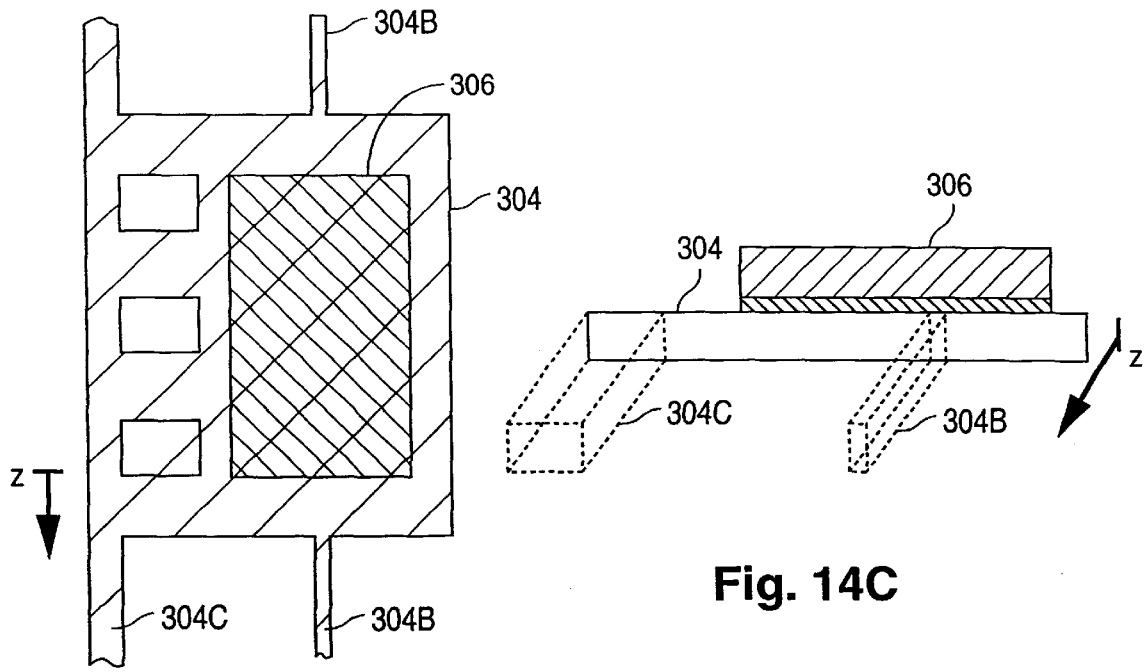
Fig. 14C
Fig. 14B
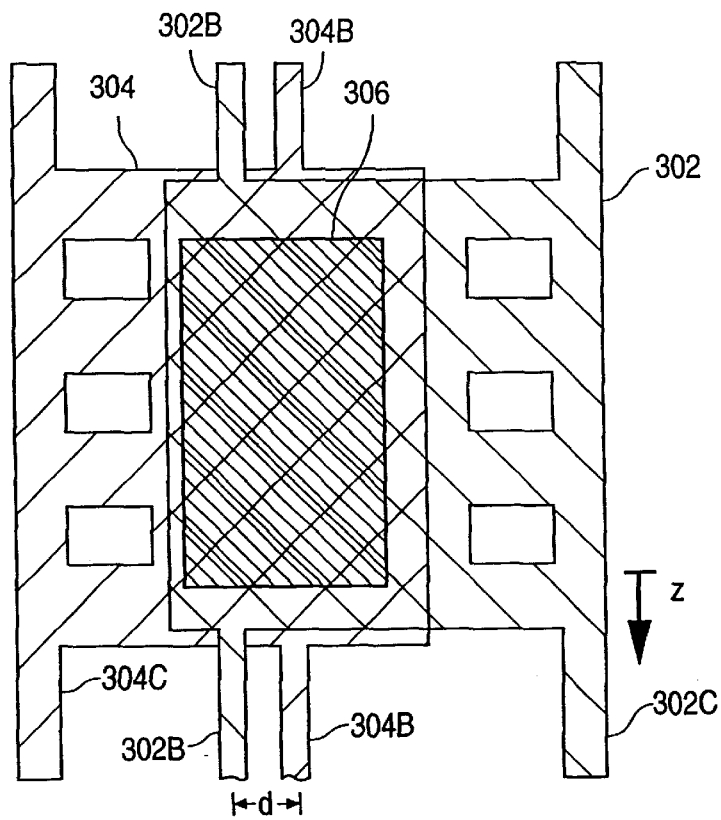
Fig. 14D

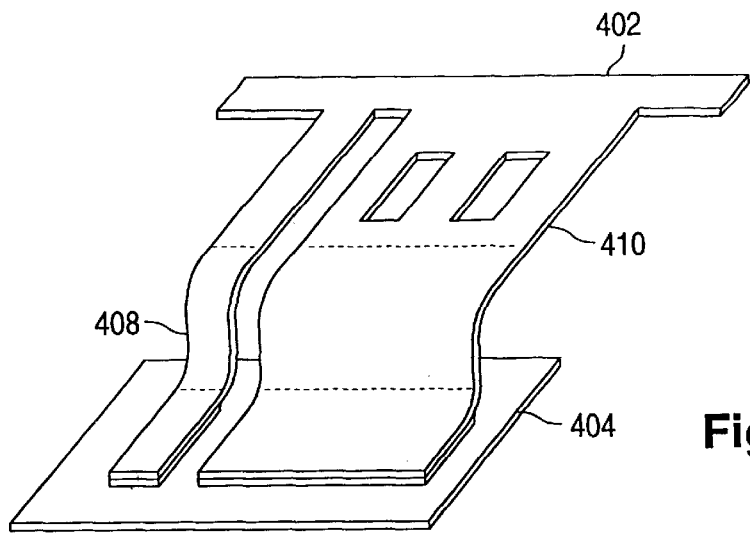
Fig. 17B
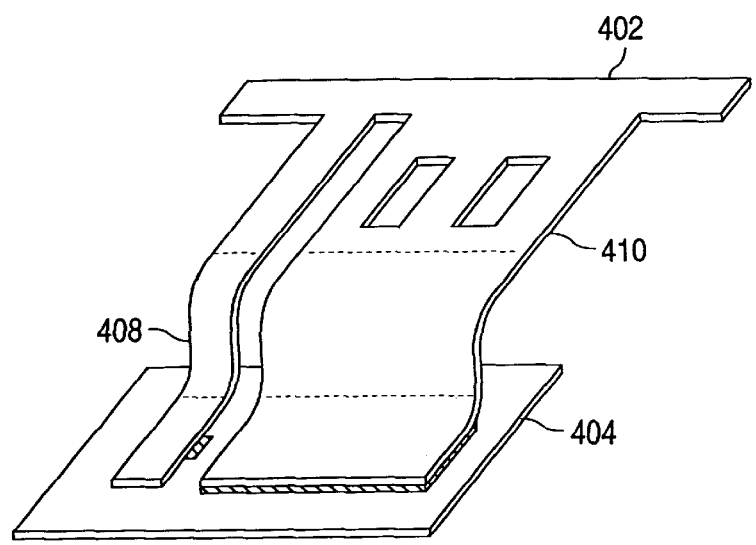
Fig. 17C
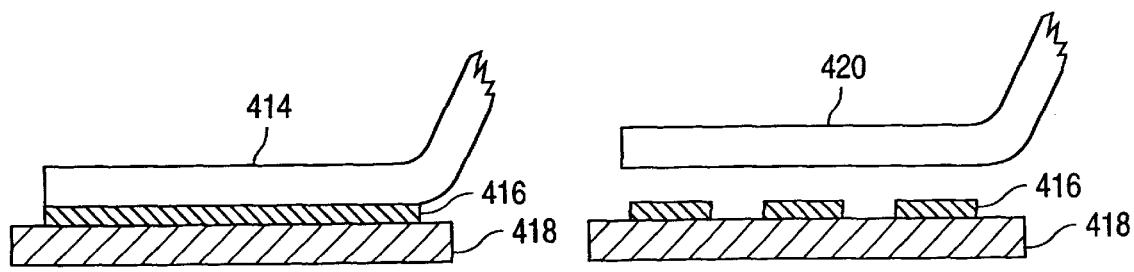
Fig. 17D   Fig. 17E

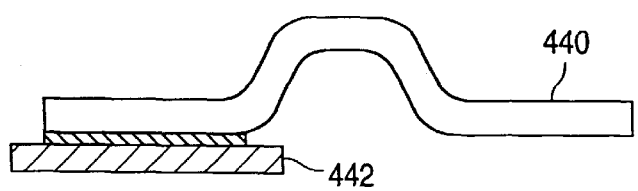
Fig. 18B
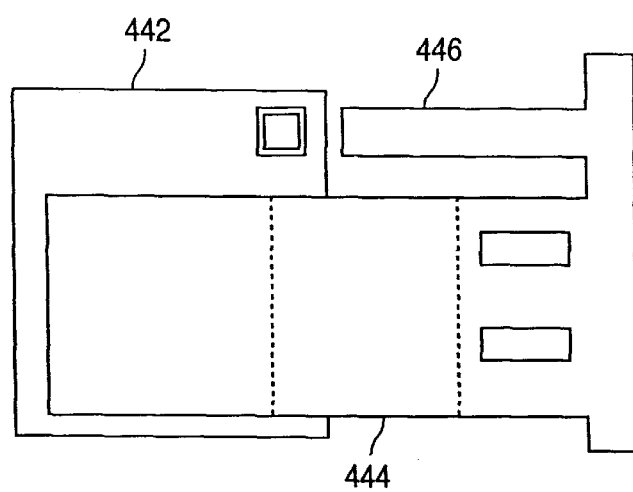
Fig. 18C
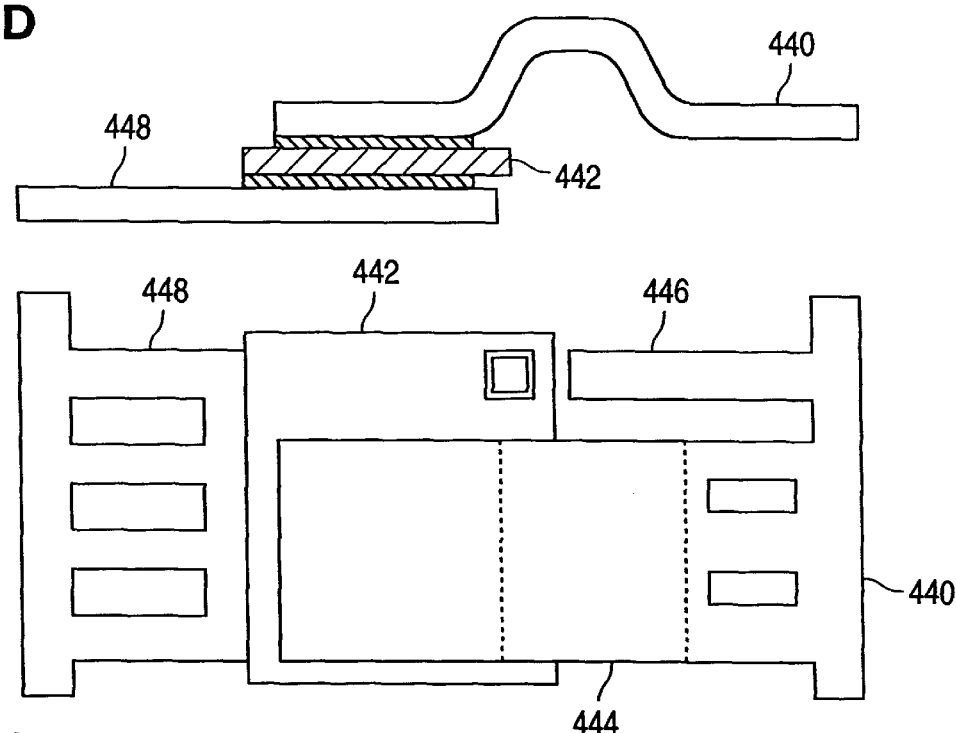
Fig. 18D
Fig. 18E

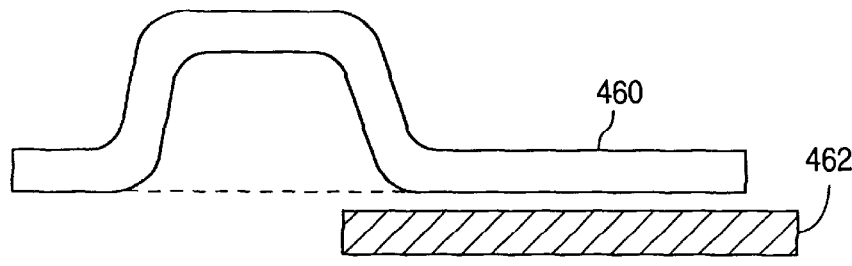
Fig. 19B
(Prior Art)
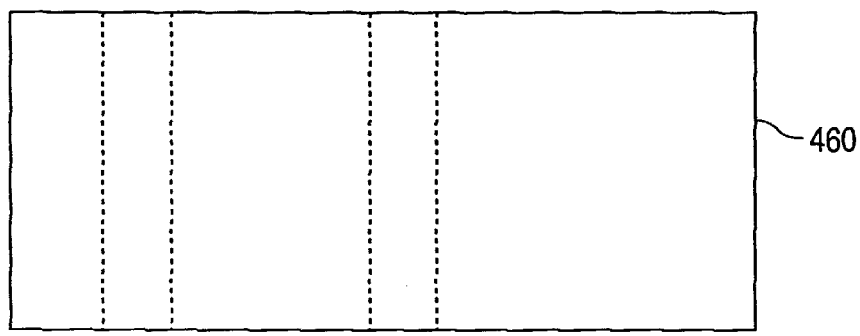
Fig. 19C
(Prior Art)
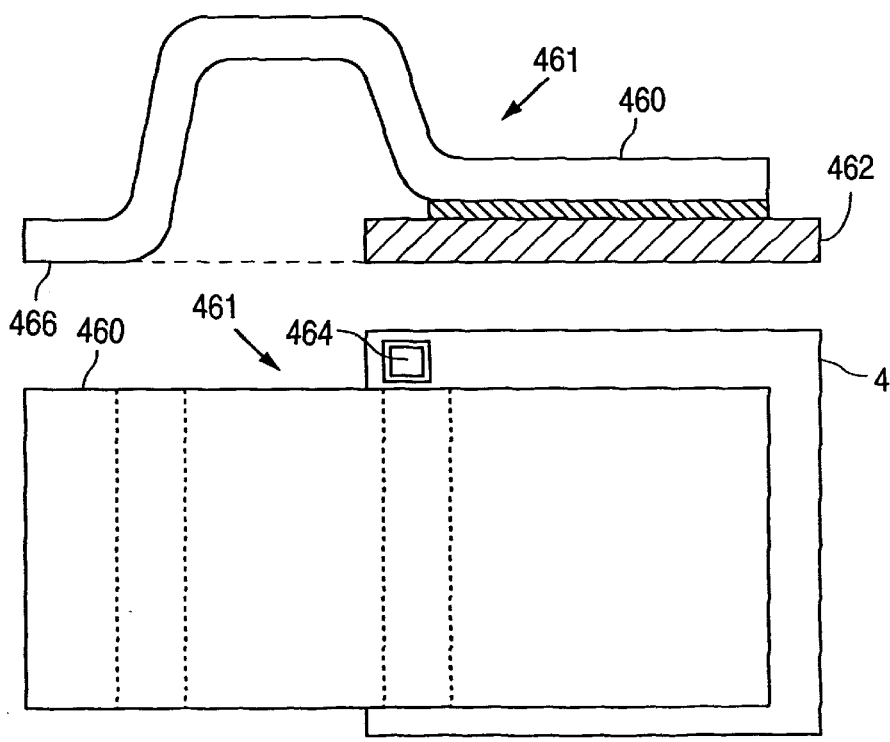
Fig. 19D
(Prior Art)
Fig. 19E
(Prior Art)

Fig. 26D
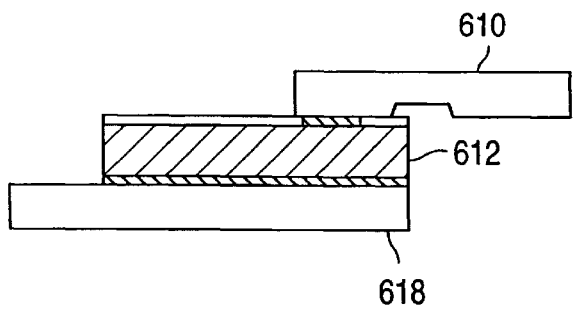
Fig. 26E
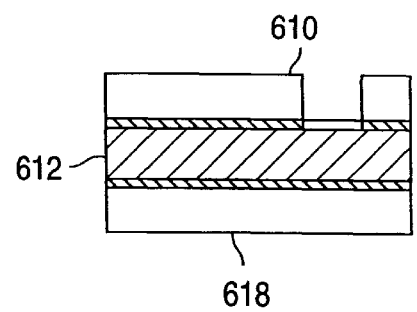
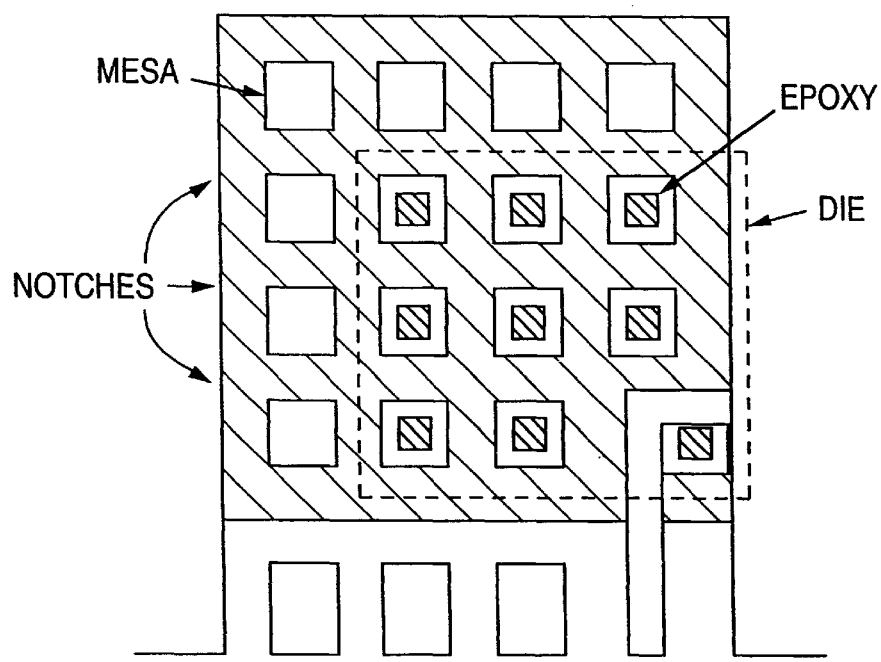
Fig. 27A
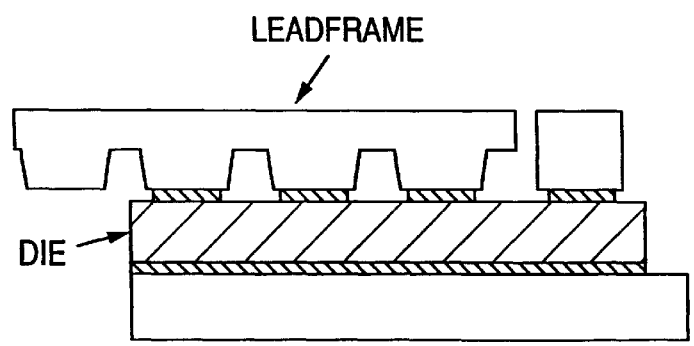
Fig. 27B

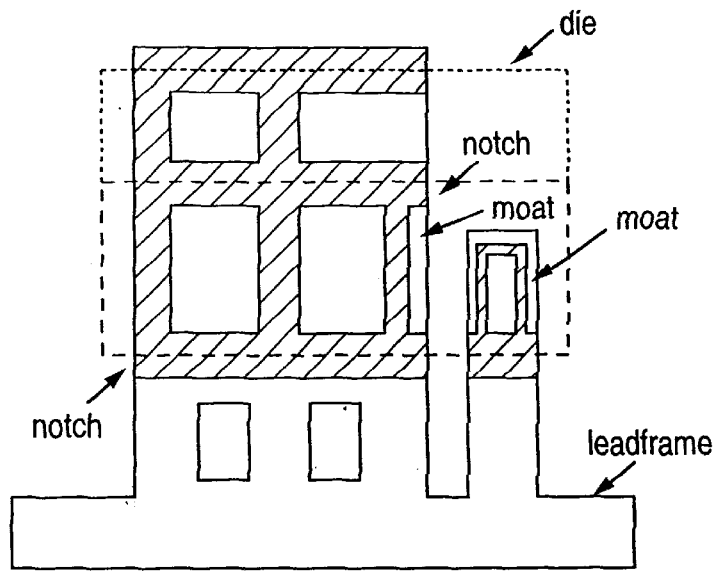
Fig. 28I
Fig. 28J
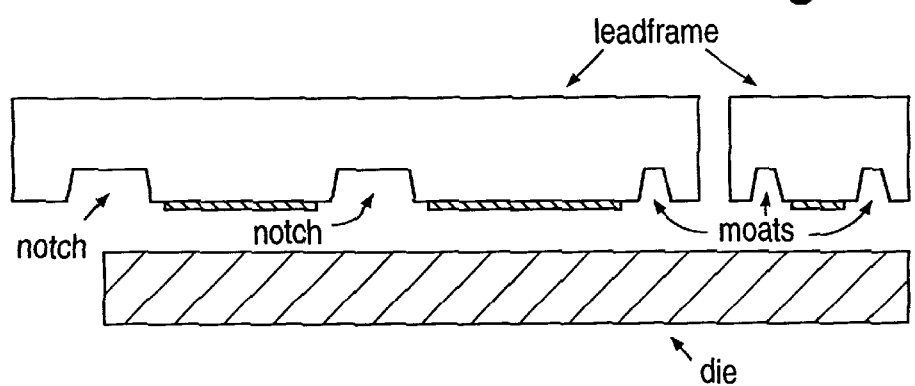
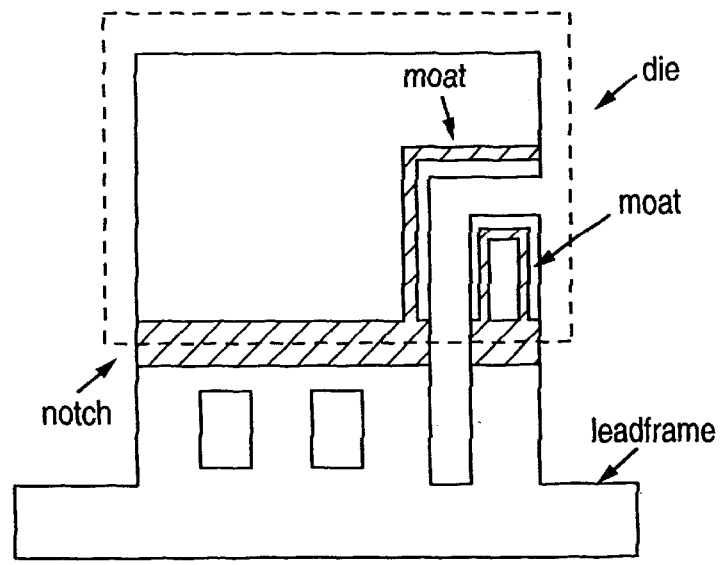
Fig. 28K

SURFACE MOUNT SEMICONDUCTOR PACKAGE, DIE-LEADFRAME COMBINATION AND LEADFRAME THEREFOR AND METHOD OF MOUNTING LEADFRAMES TO SURFACES OF SEMICONDUCTOR DIE

BACKGROUND OF THE INVENTION

Semiconductor devices in the form of integrated circuit chips (ICs) must typically be mounted on a flat surface such as a printed circuit board when they are incorporated into a product such as a computer or cellular phone. No surface-mount semiconductor packaging technology exists today that is capable of meeting the needs of the next-generation of discrete power semiconductor devices and Ics.

Such surface-mount power packages should include at least the following features:

1. A low electrical resistance.
2. The capability of shunting current and reducing the lateral resistance in a device's metal interconnect.
3. A low thermal resistance.
4. The capability of achieving high currents vertically (through backside) or laterally (topside).
5. High manufacturability.
6. A low intrinsic material cost.
7. A low manufacturing cost.
8. Reliable operation in power applications.
9. The ability to acilitate at least three (and preferably more) isolated connections to the semiconductor.
10. A low profile (height) and small footprint.

Power semiconductor devices and ICs come in two types, those that conduct high currents because they exhibit low on-state voltage drops (and hence low power dissipation) and those that conduct "high" currents because they dissipate large amounts of power. Because of the varied use, construction, and operation of such power devices, the first two features listed (i.e. low electrical resistance) can be achieved in lieu of the third feature (low thermal resistance), but ideally one package should offer both low electrical and thermal resistance.

The fourth feature, a high current flow laterally or vertically, specifies that a power package should ideally be applicable to both lateral and vertical power devices, but at least one of the two orientations should be high current capable.

Of course, the package must be highly manufacturable since power transistors are used in high quantities, billions of units yearly, worldwide. Any a intrinsic manufacturing repeatability or yield problem would have dire consequences for the supplier and likely the user of such devices.

Another feature is low cost, including the package material cost and the cost of its manufacture. Of these, the material cost is fundamental since the price of certain materials such as gold wire, plastic molding, copper leadframes, etc., are based on the world market for the raw material and cannot be substantially changed through simple increases in semiconductor product volume. Package designs using smaller amounts of material are inherently cheaper to produce.

The reliability of a package in a power application means it must survive operating conditions commonly encountered in power device use, such as current spikes, higher ambient temperatures than normally encountered, significant self heating, thermal shock from repeated thermal transients, etc. Repeated pulses of current or heating can provoke fatigue-related failures, particularly at metallurgical junctions and interfaces. Fewer interfaces are preferable.

Two terminal packages are needed for diodes, transient suppressors, and fuses, while packages supporting at least 3 connections are useful for discrete transistors. Four connections up to 8 connections are extremely valuable for a variable of smarter power semiconductor components. Beyond 8 distinct connections, the use of such power package technology is concentrated on power integrated circuits.

Low profile surface mount packages, while not universally required, make it convenient for PC board manufacturing since power devices packaged in low profile packages have the same characteristics of other ICs on the same board and hence avoid the need for special handling. In some cases like battery packs, PCMCIA cards and cell phones, the low profile package may be crucial in meeting a critical thickness in the final end product.

Small footprint is generally a matter of overall product size, especially in portable electronics where size is an important consumer buying criteria—the smaller the better.

In a related consideration, the smaller the package footprint is on the board and the larger the semiconductor die it contains, the performance for a given size is greater.

While these goals may seem obvious, the fact is that today's power semiconductor-packaging technology does not meet these needs adequately, cost effectively, and in some cases, at all.

Present Surface Mount Package Approaches

FIG. 1 describes the process flow for the manufacture of a conventional prior-art surface mount package, such as the 8-pin small-outline (SO-8) package originally developed for ICs, or the ubiquitous 3-pin small outline transistor (SOT23) package. The flow starts with one or more semiconductor dice, a metal leadframe, and conductive epoxy or solder to attach the dice to the leadframe in an area known as the die pad. The assembly is then wire-bonded, connecting the metal "posts" of the package to the aluminum bonding pads on the device or IC with gold (or in some cases aluminum) wire. The bonding uses a thermo-compression or ultrasonic technique to achieve a good electrical connection and sufficient mechanical strength to withstand the subsequent manufacturing steps and operating conditions. After wire-bonding, the leadframe, still held together by a series of metal straps or tie-bars, is placed in a mold and subsequently injected with hot liquid plastic, also known as molding compound.

After the plastic cools, it provides mechanical rigidity to the bond wires, the die pad, and the package leads, so that the external leads can be clipped from any tie bars, thereby separating the unit from any others which may have been manufactured on the same tie bar.

Finally the leads are bent into their final shape. The bending process requires "clamping" the leads so that undue mechanical stress is not placed on the plastic package which could lead to cracking of the plastic.

FIG. 2 illustrates the prior art leadframe 10 comprising a repeated cell 11 (with die pad 12 and lead-assembly 13A and 13B) repeated 5 to 25 times in a strip. The strip comprises three tie bars that hold the repeated cells together in the strip until later separated after plastic injection molding has occurred. The tie bars comprise two outer tie bars 14A and 14C, holding the package leads 15A and 15B in place, and an inner tie bar 14C that holds the die pad 12 secure during the assembly process. The actual number of pins may vary depending on the package, with 3-, 6-, 8-, 14- and 16-pin packages being commonly employed. An end-piece 16

(located on each end) holds the entire strip together during manufacture, by securing tie bars 14A, 14B, and 14C.

the edge of the silicon die 17 or to die pad 12. Table 1 below defines some typical values for each dimension.

TABLE 1

| Rule | Design Rule Description | Value (mm) | Failure Mode |
|---|---|---|---|
| X1 | Minimum plastic above top of wire | 0.08 | Prevent exposed wire (on top) |
| X2 | Wire loop height | 0.13 | Avoid wire short to die edge |
| X3 | Chip thickness | 0.28 | Thin without breaking |
| X4 | Lead frame thickness | 0.2 | Minimize lead resistance |
| X5 | Minimum plastic below leadframe | 0.08 | Prevent exposed die pad |
| X6 | Plastic clearance above board (standoff) | 0.15 | Lead (not plastic) must touch PCB |
| XT | Total package height (profile) | 1.7 | Minimize package thickness |
| Y1 | Minimum lead foot | | Lead must land on PCB pad |
| Y2 | Minimum extension of lead past plastic | | Need room for lead clamp |
| Y3 | Minimum plastic enclosure of wire | | Prevent exposed wire (on side) |
| Y4 | Minimum post foot width for bonding | | Need room for wire wedge bond |
| Y5 | Minimum die pad to lead space | 0.25 | Avoid lead to die pad short |
| Y6 | Space of die inside die pad | 0.13 | Avoid chip overhang & breakage |
| Y7 | Bond depth inside of chip edge | 0.10 | Avoid die edge cracking |
| YW | Max lateral dimension of wire length | 1 | Avoid high wire resistance & sag |
| YC | Maximum die dimension (narrow direc) | 1.3 | Maximize die area |
| YT | Total lead to lead board footprint | | Minimize package board area |

The actual board dimension required by the package is given by
YT = YC + 2 · (Y6 + Y5 + Y4 + Y3 + Y2 + Y1)
XT = X6 + X5 + X4 + X3 + X2 + X1

FIGS. 3A–3G illustrate cross sectional views of the steps of the flow described in FIG. 1.

The leadframe 10 in FIG. 3A includes the center die pad, and two of the leads 15A and 15B. In FIG. 3B, the semiconductor die 17 is attached (using a thin layer of solder or epoxy not shown) to the die pad 12. The die-attach operation is then followed by wire bonding in FIG. 3C. For each of the bond wires 18 the ball bond 19 (the first bond performed) is present on the die, and the wedge bond 20 (the last bond for each wire) is present on the lead (also called the post). The wedge bond occurs where the wire is cut. The difference between the shape of the ball bond and the wedge bond is characteristic of the wire bonding machine's operation. The wedge bond is preferred on the leadframe 15A and 15B to avoid the risk of damage to the semiconductor from the stress associated with the wire cutting.

In FIG. 3D, the plastic 21 is injected (shown by a dotted line) to cover each die 17 and its associated bond wires 18 and leads 15A, 15B as shown in the top view of FIG. 3E. The tie bars 14A and 14B are intentionally left uncovered. A portion of tie bar 14C is covered by the plastic but the most of tie bar 14C remains uncovered. After trimming, the individual packaged die and its separate leads are held together by the plastic. The tie bars 14A and 14B, along with a small portion of leads 15A and 15B are cut away by a mechanical cutting machine, thereby separating the final packaged product 11 from others on the same strip. The tie bar 14C connected to the die pad 12 is trimmed flush with the plastic package outline 21. Finally, the leads 15A and 15B are bent for surface mounting as shown in FIG. 3G.

FIG. 4A illustrates the size restrictions in a conventional prior-art SO-8 package mounted on printed circuit board (PCB) 22. Design rules are chosen to achieve both high manufacturability and reliability. For example the design rule X1, the minimum allowable plastic above the top of the bond wire, must guarantee that any bond wire 18 does not become exposed, i.e. protrude through the plastic, under any circumstance during manufacturing. The wire bond height X2 is especially restrictive in setting the minimum possible height of the package, since it must have a sufficient loop height to prevent accidental shorting from bond wire 18 to where the YT is the narrow direction of the package.

The design rule Y7 is determined by the edge construction of the die needed to avoid die cracking due to bonding and to allow a die edge termination or scribe seal (to prevent ionic contamination from leaking into the die), as shown in FIG. 4B. In the example shown, a silicon die having a P-type substrate 31 is die-attached to the package die pad 30. The die pad and leadframe may be copper but typically are constructed out of lower cost Alloy-42, a nomenclature common to the packaging industry. The substrate contains a region of high P-type concentration 32 (referred to as P+) and another region of heavily doped N-type material (N+) 33 biased at a potential dissimilar to the P-substrate 31 and P+ region 32. A space 40 separating N+ region 33 and substrate-connected P+ region 32 is needed to support the voltage difference between these regions. The N+ region 33 is contacted by a contact opening 34 in a glass or oxide layer 38 and covered with a bond-pad area metal layer 35. P+ region 32 is also contacted by opening 36 which extends to the chip edge 41, a portion of which is contacted by metal layer 37. The surface is covered by a glass or silicon nitride passivation layer 39 except where openings are necessary to expose bonding pad areas such as exposed metal 35. The bond pad is attached to a bond wire 42, typically made of gold or aluminum. Ball bond 43 occurs at the point of wire bonding.

The design rule Y7 is needed to prevent electrical failures due to shorts between N+ region 33 and bond wire 42 with the P-substrate 31. For example if bond wire 42 accidentally shorts to die edge 41 or P+ region 32, an electrical failure will result. Likewise, ball bond 43 must not crack passivation layer 38 or 39 and create a short to metal 37. The sawed silicon edge 41 cannot be allowed to crack the silicon or intrude into region 40, or else it will cause a failure. While the Y7 rule varies from one device to another, it reduces the amount of usable silicon that can be devoted to active device structures. This region can then be referred to as the "edge termination" of the device or integrated circuit. It can vary in dimension from 0.025 mm to 0.250 mm depending on the type of chip, its technology, and the maximum voltage of the device or IC being assembled.

In the package shown in FIGS. 2–4, the percentage of the PCB area that is actually utilized by active silicon can be quite small, as low as 25% in small packages. The low area utilization occurs from wasted space resulting from mechanical design rules such as rule Y5 and Y6. Moreover, electrical contact to the backside of the silicon die and the die pad are assumed to occur through a topside contact in the silicon. While such an approach may be satisfactory in low current ICs, in vertical discrete ICs and vertical power MOSFETs, a substantial current can occur vertically into the die pad. Wire bonding to the die pad further reduces the usable die pad area and hence the active silicon area. Wire bonds also introduce additional series resistance into the package.

FIGS. 5A–5G offer a series of cross-sectional and top views of a prior art package that is better suited to vertical power devices than the package shown in FIG. 3. Specifically, FIG. 5A illustrates a modified leadframe 50 that is an improvement on a conventional leadframe, enhancing its power dissipation and eliminating the need for wire bonds to connect to the backside of the silicon die. In this prior art design, multiple leads 59 extend directly from the die pad 52 to the outside of the package without the need for bond wires. The combination of die pad 52, leads 59, and tie bars 54 and 55, together comprise assembly 56A. The other assembly 56B is composed of leads 58 and tie bar 57 as in the aforementioned conventional leadframe 10. The entire unit cell 51 is repeated at regular intervals and held together by an end piece as in the previous leadframe example. It should be noted while assembly 56A merges leads 59 into die pad 52, the assembly appears as though die pad 52 is larger and "holes" 53 have been cut out of the die pad.

Furthermore, it should be clarified that such a design is normally only useful in vertical power device packaging since half the available leads are dedicated (shorted) to the substrate connection. The reduced number of uncommitted pins makes such a package less useful for integrated circuits where a large number of electrical connections may be needed.

In FIG. 5B, a vertical power device 60 is attached with solder or conductive epoxy to the leadframe assembly 56A in die pad area 52, followed by wire bonding in FIG. 5C. Each wire bond 61 comprises a ball bond 62 and a wedge bond 63, normally with the wedge bond landing on the leadframe, not the silicon die 60. Only one set of wires can be (or need be) bonded since the leads on the opposite side of the package are tied to the die pad. In FIG. 5D, the plastic 64 is injection-molded, as further described in the top view drawing of FIG. 5E. Since one set of bond wires is eliminated in the path of current, the package resistance is thereby reduced in vertical current flow devices. FIG. 5F shows an individual die and unit cell 51 after it and its package are trimmed from the leadframe and tie bars. FIG. 5G illustrates the same device after lead bending.

FIGS. 6A–6C illustrate and define the terminology of the electrothermal characteristics of surface-mount-packaged semiconductor components, characteristics important in comparing power semiconductor devices. In the schematic of FIG. 6A, a power MOSFET 70 is electrically in series with a source resistance 71 having a value $R_S$ and a drain resistance 72 having a resistance $R_D$. The value of $R_S$ varies primarily with the number of bond wires used, depending on the space available within the package. $R_S$ ranges from 50 mΩ (using one minimum sized wire bond) to at the lowest 4 mΩ when using as many as sixteen bond wires. The drain resistance $R_D$ is identical to $R_S$ in the conventional packages shown in FIG. 2. In power packages such as the one shown in FIG. 5, the drain resistance is simply the copper leadframe resistance, typically a fraction of a milliohm.

FIG. 6A also illustrates the thermal characteristics of a semiconductor schematically where the MOSFET 70 is a heat source releasing heat into the ambient and into printed circuit board (PCB) 73. Heat released directly from the plastic package into the ambient occurs mostly by convention and has a thermal resistance $R\Theta ja$ in the range of 160° C./W. or even higher. The steady state conduction of the heat from the package into the board depends on the package design. In a conventional package, heat conduction must occur from the die into the leadframe via only the bond wires. The thermal resistance from the "junction" to the board $R\Theta jb$ is around 80° C./W. Assuming the convection from the PCB to the ambient has a thermal resistance $R\Theta ba$ of around 35° C./W., the total thermal resistance of the conventional package is then around 115° C./W. Using the power package design of FIG. 5, the thermal resistance from the "junction" to the board $R\Theta jb$ is improved to approximately 20° C./W., for a total junction to ambient thermal resistance of 55° C./W. While this is not as low as needed (ideally in the range of 1° C./W.) it is a substantially better than the traditional IC package.

FIG. 6B illustrates a commercial data sheet curve of thermal resistance versus the duration of a pulse of power (in seconds), for single and repeated pulses. The thermal resistance is normalized to the steady state (continuous power dissipation) thermal resistance value. Unity is therefore the same as continuous operation. Note that the thermal resistance is lower than the steady state value during short pulses of power because the silicon itself absorbs some of the heat. Around 2 milliseconds, the change in slope of the curve reflects the influence of the backside of the die and the die attach, meaning the heat traveled (diffused) through the entire silicon wafer before it reached the leadframe. At approximately 1 second, the printed circuit board, the ambient, and thermal convection come into play. If heat could be extracted sooner the performance of the die would improve during high power pulsed operation. A lower thermal resistance package is needed to improve the continuous power dissipation of the package.

Self-heating raises the temperature of the silicon by an amount given by the expression $$\Delta T = P \cdot R_{\Theta ja}$$

where a rise in temperature may in turn increase the resistance of the MOSFET. Depending on the circuit, an increase in resistance can lead to a further increase in power dissipation and more self-heating.

The package resistance also places a limit on the maximum useful die size for a power device. FIG. 6C illustrates the on resistance versus die size of four different power MOSFET technologies, labeled by their specific on-resistance (i.e. the resistance-area product) as 3, 1, 0.3, and 0.1 mΩcm². Technologically, 3.0-mΩcm² represents a device and process technology several years ago (circa 1992), while 0.1 mΩcm² is more advanced than state-of-the-art devices today. The ideal silicon resistance, illustrated by the thin curves labeled B, D, G, and H, follows a hyperbolic curve given by the relation $$R_{device} = \frac{RA_{technology}}{A_{device}}$$

The package resistance, labeled as $R_{package}$, is shown constant at 3.5 mΩ. The total resistance of the product curves A, C, E and F shows an asymptotic behavior limited to a minimum value determined by the package resistance by the relation $$R_{product} = R_{package} + R_{device} = R_{package} + \frac{RA_{technology}}{A_{device}}$$

While the package resistance had a negligible influence on products several generations ago, new silicon power MOSFET technology is now compromised by high package resistance. Silicon device areas over 1 to 1.5 mm² deviate substantially from their ideal performance values. For example for a 0.1-mΩcm² MOSFET technology and a 10-mm² die, the silicon resistance is 1 mΩ (curve H) while the packaged die is 4.5 mΩ (curve F), more than four times the silicon value. The increased on-resistance lowers efficiency and increases self-heating in the device, further degrading its performance.

FIGS. 7A–7F illustrate a variety of prior-art vertical power devices requiring power-packaging technology. In FIG. 7A a vertical planar DMOSFET is shown in cross section. Starting with a heavily doped (N+) substrate 81, an epitaxial layer 82 is grown to a thickness of 2 to 20 um (depending on the target breakdown of the device). P-type body region 83 and N+ source regions 84 are then implanted and diffused, generally self-aligned to a polysilicon gate 86. The polysilicon gate 86 is separated from the underlying silicon by a thin gate oxide layer 85 having a thickness of 100 to 1000 Å. The gate (and the entire device) is also generally covered in a glass to avoid shorting to overlying source metal 88. The glass is removed in locations between the gate regions forming contact windows 87 whereby the source metal 88 is able to contact N+ source regions 84 and, through P+ region 89, P-type body regions 83.

The operation of the device involves impressing a voltage on gate 86 so as to invert the P-type body region located on the planar surface of the silicon under the gate, and allow channel conduction between the source 84 and the epitaxial drain 82. As illustrated by the dotted lines, the current flows laterally along the planar surface of the device through the double-diffused channel of the device (hence its name "planar" DMOSFET). Once through the channel, the current then turns and flows vertically to the backside, expanding in area till the epitaxial conducting region abuts current conduction in an adjacent cell. To package such a device, a low resistance path must be available both on the surface and on the backside of the device. The gate must also be connected to the surface. So unlike a P-N diode, one side needs at least two electrical connections, one of which must carry high currents.

FIG. 7B illustrates a trench gated vertical power MOSFET 90, similar to planar DMOSFET 80, except that the gate is embedded in a trench etched in the silicon surface. In this device, epitaxial layer 92 is formed on N+ substrate 91, followed by the formation of the trench gate. The trench gate is a region where the silicon is removed via photomasking and reactive ion etching, followed by formation of the gate oxide layer 95, and filling with the polysilicon gate 96 so that a nearly flat surface results. The flat surface occurs from overfilling the polysilicon, then etching it back near the top of the trench. The P-type body region 93 is then formed within the silicon mesa located between adjacent trenches. N+ source and P+ body contact implants are formed within P-type body region 93. A glass is generally deposited over then entire surface after which a contact window 97 is then etched to expose and electrically short the N+ source region 94 and P+ region 97 to the topside metal layer 98. Operation is similar to planar DMOS 80 except that channel conduction occurs vertically alongside the sidewall of the trench.

FIG. 7C illustrates the plan view of either vertical planar DMOSFET 80 or trench gated DMOSFET 90. Most of the device is covered by a source metal layer 100. Gate pad 101 is another metal region electrically isolated from the source by 2 to 15 um of spacing. The outer edge of the device also includes a metal ring 102 shorted to the drain potential, referred to as an equipotential ring or EQR, primarily introduced for purposes of achieving improved reliability against ionic migration. This outer ring is a source of risk for an accidental short between the source or gate connections during assembly. The silicon also extends beyond this ring by another 20 to 70 um, to the location indicated by the dashed line 103. The protruding silicon varies in dimension due to the sawing process when the wafer is cut into separate dice. This area of the die is also biased at the drain potential and may short to a source or gate connected bond wire during packaging.

In FIG. 7D, a metal gate finger 104 runs down the center of the device splitting source metal 100 in half except at the end of the finger. Package connections (e.g. bond wires) are therefore required to be made to both halves of the source metal to prevent an increase in resistance of the device from packaging. The package connections place certain restrictions on the dimension and aspect ratio of the silicon die design. These restrictions are more exaggerated in the die design of FIG. 7E since the source metal 100 is divided into three sections by three gate fingers 104. Electrically the three source sections are still in parallel, but at high currents the lateral resistance of the thin metal layer 100 adds internal resistance to the device, thereby degrading its performance as a power switch.

In the device shown in FIG. 7F, a multi-donut-shaped gate metal 106 is employed to reduce signal propagation delay throughout the device. The resulting separation of the source metal into four completely isolated islands 105A, 105B, 105C, and 105D, demands electrical connections to each section through the package design and wire bond placement. Such a design may be incompatible with specific package pinouts. Wire bonding is especially problematic in such layouts since the location of the leadframe limits the location and angle of wire bonds.

For example, in FIG. 8, the source bond wire 113 attached to source metal 110, extends over EQR metal 111 which is intentionally shorted to the drain potential. In the example shown the EQR metal contacts outer polysilicon plate 113 that extends into the scribe-street between dice. During sawing, saw edge 117 cuts through polysilicon layer 113, silicon substrate 115 and epitaxial layer 116, shorting them together at the drain potential. The source metal 110, polysilicon field plate 112 and P-type diffusion 114 are biased at a high negative potential relative to the drain, thereby reverse biasing the junction formed between P diffusion 1 14 and N-type epitaxial layer 115. If wire 113 sags or is pushed (by molten plastic during the injection molding process) into EQR 1, the device will short and no longer be functional. Longer bond wires may help reduce the probability of the short, but add resistance to the device. This is one example where wire bonding involves tradeoffs and compromises between performance and manufacturability..

Wire bonding creates other complications in manufacturing, some which are manifest as yield loss, and others that may show up later as reliability failures. In FIG. 9b, a wire ball bond 120 located on top of the active trench-gated MOSFET transistors (similar to the construction of device 90 in FIG. 7B), can cause micro-cracks in the oxide or in the silicon. Such micro-cracks, too small to observe without an electron microscope, may irreparably damage the top oxide (glass) 121 covering the trench (e.g. defect A), or damage the gate oxide 95 that embeds the polysilicon gate (i.e. defect 13). In extreme cases, the micro-crack may extend into the silicon in the vicinity of the P-type body 93 to N-type epitaxial drain 92 (i.e. defect C) and cause junction leakage. In the worse case the micro-cracks may only become electrically active after the product has been shipped to a customer, and after the product has been operating for an extended time (a field failure).

If it is desirable to attempt the second bond, the wedge bond 125, on the silicon rather than on the leadframe, the potential damage to the semiconductor is worse. As shown in FIG. 9B, the process of forming the wedge bond 125 and the wire cut 126 produce lines of stress pushed into the top metal 98, and ultimately into the underlying silicon and oxide layers. Micro-cracks are likely to occur unless the pressure is accurately controlled. In manufacturing, tightly controlled mechanical processes require frequent machine calibration, monitoring and repair. Increased preventative maintenance and greater machine downtime lead to higher manufacturing costs.

One solution to the micro-crack problem is to bond over dedicated bonding pads rather than over active device areas. Avoiding bonding over active area leads to higher metal resistance since currents must be bussed to pad areas using thin traces of metal and usable silicon "real estate" is lost. Even so, a wedge bond requires a larger area than a ball bond because the machine needs more room to cut the bond wire. In FIG. 9C, the size of an isolated bond pad for a ball bond (e.g. a gate pad) shown by the dotted line 130 and surrounded by an unrelated metal 131 is compared to the shape of the same pad adjusted for a wedge bond. The wedge bond pad 132 and the surrounding metal 133 is rectangular, and roughly 50% longer in one direction. For example, a 2 mil (50 um) gold wire ball bond can be bonded to a pad 100 um×100 um in dimension, while the wedge bond requires a dimension of 150 um×100 um. In packages where two chips are connected by a bond wire (referred to as a chip-to-chip bond), one of the two bonds is necessarily a wedge bond.

Another problem characteristic of wire bonds is the possibility of a poor quality bond between the wire and the aluminum, especially in high current applications. In FIG. 9D, the attachment of ball bond 140 and aluminum pad 141 illustrates a poor quality attach at points A and B where the bond does not touch the metal uniformly. A high interfacial resistance and possibly a long-term reliability problem can result.

In over-current conditions such as momentary short circuit conditions, bond wires can fail in any number of unpredictable ways. In FIG. 9E, a bond wire 142 has melted at point A without melting the surrounding plastic 143. In FIG. 9F, a large current has melted the wire and surrounding plastic (around point B) exposing the wire 142 and producing byproducts of the melting process such as gases or deposits 144 that may be toxic. The melting process may in turn cause a fire, especially for power transistors mounted inside of battery packs where explosive chemicals are contained.

Still other failures in wire bonds occur gradually over time. Electromigration failures, such as the one shown at point C in FIG. 9G, occurs where the current density is higher than its surroundings (e.g. where the wire may have been accidentally crimped), and where gradually, the metal atoms are transported away further thinning the wire until it fails open.

Wire bonds are not the only "parasitic" elements of resistance limiting the continued reduction of power MOSFET on-resistance. The thin top metal of a vertical power MOSFET also contributes resistance to the device. Referring to FIG. 10A, a trench gate vertical power device mounted on leadframe 150 comprises a heavily doped substrate 151, an active epitaxial layer containing the trench-gated MOSFET devices, a thin metal layer 153 and a bond wire 154. Each region defines contributes to the resistance of the product. In the case of substrate 151 and epitaxial layer 152, the resistances occur in the direction of vertical current flow. In the leadframe 150, the current flow, while lateral (i.e. perpendicular to the silicon), exhibits little voltage drop because the copper has a very low resistivity and the leadframe is relatively thick (over 175 um or 1.75 mm). The top metal layer 153, however, is only 2 to 4 um thick, typically 50 times thinner. Since bond wire 154 does not cover the surface of the die, current emanating from thousands to tens of thousands of transistors must flow laterally at distances up to a millimeter before reaching the bond wire. The resistance $R_{metal}$ can contribute as much as a milliohm of resistance to the device. The resistance of the bond wire 154 contributes tens-of-milliohms per wire, but in parallel with a large number of wires (e.g. 15 bond wires) adds a total of a few milliohms.

Because of the lateral resistance of the top metal layer, the individual transistor cells are not actually in parallel. The schematic of FIG. 10B illustrates a finite lateral resistance 160 exists between adjacent MOSFET devices 161. The total source resistance increases with distance to the nearest bond wire. Unfortunately, 4 um of metal is already quite thick by IC processing standards (most ICs use metal thickness well below 1 um). Such thick layers take a long time to deposit, and are subject to cracking if it is deposited to too thick a value. Increasing the bond wire length to place the bonds more evenly across the surface of the device is likewise problematic, since it may reduce the $R_{metal}$ lateral resistance by increasing the wire resistance 162 by an amount equal than the reduction in lateral spreading resistance. Shown conceptually in FIG. 10C, any increase in the aspect ratio (the distance to the nearest bond wire divided by the distance between bond wires along the width of the chip), effectively compromises the benefit gained by adding more transistors in parallel. The resulting increase in the product's metal resistance, due to increased spreading resistance, eventually cancels any benefit in transistor resistance. As shown in curve for resistance (the curve corresponding to the graph's left y-axis), larger area devices with increasing aspect ratios asymptotically approach some minimum resistance. The on-resistance-area product (i.e. curve corresponding to the right y-axis) actually increases, making the device more expensive for the same performance.

FIGS. 11A–11E summarize some of the possible interactions between die layout and package design, considering all of the aforementioned bond wire related issues. In FIG. 11A, the problem of packaging a vertical power device with a conventional IC package (such as the one first described in FIG. 2) is exemplified. The device 170 has its backside drain connection to die pad 171 while its topside source is connected to pins 173 via bond wires 176. Its topside gate connection is wire bonded by wire 175 to pin 172. Because the leadframe 171 is not connected directly to drain pins 174, bond wires 177 are required as down-bonds from the drain pins to the die pad 171.

The packaged device of FIG. 11A suffers from numerous problems including:

it exhibits a large wire resistance;

it suffers from a high thermal resistance;

the down bonds needed for vertical devices introduce additional wire resistance;

the down bonds limit the maximum die size of die, further increasing on-resistance;

lateral spreading resistance across the die surface is large; and source bonding angles are restricted.

In FIG. 11B, the down bonds have been eliminated by merging the drain pins into the die pad (as in the package of FIG. 5) to form a new die pad assembly 178, reducing package resistance, lowering thermal resistance, and facilitating a larger die area. The package of 11B still suffers from numerous limitations, namely:

the source bond wire resistance is high, especially from a limited number of wires;

the number of uncommitted pins is low since half the pins are tied to the die pad;

lateral spreading resistance across the die surface is large; and source bonding angles are restricted.

In FIG. 11C, the number of source bond wires 176 is increased to fifteen. The extra wires are introduced by tying the three source pins together into a bus bar 180, thereby increasing the area available for wedge bonds on the leadframe. Otherwise this package's characteristics are similar to the package of FIG. 11B. Still, the package of FIG. 11C also suffers from numerous limitations, namely:

the number of uncommitted pins is low since half the pins are tied to the die pad and most of the other pins are dedicated to the source;

lateral spreading resistance across the die surface is large;

the source bond resistance, while lower, is still not negligible; and source bonding angles are restricted.

An example of the limitations in the source bonding angles of the package of FIG. 11C is shown in FIG. 11D. In a design of a die similar to FIG. 7F, the die 179 is partitioned into three isolated-source sections SA, SB, and SC. Source wire bonds into the SA section must cross the gate pad near gate bond wire 175, unacceptable for manufacturing.

Larger bonding wires do not reduce overall resistance either. As illustrated in FIG. 11E, the replacement of source bond wires 176 by larger diameter wires 182 (e.g. replacing 50 um wires by 75 um wires) results in a higher resistance since the number of wires is reduced. The gate pad also must be increased in size to accommodate the larger gate bond wire 181, further reducing active area.

Another package technology, albeit much more costly than the plastic surface mount packages described thusfar, is the TO-220 family of power packages shown in FIGS. 12A–12D. The material costs alone of these power packages exceed the entire product cost of many of the SO-8 type surface-mount products. Nonetheless, they have become established for their low thermal resistance, especially in the automotive industry.

In FIG. 12A, the TO-220 package comprises a die pad 191 that is also a heat slug and external mounting tab having a hole 198. Drain pin 192 is merged into the die pad 191 while source pin 193 and gate pin 194 are connected via bond wires 195 and 196, respectively. In high volume production designs, bond wires 195 and 196 are chosen to be the same size, typically 14 or 20-mil aluminum wire. The large source wire, if used for the gate contact, however, wastes area for its requisite oversized gate pad. Using two different sized wires means the assembly process requires multiple passes, adding cost to the overall packaging operation. As shown in FIG. 12B, the tab 191 covers the back of the package and extends beyond the plastic 197 but another 35% or more. Consequently, the area utilization of this package if surface mounted is lower than the SO-8, i.e., it wastes board space.

FIG. 12C illustrates a cross section of the device revealing the large portion of the tab not covered by plastic and not mounted to any silicon die. The extended portion of the tab does not substantially improve thermal or electrical resistance of the device and therefore is wasted area. The straight legged TO-220 of FIG. 12C is typically used in through hole constructions. Two variants, the similarly sized D2PAK and the smaller DPAK, have similar construction, except that the leads are trimmed short and bent onto the surface.

Other major limitations of this package are the limited number of bond wires it can accommodate, and even more so the limited number of pins it offers (typically a maximum of three to seven). Of its limited pins, the center pin 192 is redundant since it is electrically the same as the backside tab 191. So while the backside metal is a good concept its implementation in the TO-220 package family is not adaptable to modern low-cost packaging technology, and is especially not useful for higher pin count device s like power ICs.

FIGS. 13A–13E illustrate an alternative packaging technology, primarily innovated for high pin count applications, which eliminates bond wires through the use of large gold bumps formed on the surface of the wafer. This technology was applied in assembly methods historically referred to as flip-chip, bump, or tape automated bonding (TAB). To date, bump-packaging technology has not been successful in power device applications for a variety of reasons. As shown in FIG. 13A, numerous large gold bumps, 250 um or greater in height are grown on the silicon surface over open bonding pads. The bonding pads are defined by openings in the passivant layer 206 and underlying oxide layer 205.

Aluminum interconnection on the chip also provides the metal 201 in the bond pad area. Gold however is not easily deposited to large thicknesses, so it must be grown using electroplating or electroless plating. To grow gold over aluminum, an intermediate layer is required. Frequently, a thin layer of titanium 202 followed by nickel 203 and possibly gold or silver is evaporated on the die before deposition can begin. An extra masking step is generally needed to remove the metal between bonding pads to avoid shorts. Then growth of bump 204 can commence. Electroplating of gold is well known in the industry and will not be discussed further here.

As shown in FIG. 13B, once the bumps are grown, the bumped die can be attached using ultrasonic bonding to leadframe 207 and encapsulated by plastic 208. The leadframe as shown in FIG. 13C may be a metal leadframe, generally of a thin layer of a conductor 209 like copper patterned on an insulating tape 210 (hence its name tape automated bonding). The die is then bump attached to the leadframe. The leadframe and tape may in fact have several levels as shown in FIG. 13D. The finished assembly may likewise be coated with a passivant 211, or a silicone compound, or a polyimide to seal the product. Bumps 212 may also be formed on the outside of the assembly to attach it to the metal traces 213 on printed circuit board 214. Such a construction if frequently referred to as a ball grid array or micro-ball grid array. In other cases as shown in FIG. 13E, the die may be bumped directly onto the PCB by bonding the bumps 204 onto the board traces 213. In such cases the passivant 211 is needed to protect the die from ionic contamination.

The problem with bump and ball grid packages is their high expense and their relatively poor reliability, especially in power applications. The bump interfaces 202 and 203 suffer degradation during thermal cycling and power pulsing due to differences in the thermal coefficient of expansion of the various dissimilar materials. While the bump technology is bond-wireless, it is not a low cost high volume technology, and it does not support vertical conduction devices, so its use in power ICs is suspect and its applicability in vertical power discretes is very poor.

What is needed is a bond-wireless (BWL) package technology with low cost, high manufacturability, and high reliability similar to the SO-8 package construction but (ideally) with thermal resistance similar to the D2PAK. While some attempts have been made thusfar to introduce wire-free power packages, most suffer from similar problems including stress, die cracking, alignment, and co-planarity of multiple lead leadframes.

SUMMARY OF THE INVENTION

A leadframe in accordance with one aspect of this invention contains a thinned portion, referred to herein as a "notch". The notch is positioned at a location where the leadframe passes over an edge of a semiconductor die when the leadframe is attached to the die. The notch thereby prevents a short from occurring between the leadframe and electrical elements present at the edge of the die, even when the leadframe is bent towards the die. A leadframe can contain numerous notches in various patterns designed to accommodate one or more dice of different shapes and sizes.

In accordance with another aspect of this invention, a lead of a leadframe contains a "moat" which acts as a receptacle for epoxy or solder when the lead is pressed against a semiconductor die. The epoxy or solder is thereby prevented from spreading outward from the lead and making contact with another lead, or with epoxy or solder likewise spreading outward from the other lead, so as to cause a short between the leads.

According to yet another aspect of this invention, a lead contains a number of holes or pits which act as receptacles for epoxy or solder and thereby prevent shorts with adjacent leads.

BRIEF DESCRIPTION OF THE DRAWINGS

FIGS. 9A–9G illustrate various wire bond-related design restrictions and failure mechanisms.

FIGS. 12A–12D illustrate the heat tab type construction in TO-220 and derivative packages.

FIGS. 14A–14F illustrate a two-terminal bond-wireless package in accordance with this invention.

FIGS. 17A–17H illustrate the problem of lead coplanarity in package design.

FIGS. 18B–18G are views illustrating the process of FIG. 18A.

FIGS. 26A–26E illustrate a leadframe designed specifically for use with a power semiconductor die have gate and source terminals on its top side.

FIG. 27A is a plan view of a leadframe containing notches that can be used to contact dice having a variety of shapes and sizes.

FIG. 27B is a cross-sectional view of the leadframe of FIG. 27A attached to a particular-size of die.

FIGS. 28F–28L illustrate leadframes containing various patterns of moats and notches.

DESCRIPTION OF THE INVENTION

Two-Terminal Bond-Wireless Packages

FIGS. 14A–14I illustrate the construction of several bond-wireless (BWL) packages for two-terminal devices such as PIN diodes, transient suppressors, Zener diodes, etc., requiring surface mount packaging. The packaging technology could also be used for capacitors, fuses, and other passive components.

Figure 1:
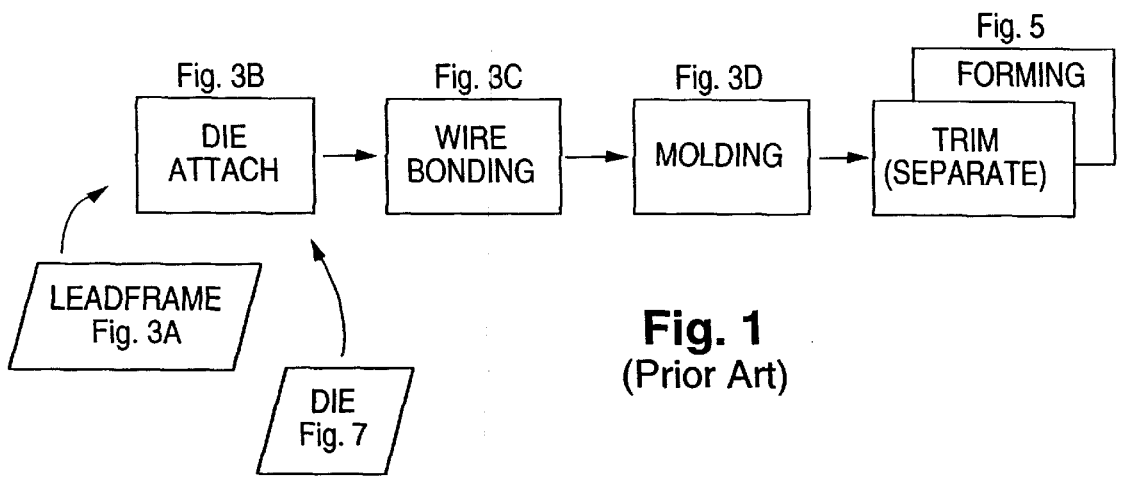
FIG. 1 is a flow chart of a conventional plastic surface mount semiconductor packaging.
Figure 2:
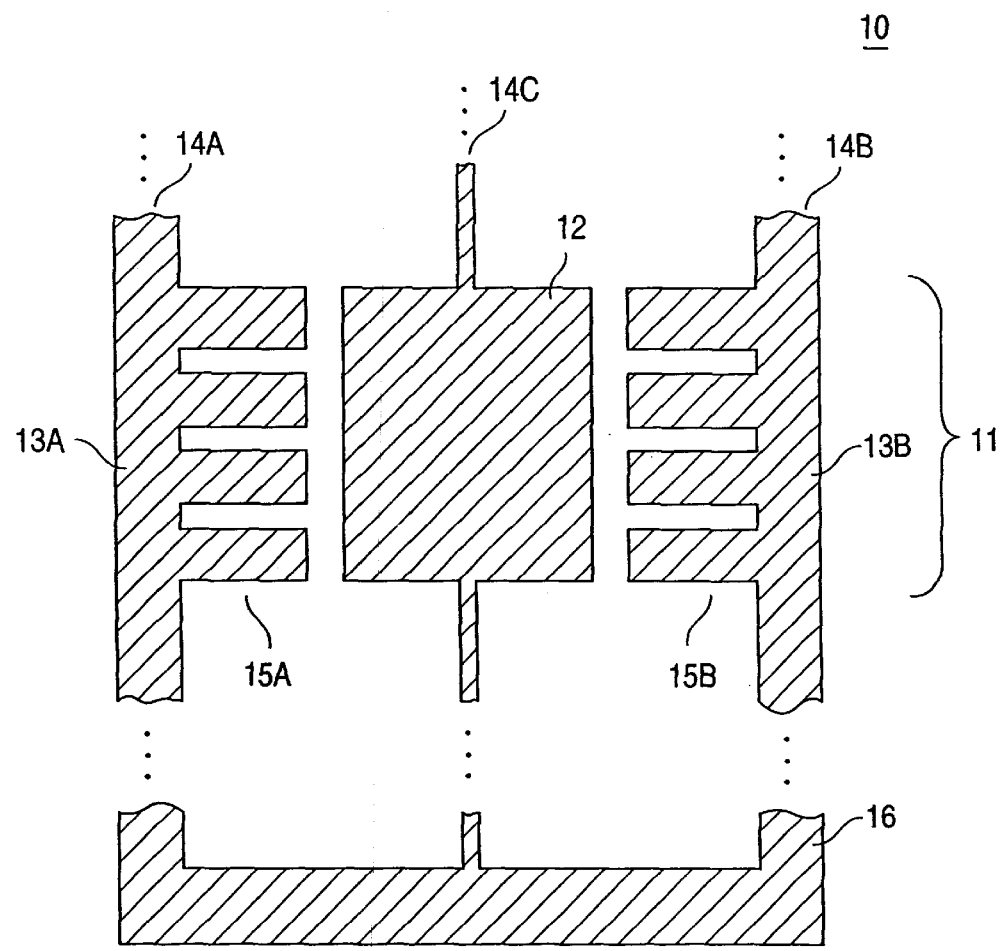
FIG. 2 shows a plan view of a conventional leadframe with end piece.
Figure 3A:
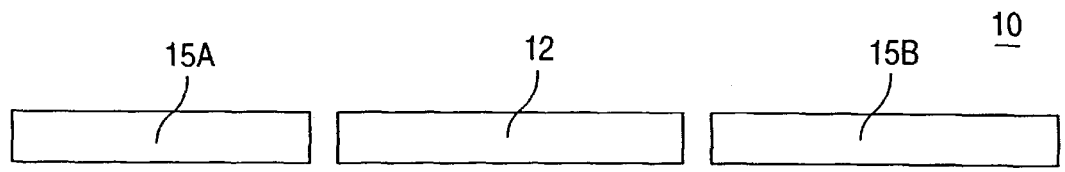
FIGS. 3A–3G illustrate a process flow for a conventional surface-mount semiconductor package.
Figure 3B:
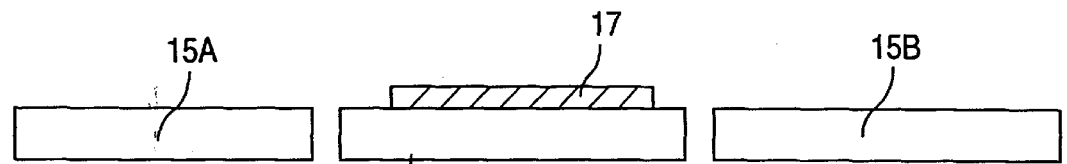
Figure 3C:
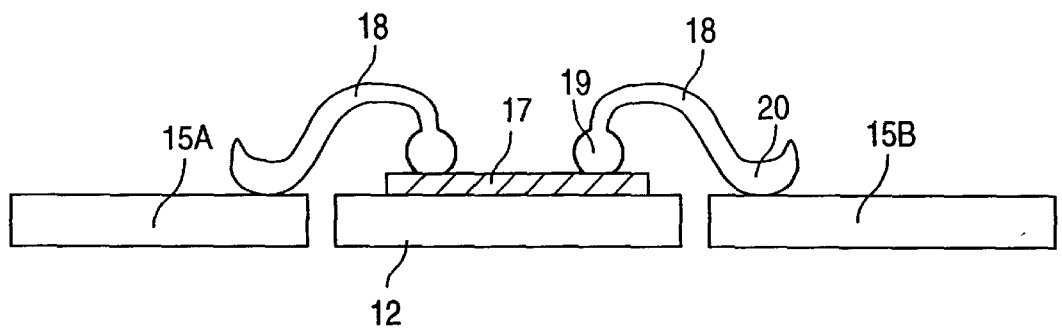
Figure 3D:
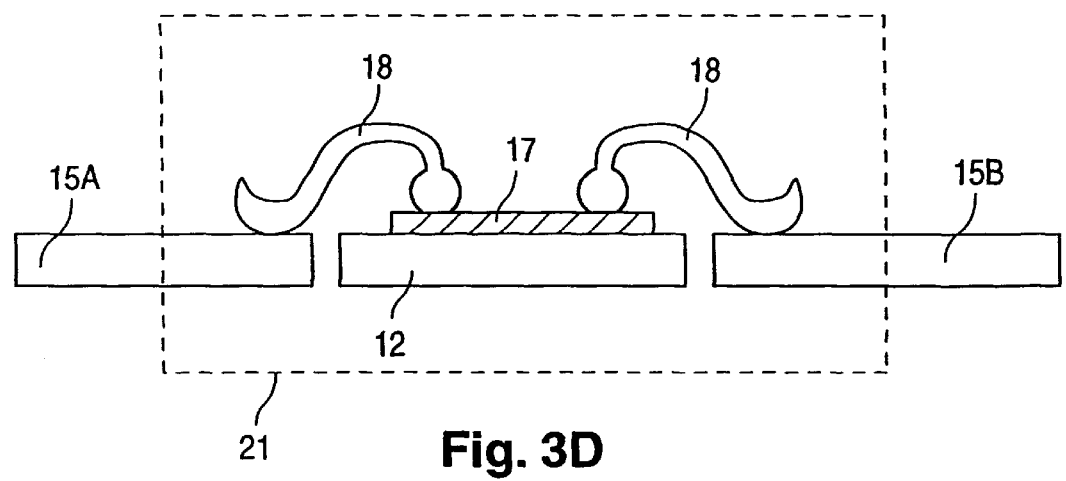
Figure 3E:
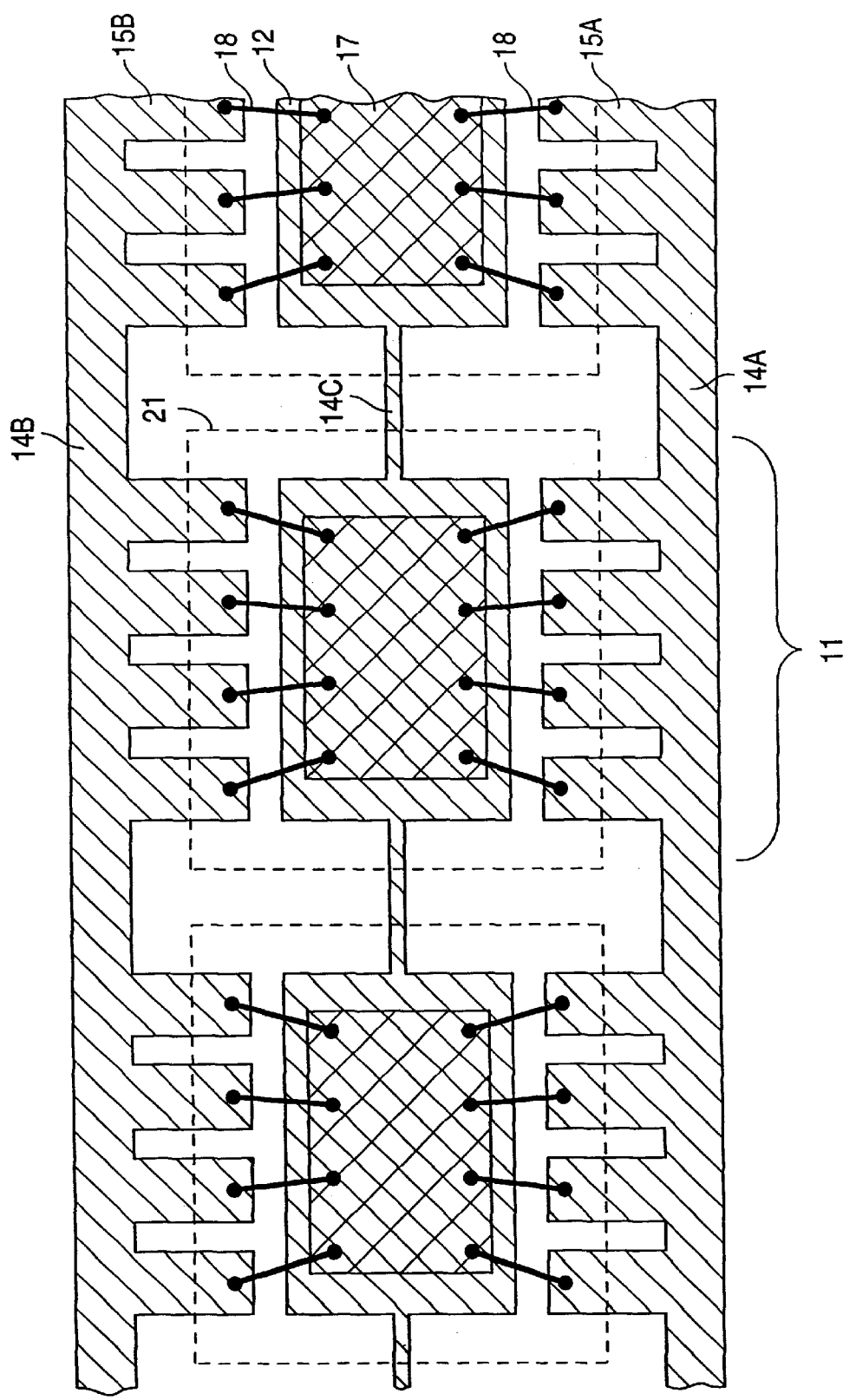
Figure 3F:
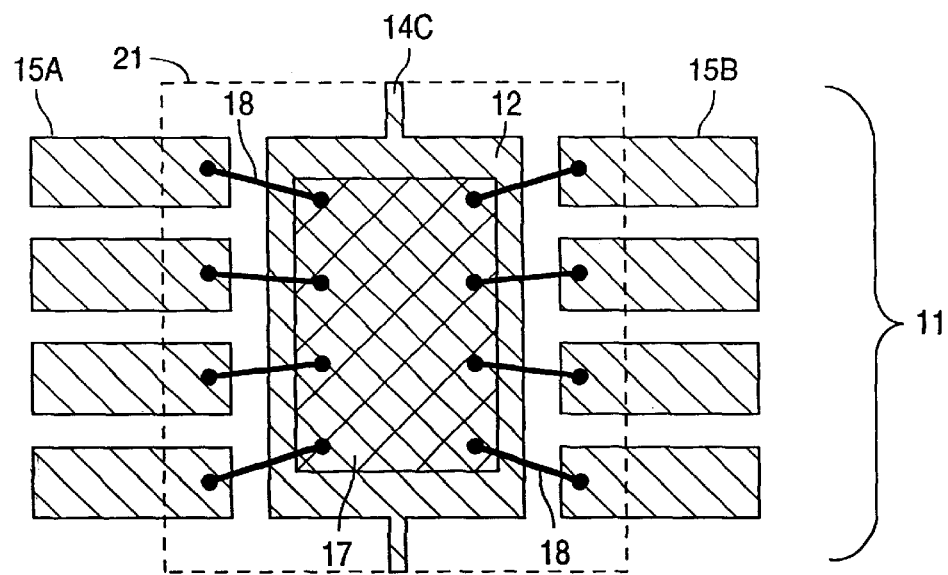
Figure 3G:
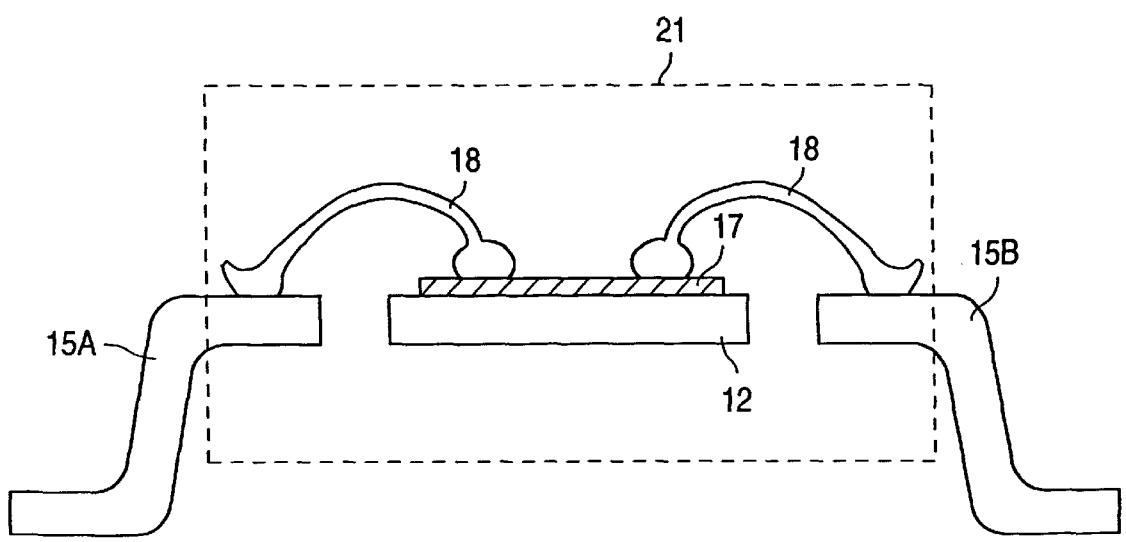
Figure 4A:
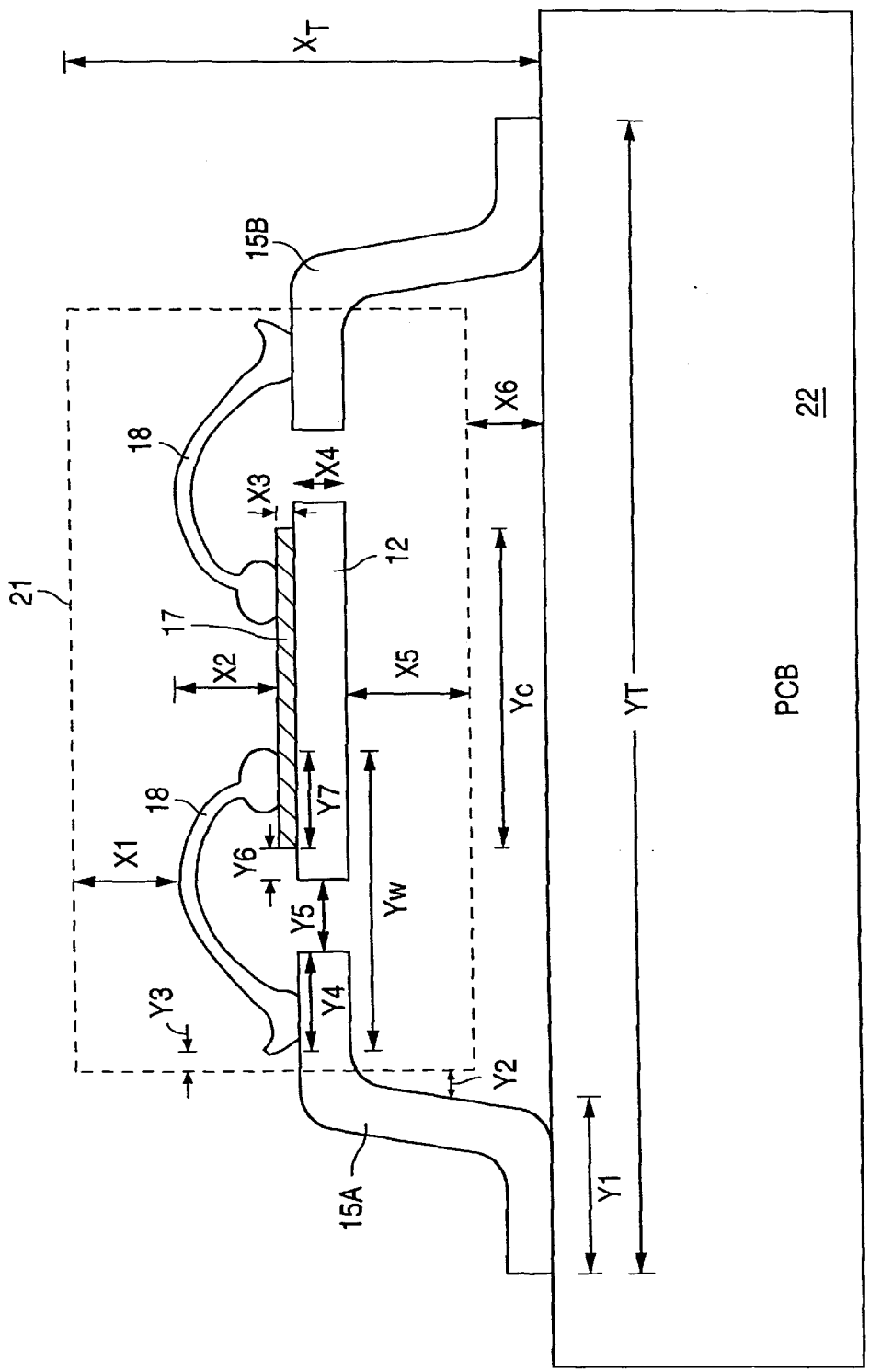
FIGS. 4A and 4B illustrate a cross-sectional view of a conventional surface-mount packaged semiconductor die.
Figure 4B:
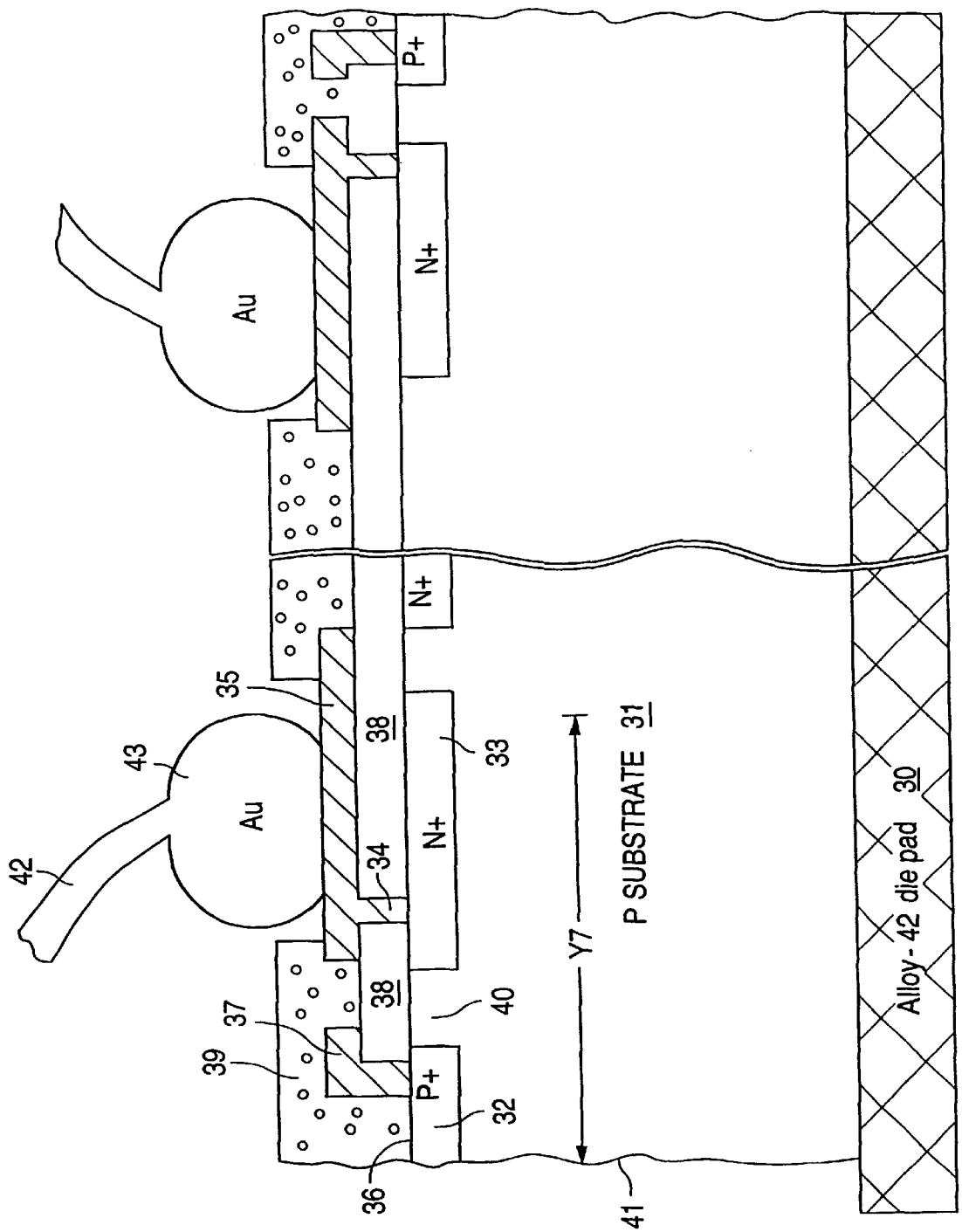
Figure 5A:
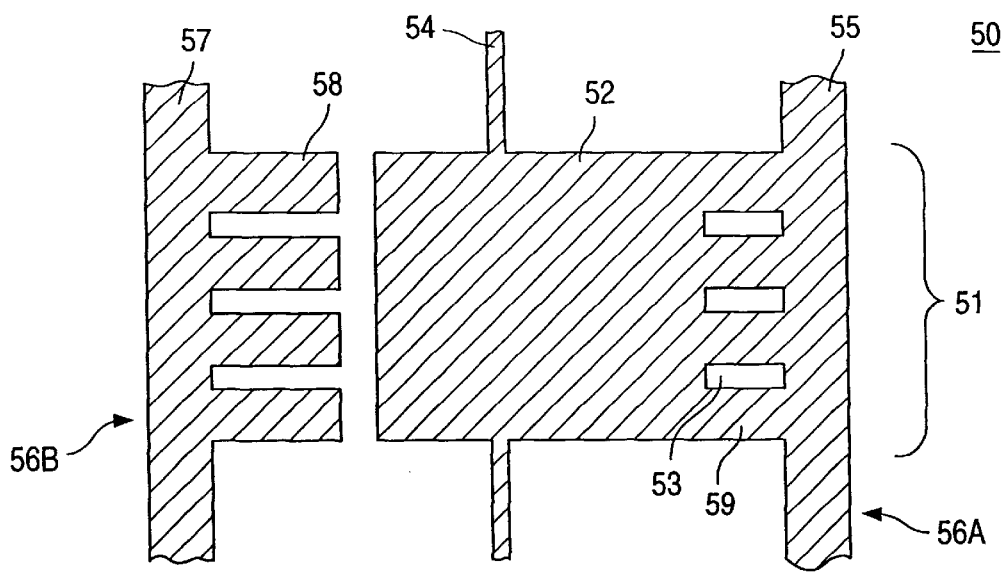
FIGS. 5A–5G illustrate a process flow for manufacturing a surface-mount semiconductor package for a vertical conduction device.
Figure 5B:
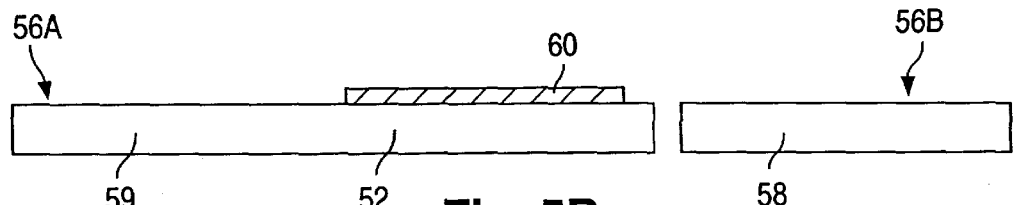
Figure 5C:
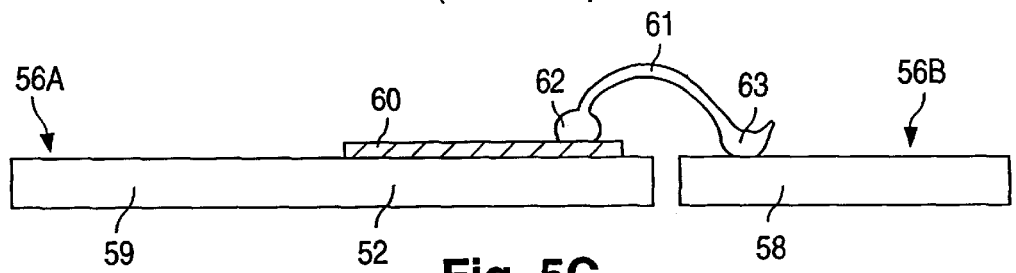
Figure 5D:
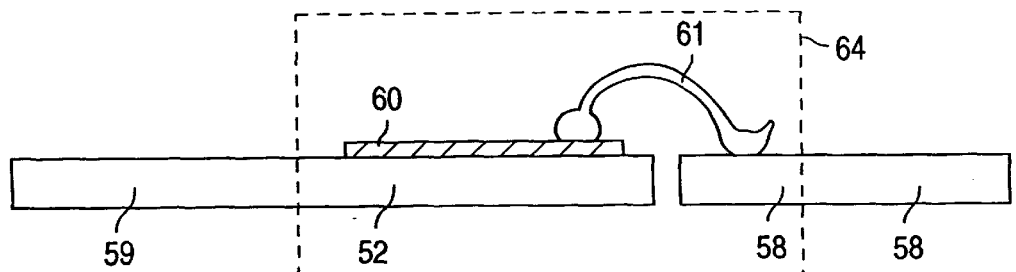
Figure 5E:
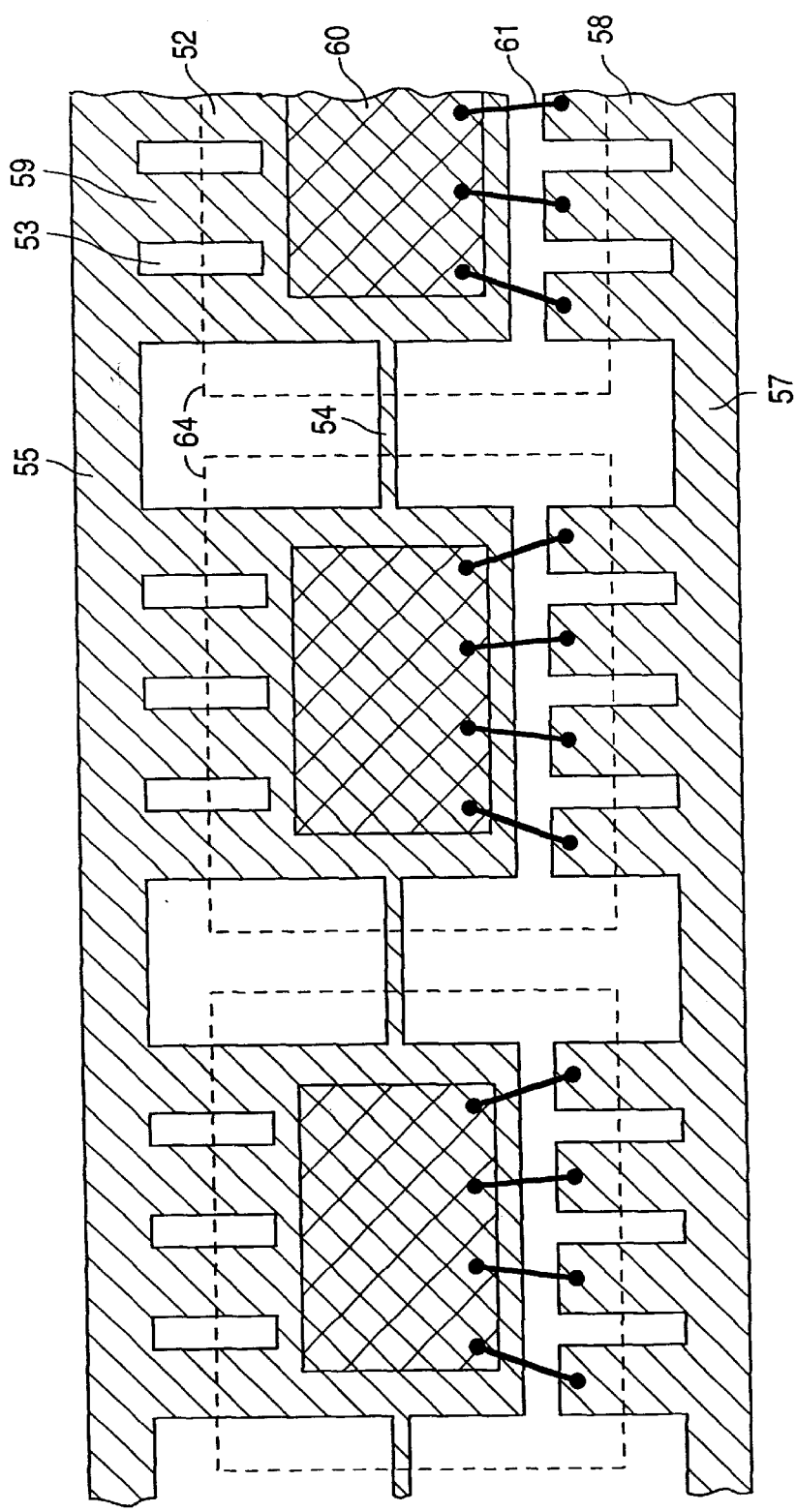
Figure 5F:
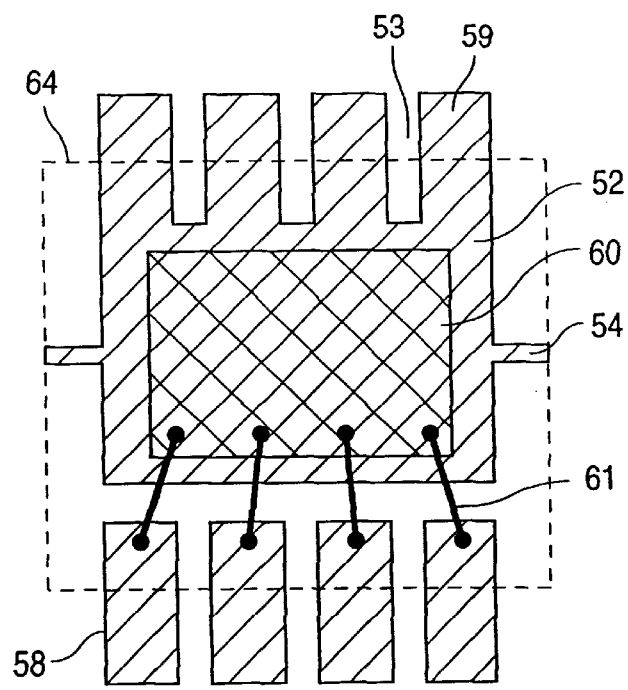
Figure 5G:
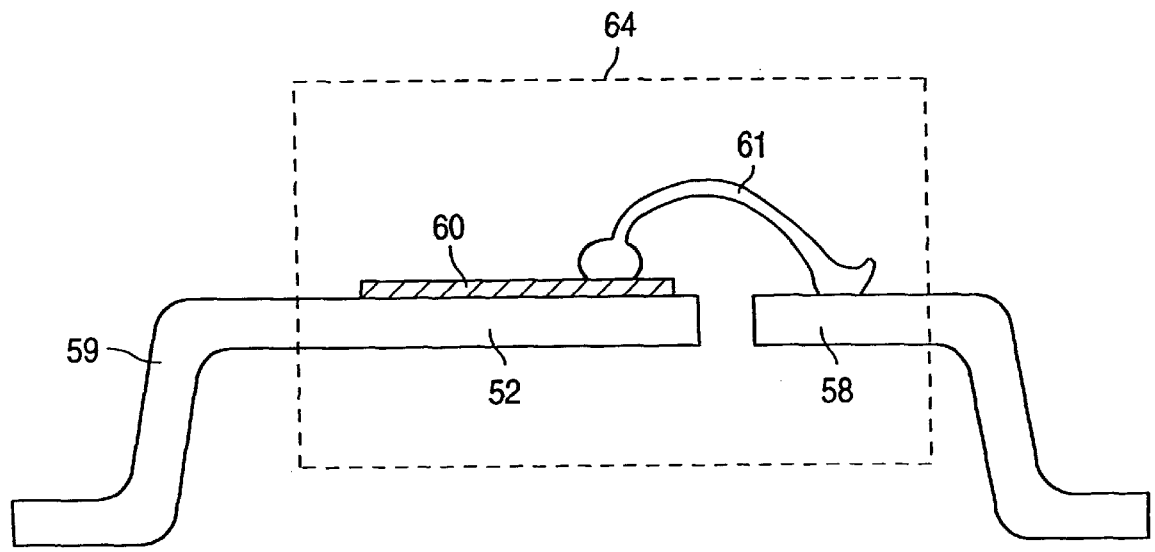
Figure 6A:
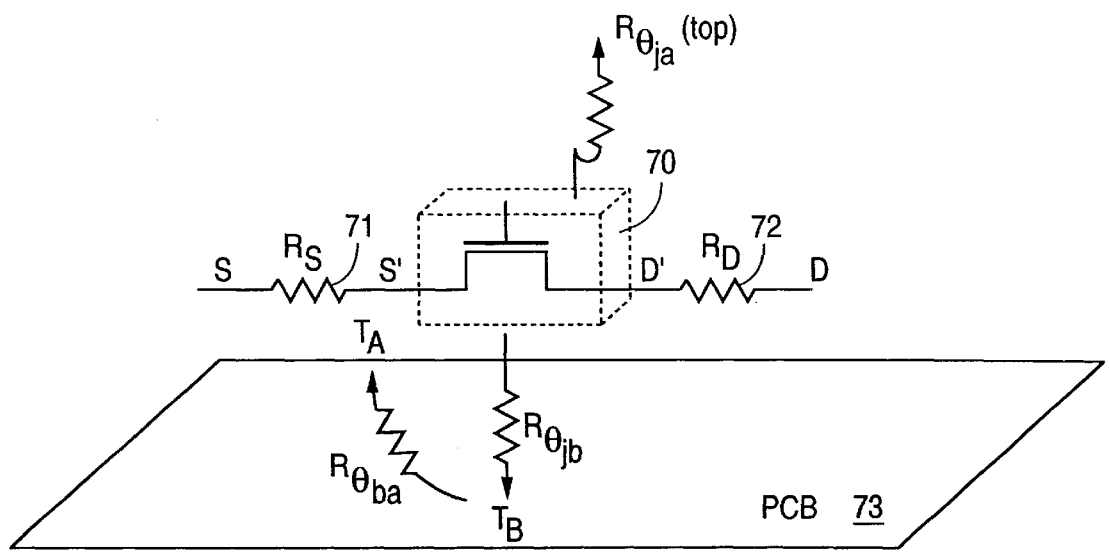
FIGS. 6A–6C are conceptual diagrams and graphs that illustrate the electrothermal characteristics of a surface mount semiconductor package.
Figure 6C:
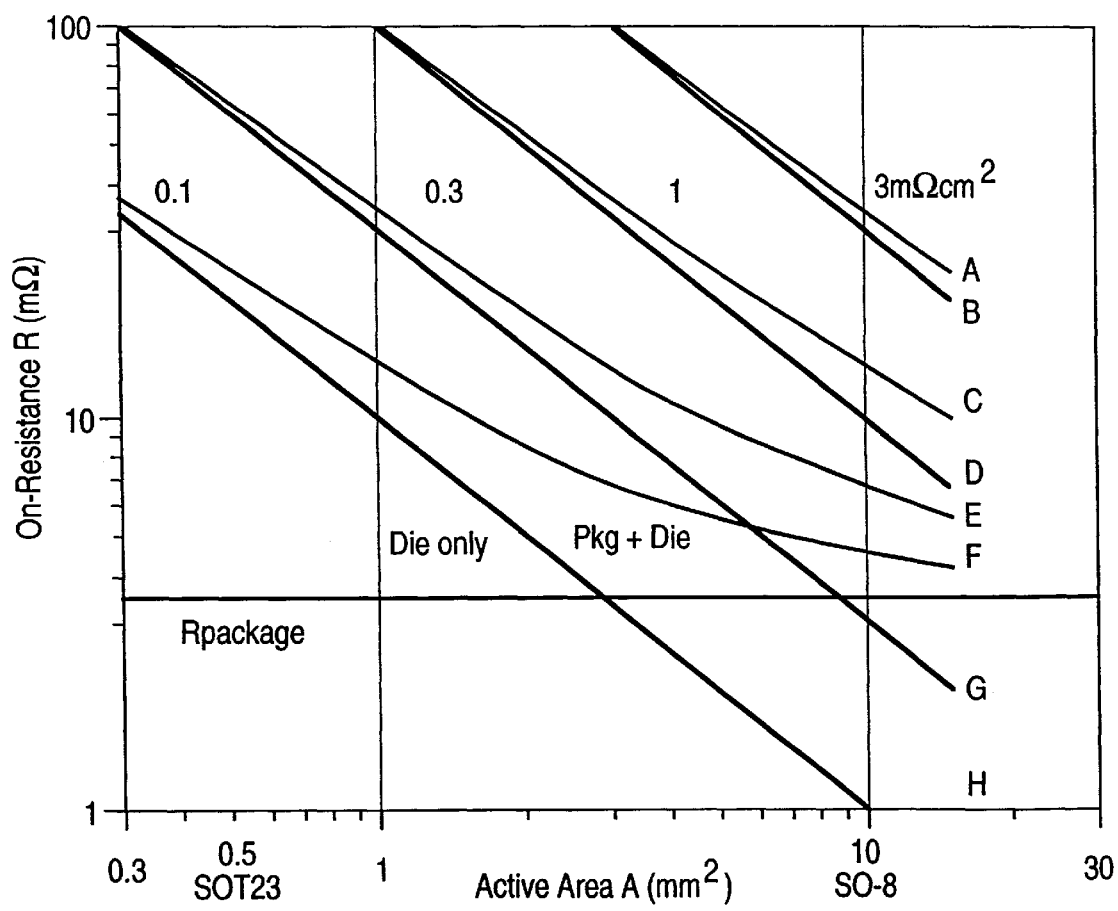
Figure 6B:
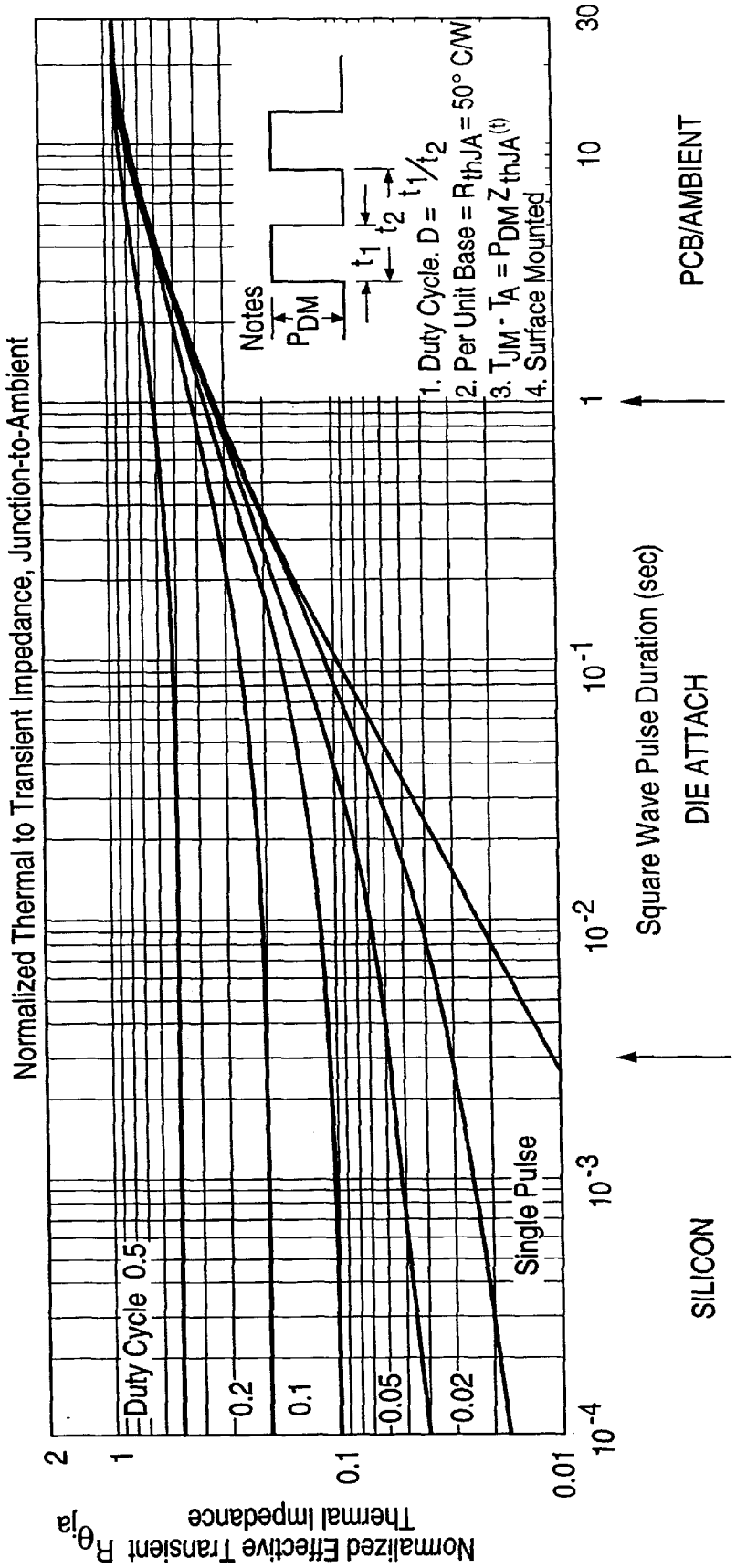
Figure 7A:
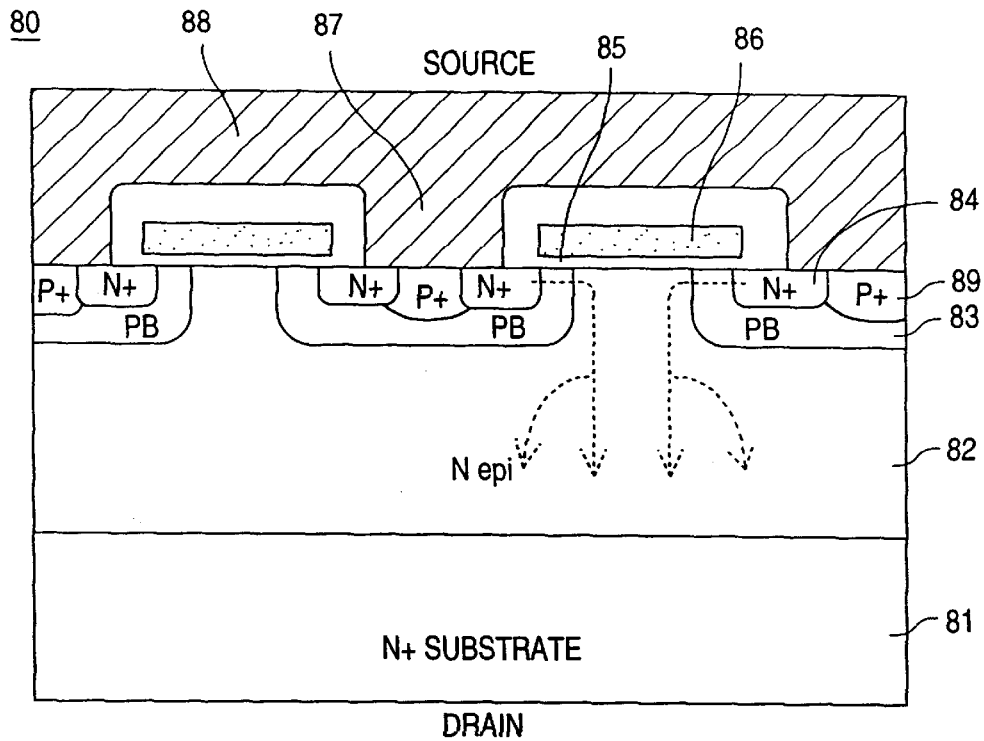
FIGS. 7A–7F illustrate the structure of various vertical-current-flow power MOSFETs including a planar DMOSFET and a trench-gated DMOSFET.
Figure 7B:
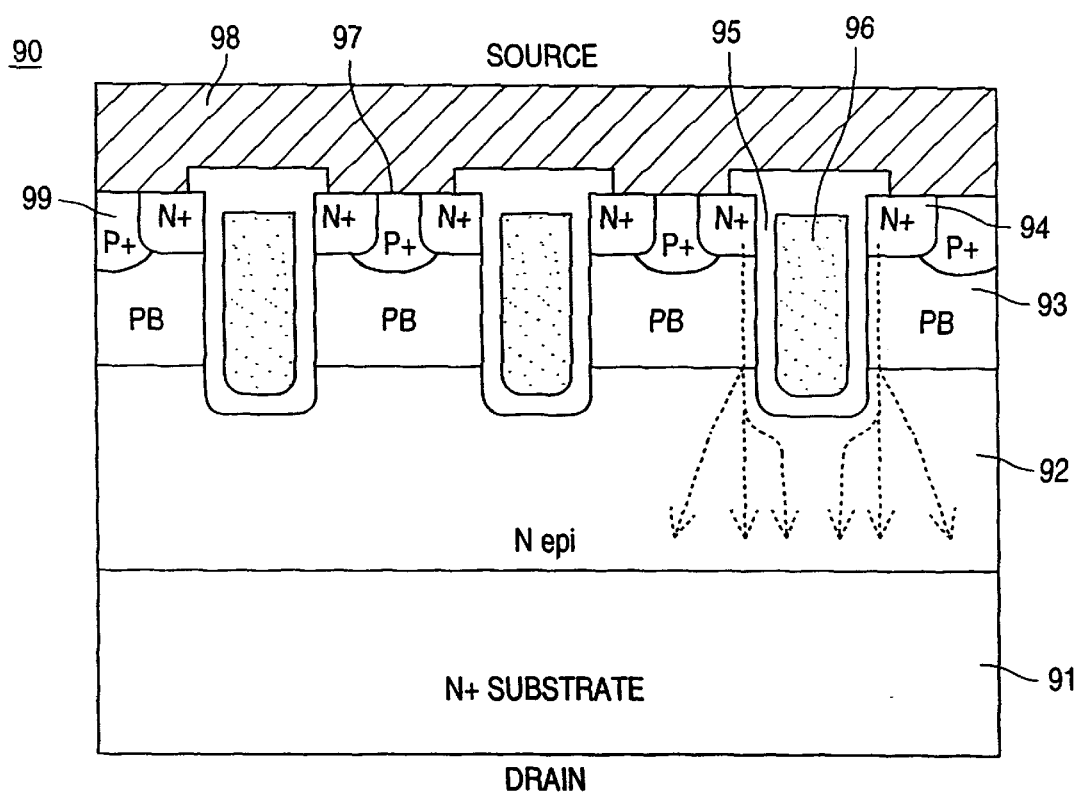
Figure 7C:
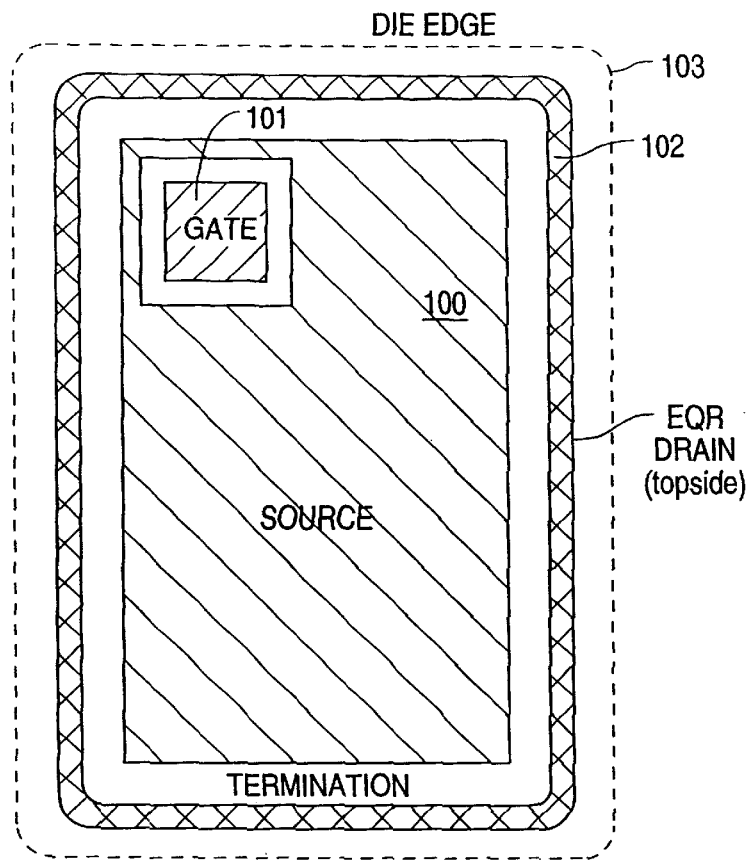
Figure 7D:
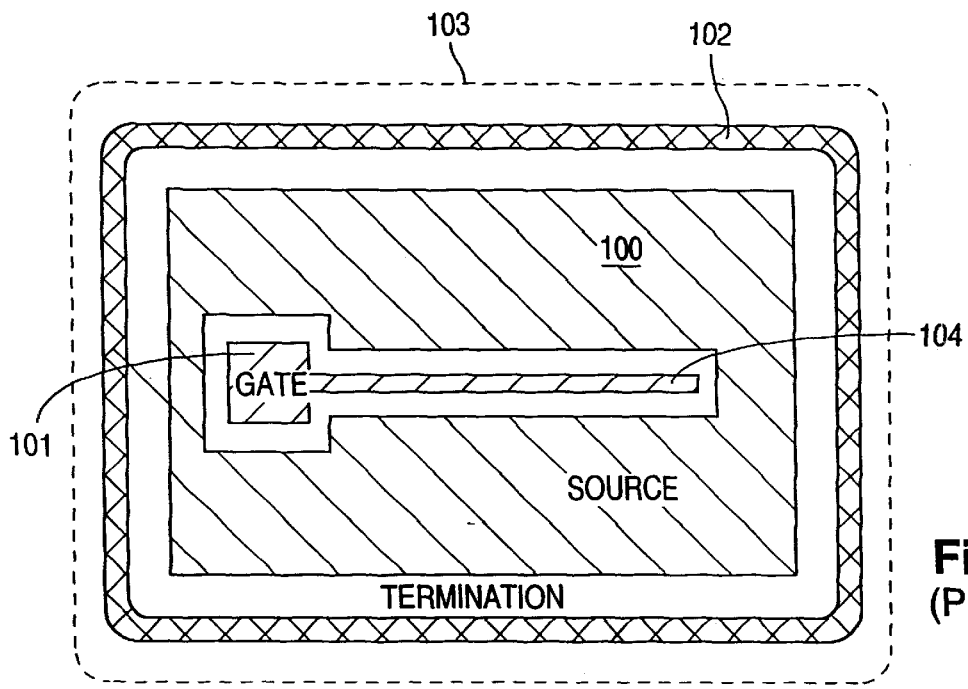
Figure 7E:
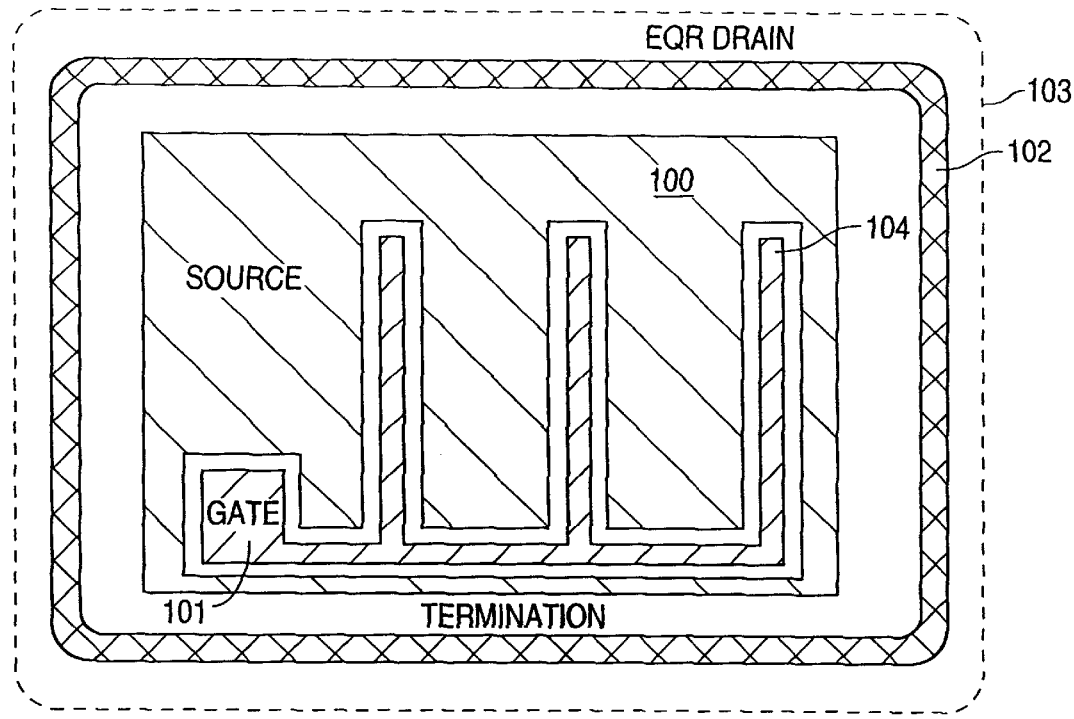
Figure 7F:
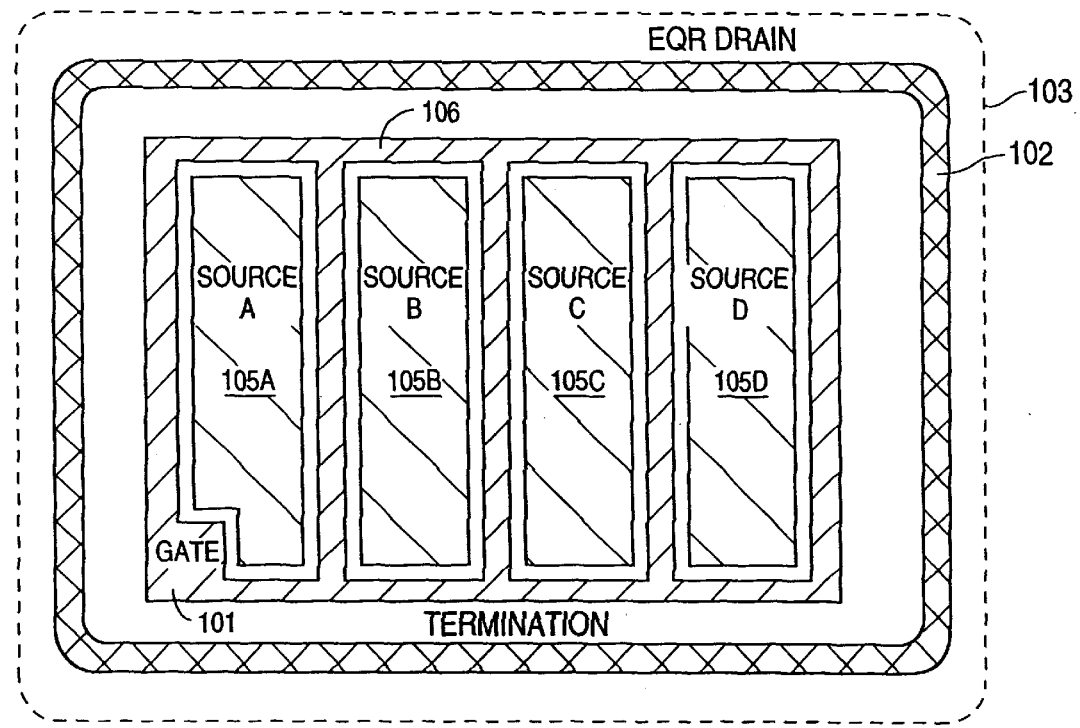
Figure 8:
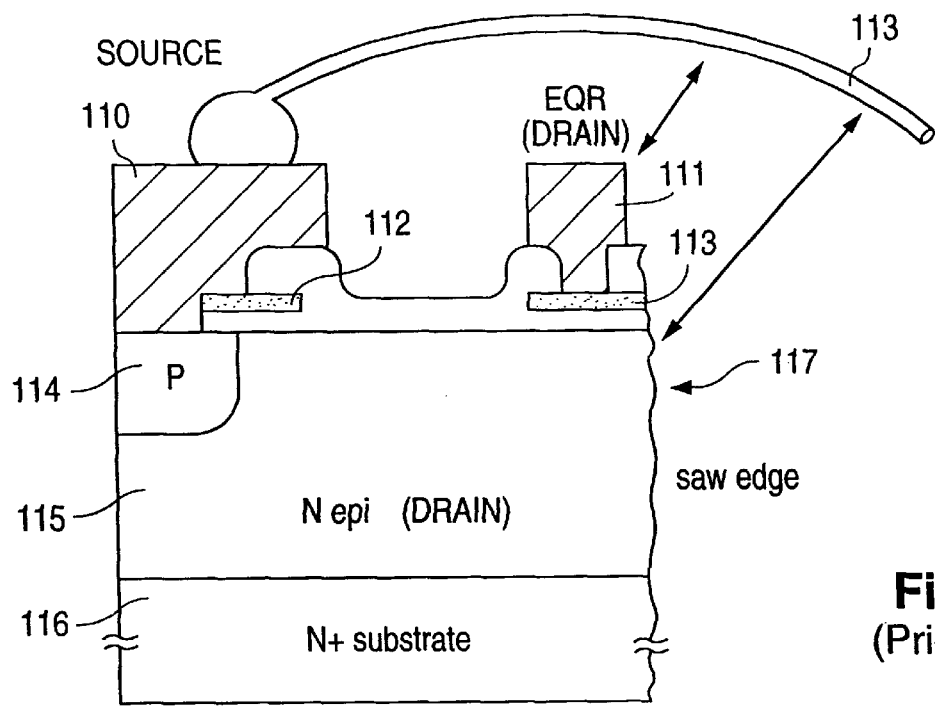
FIG. 8 illustrates a potential wirebond short to die edge and equipotential ring (EQR) resulting from wire sag.
Figure 9A:
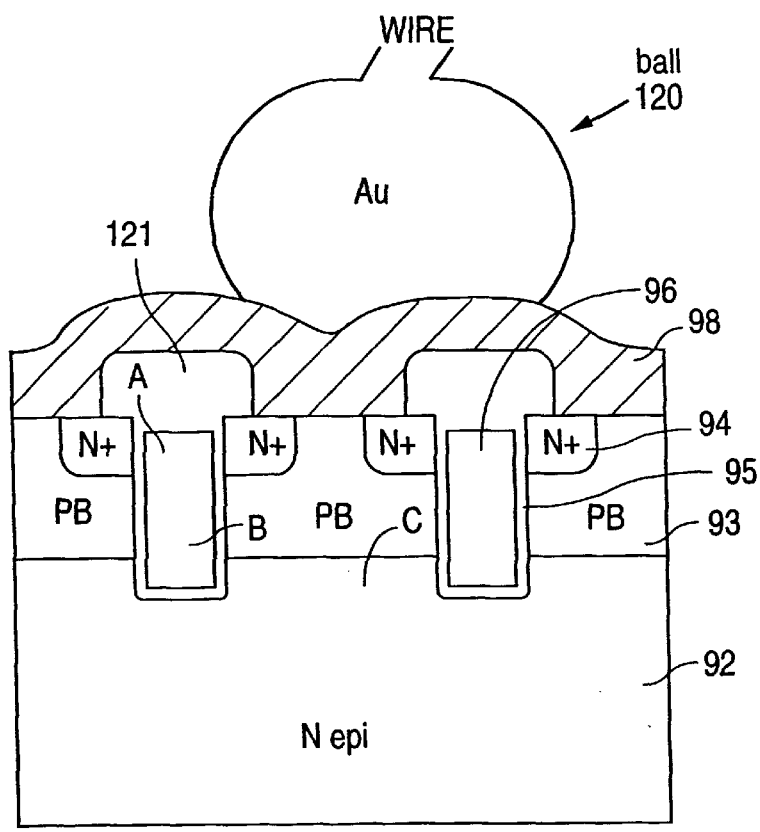
Figure 9E:
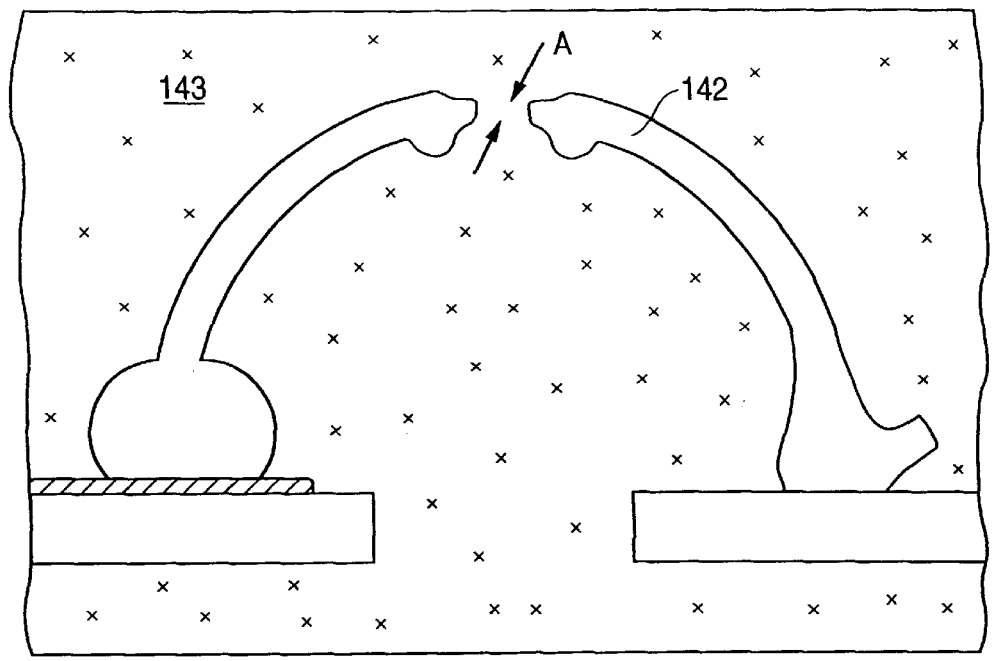
Figure 9F:
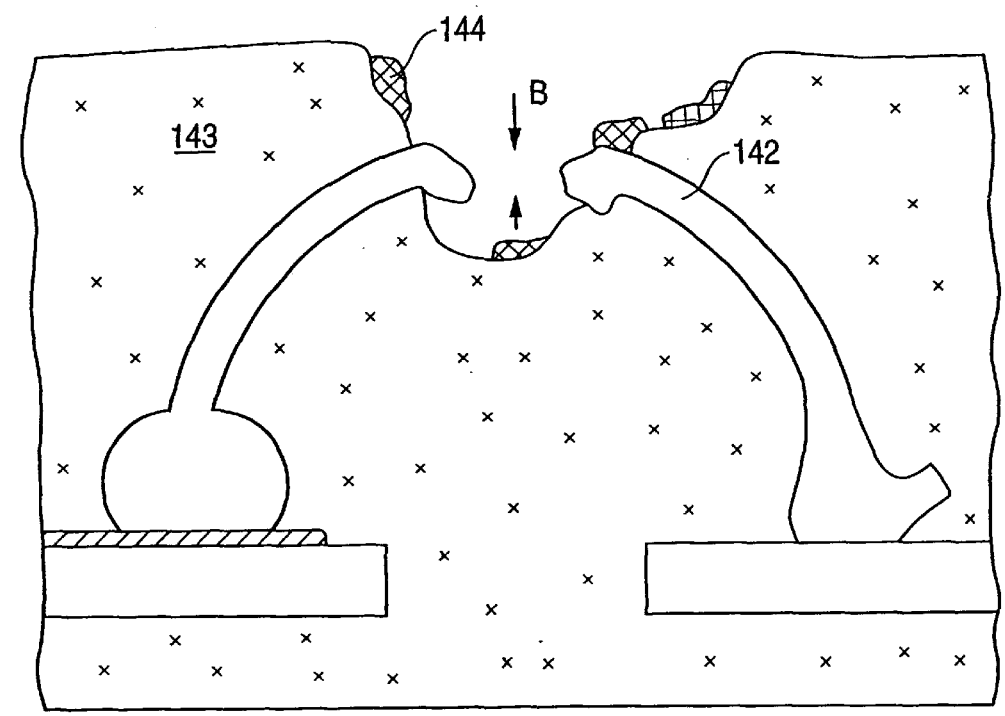
Figure 9G:
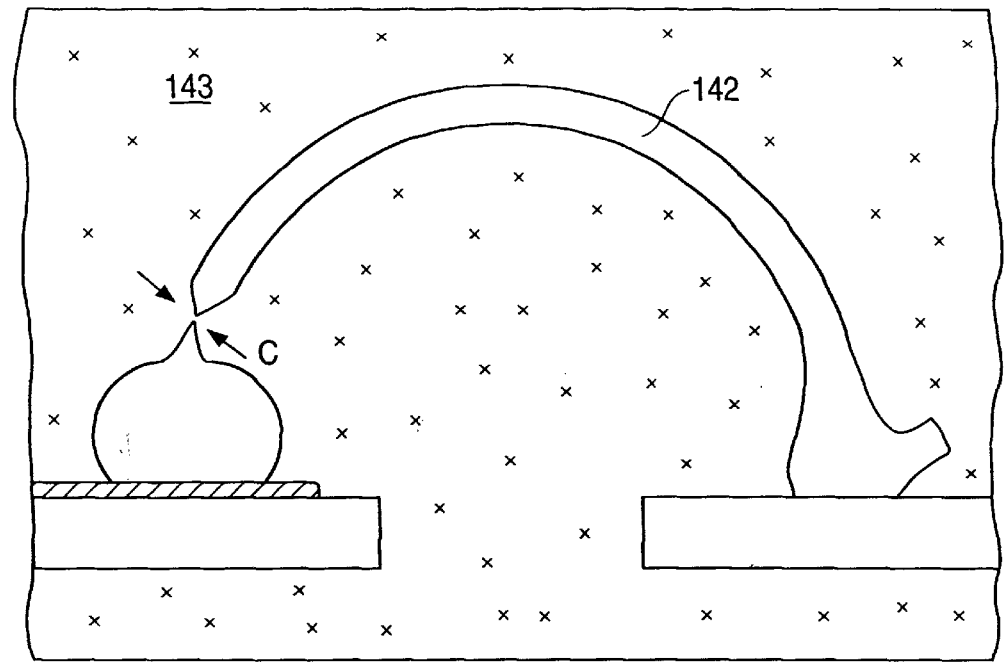
Figure 10A:
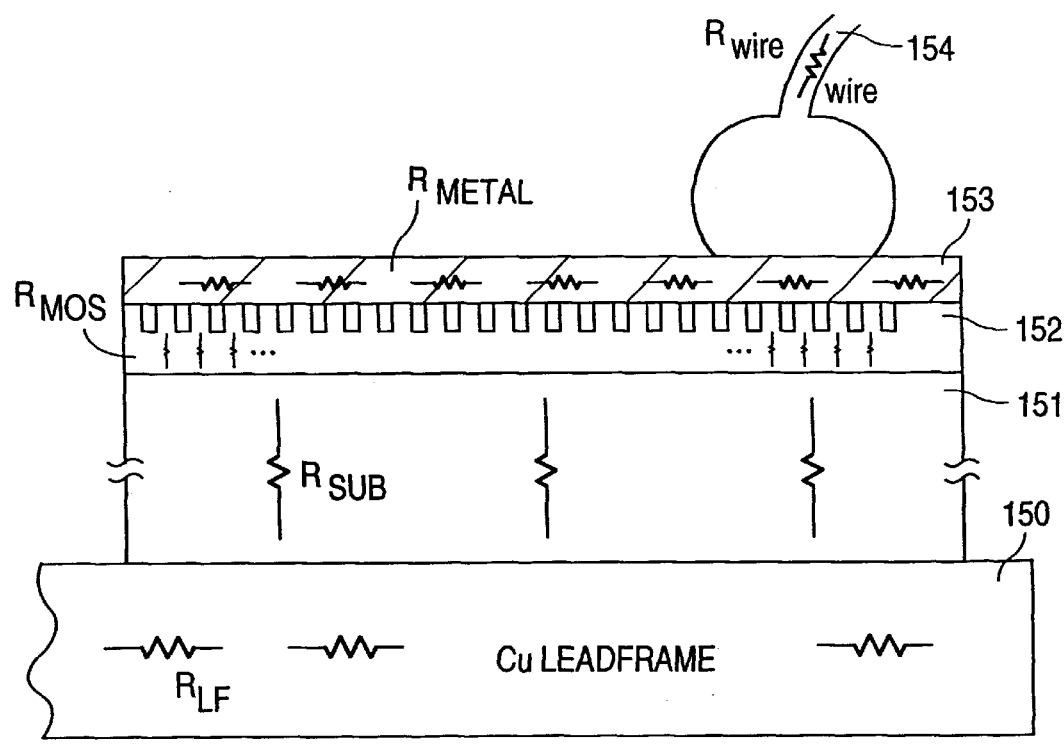
FIGS 10A–10C illustrate lateral distributed-resistance effects in packages for vertical power devices.
Figure 10B:
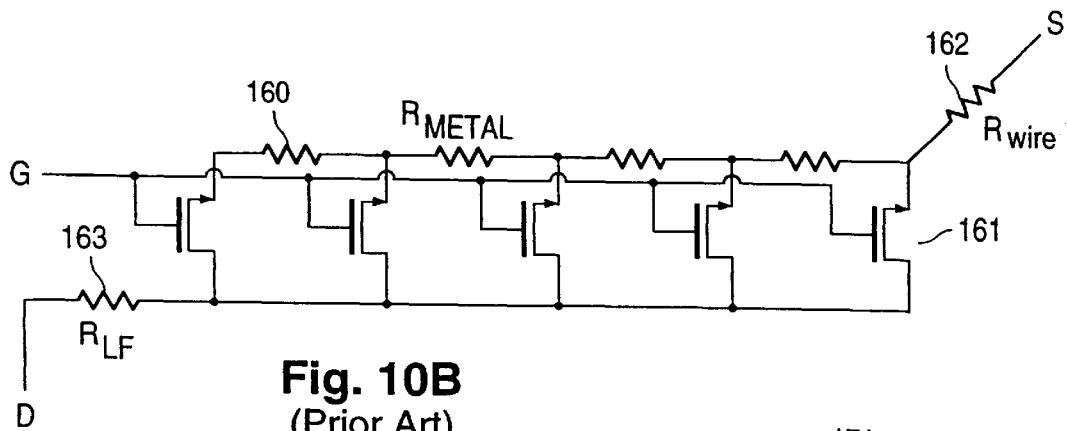
Figure 11A:
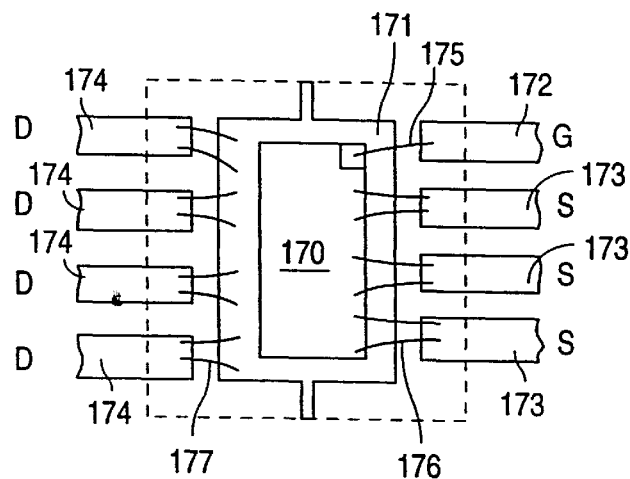
FIGS. 11A–11E illustrate leadframe designs and bonding diagrams for vertical power MOSFETs.
Figure 10C:
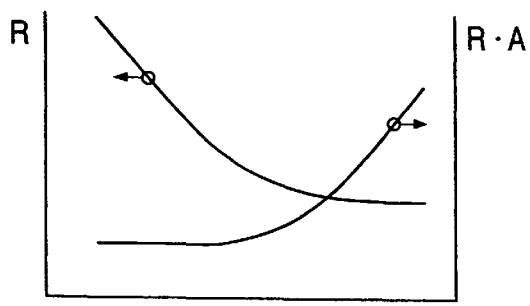
Figure 11B:
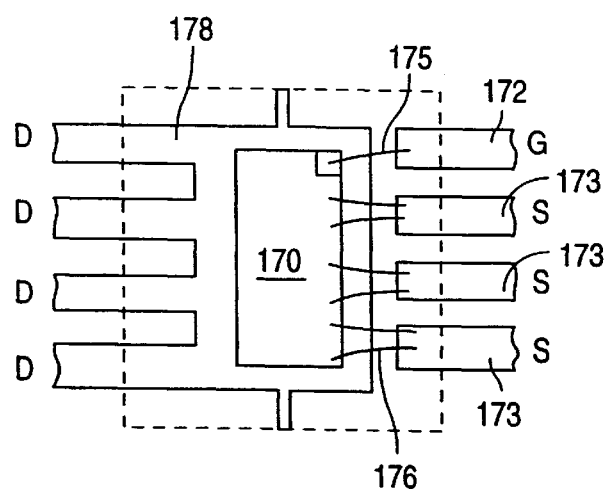
Figure 11C:
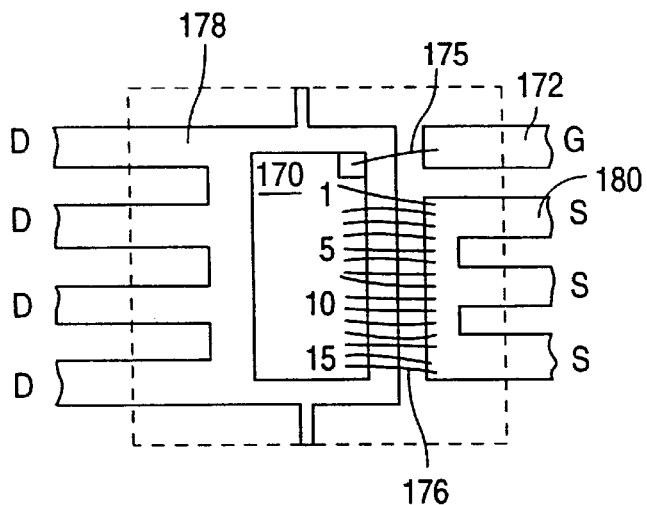
Figure 11D:
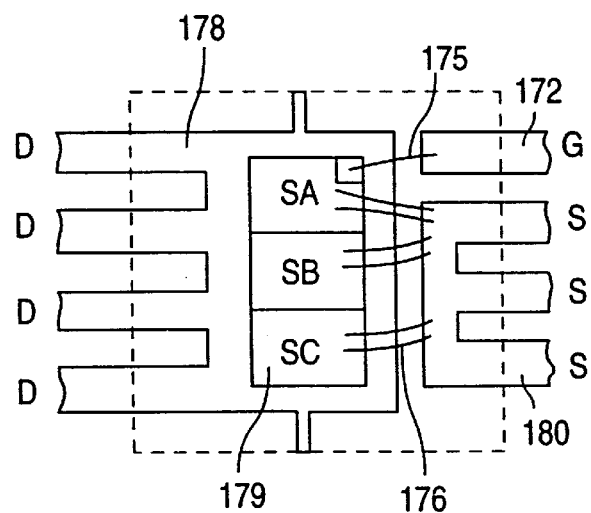
Figure 11E:
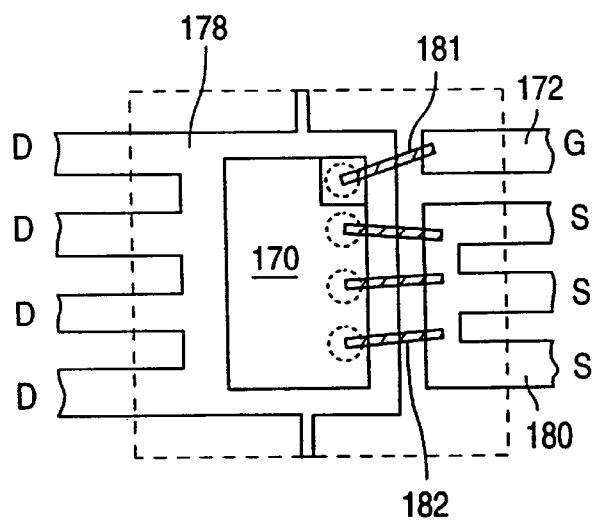
Figure 13A:
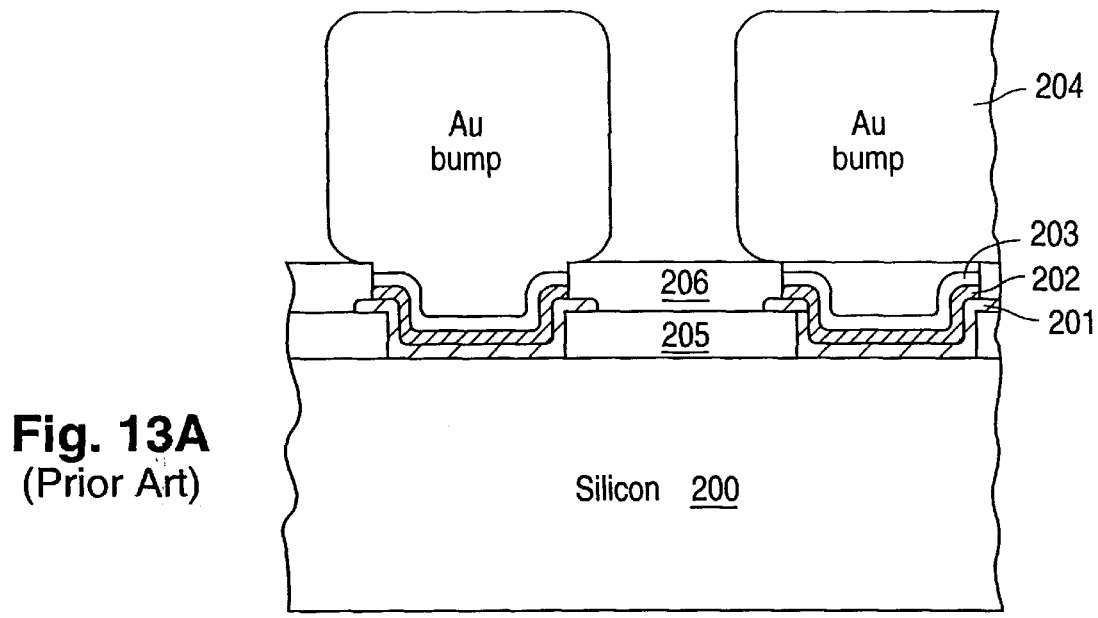
FIGS. 13A–13E illustrate examples of flip-chip and bump packaging technology.
Figure 13B:
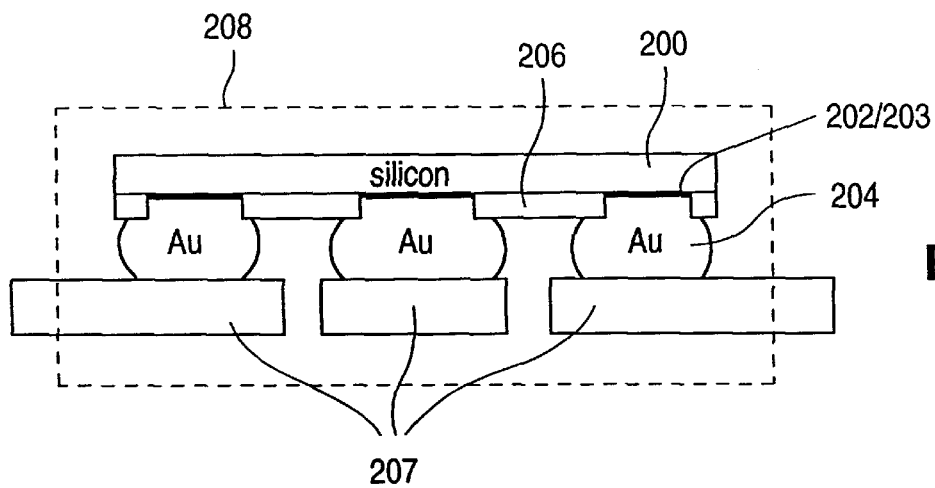
Figure 13C:
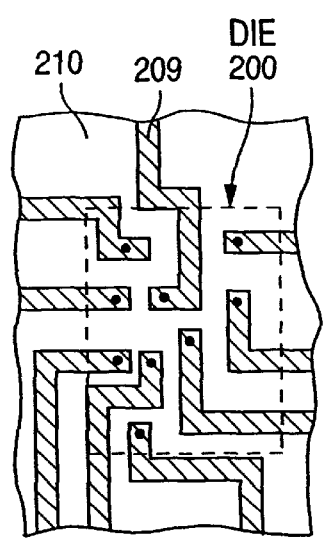
Figure 13D:
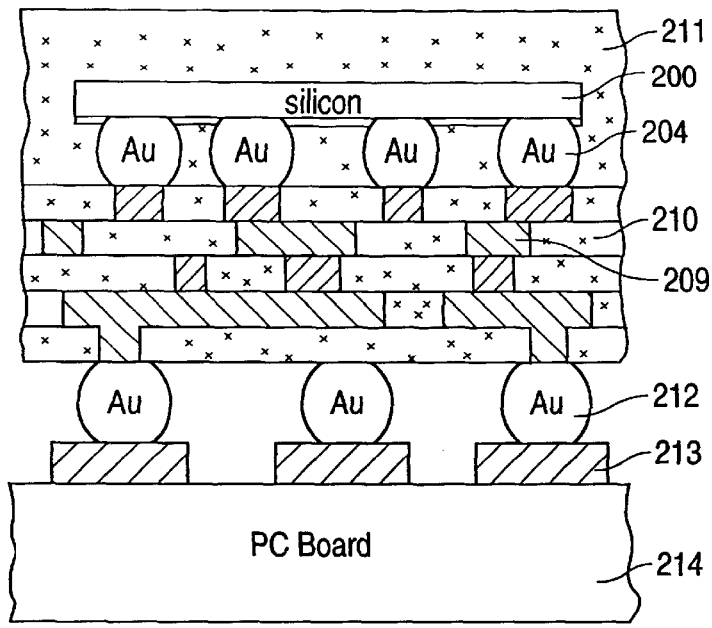
Figure 13E:
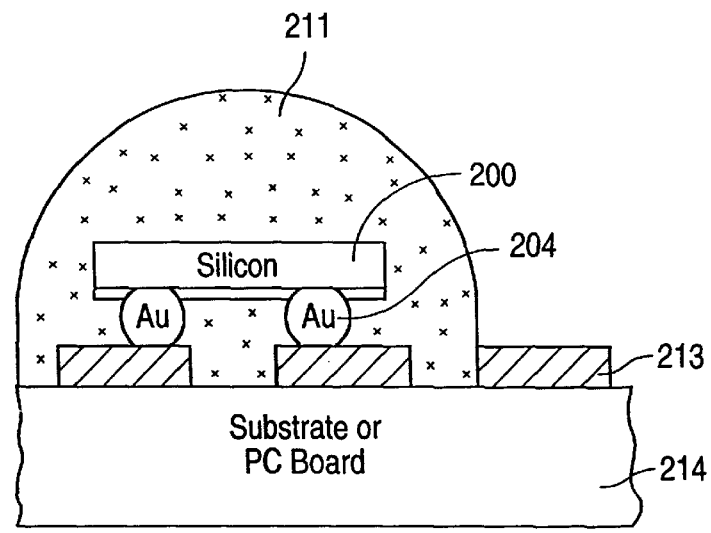
Figure 14A:
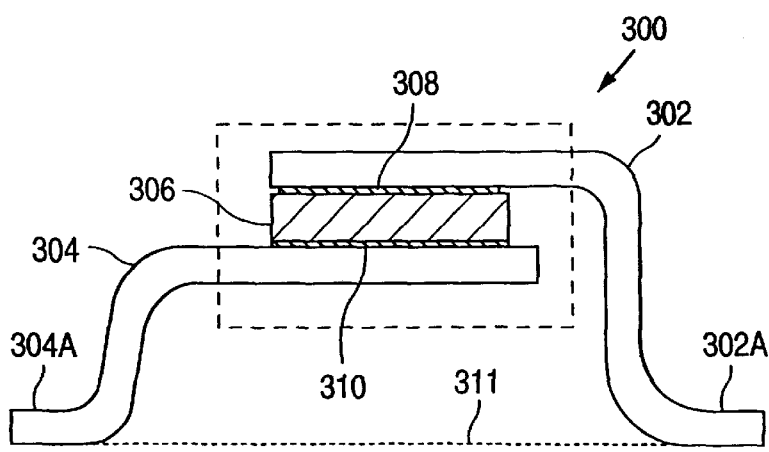

In the construction of the package 300 of FIG. 14A, two leadframes 302 and 304, substantially parallel, sandwich a semiconductor die 306 having a conductive top and bottom surface. The leadframes 302 and 304 attach to the die 306 with an intervening layer 308, 310 of (silver filled) conductive epoxy or solder. The leadframe leads exit the package 300 at two different heights (relative to the board), and are bent with feet 302A and 304A positioned in the same plane for mounting on a surface 311 of a printed circuit board. Assembly involves mounting the die 306 on a first leadframe 304 as shown in the plan view of FIG. 14B and the cross section of FIG. 14C. The die attach is preferably achieved by dispensing a conductive epoxy onto the leadframe, or the back of the die and applying pressure to squeeze the epoxy into as thin layer uniform in thickness along the die. Ideally the pressure should be maintained during a partial cure at 125 to 390 C. for 10 min. to 5 hours depending on the epoxy. The central tie bar 304B and edge tie bar 304C are illustrated in FIG. 14C as dotted lines to illustrate their location.

Figure 14E:
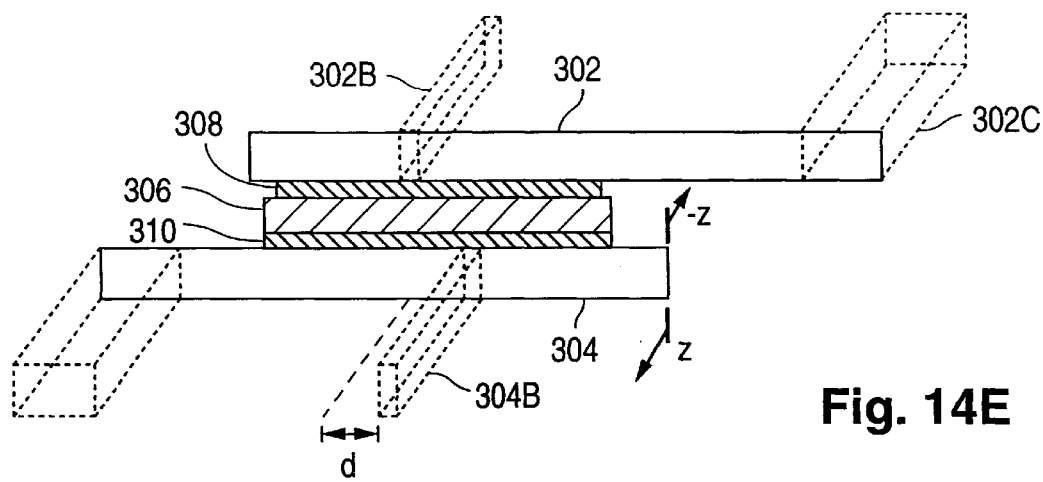

In FIG. 14D the second (top) leadframe 302 or the die 306 is coated with another layer of conductive epoxy. Next the leadframe 302 is positioned or aligned to the die 306 (or the leadframe 304) and again squeezed at a controlled pressure for an extended duration to redistribute the epoxy 308 into a thin uniform layer. FIG. 14E illustrates the same sandwich from a cross sectional view, again representing the central and edge tie bars 302B and 302C, respectively, orthogonally projected in the drawings as dotted lines. In this design, the central tie bar 302B on the top leadframe 302 lies to the left of the central tie bar 304B of the underlying leadframe 304 by a distance d. By offsetting the top and bottom central tie bars 302B and 304B, uniform pressure can be applied to minimize twisting of the leadframes resulting in a non-uniform compression of the sandwich. The leadframes are ideally held in place with a constant pressure until curing is complete.

Figure 14F:
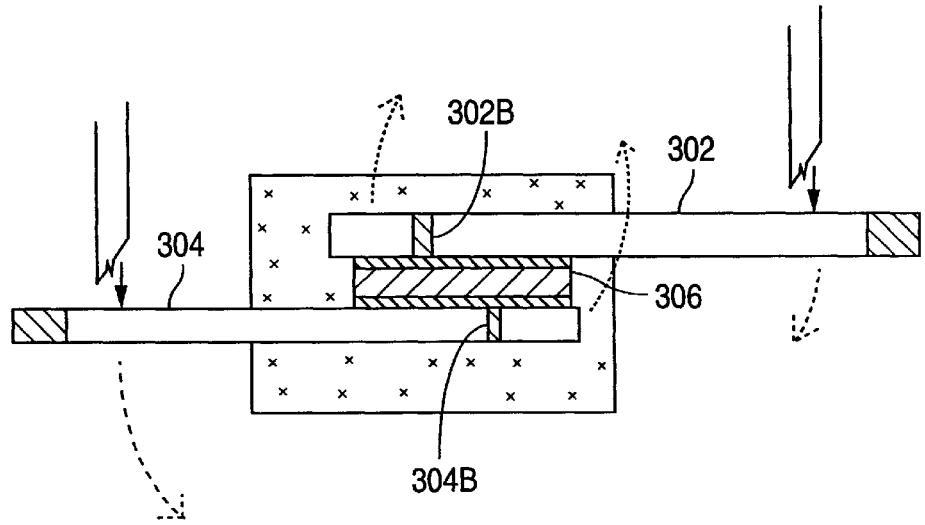
Figure 14G:
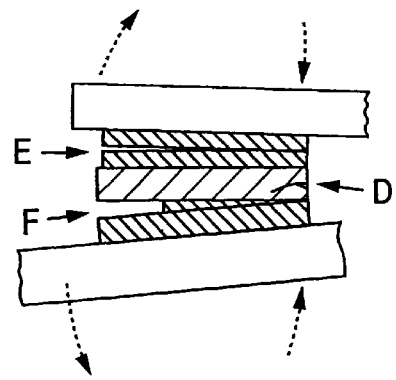
FIGS. 14G–14I illustrate problems that can occur with prior art two terminal bond-wireless packages.
Figure 14H:
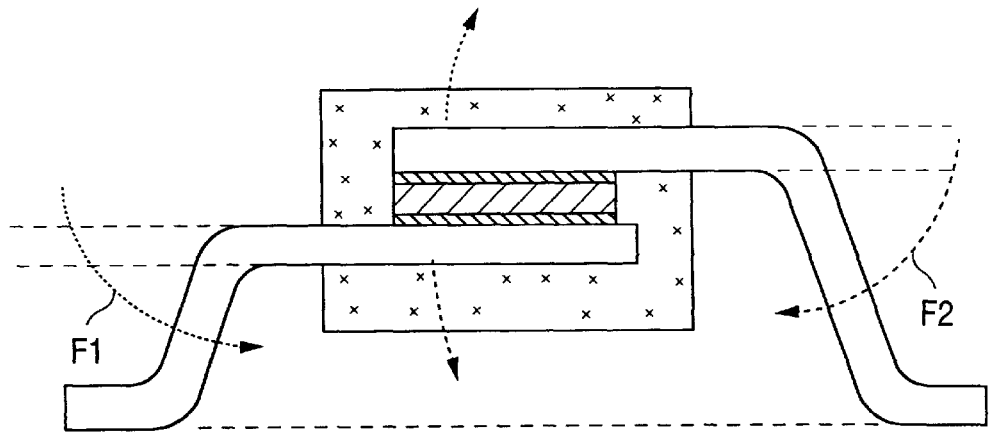

FIG. 14F illustrates the need for controlled pressure on the tie bars during die separation (trimming). The downward pressure of the trimming blades creates a torque around the center of moment for each leadframe, which is different since they are at different heights. In a preferred embodiment of this invention, the pressure on the central tie bars 302B and 304B offsets the twisting motion. As shown in FIG. 14G, without this compensating force the semiconductor may be compressed on the right leading to die crack D or pulled apart on the left leading to cracked epoxy in locations E or F.

Figure 14I:
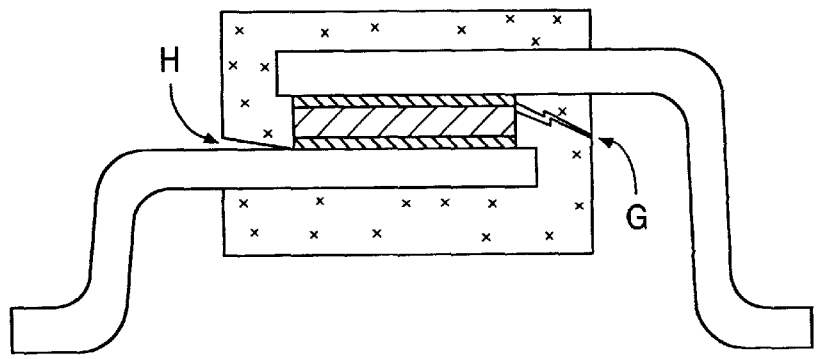

Also as an attribute of this invention, the same counter-opposing force or torque can be applied to the leadframe to prevent damage during lead bending (represented by arrows F1 and F2 in FIG. 14H), to avoid plastic cracking G or delamination of the plastic H as shown in FIG. 14I. Industry attempts at such packages, have not employed the balanced torque approach. Package cracking and reliability failures have prevented the manufacturing release of such products, even after three years of engineering developments.

To summarize, because of the asymmetry of the leadframes with respect to the die, a torque may be imposed on the package during the attachment of the leadframes to the die or during the trimming or bending of the leads. This torque can lead to delamination or other damage to the package. Assuming that the top lead frame extends to the right of the die and the bottom leadframe extends to the left of the die, as shown in FIGS. 14A–14I, the torque from the top lead frame will be clockwise and the torque from the bottom leadframe will be counter-clockwise. To counteract these torques, the central tie bar on the top leadframe is offset to the left of the central tie bar on the bottom leadframe. In packages where the top leadframe extends to the left of the die and the bottom leadframe extends to the right of the die, the central tie bar on the top leadframe is offset to the right of the central tie bar on the bottom leadframe.

Figure 15:
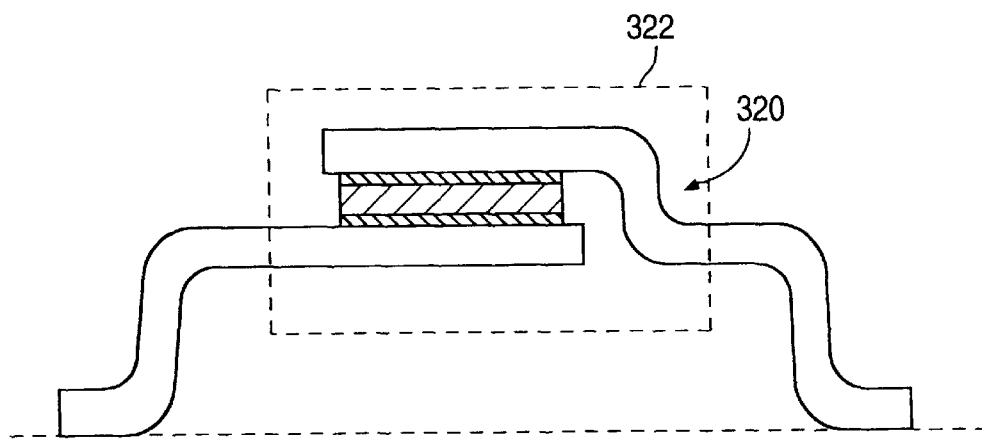
FIG. 15 illustrates a cross sectional view of single-level bond-wireless sandwich package and leadframes.

FIG. 15 illustrates a variant of the two terminal BWL package where a down set 320 in the leadframe, a feature encased by plastic 322, enables the leads to emerge from the plastic at the same height from the board.

Figure 16A:
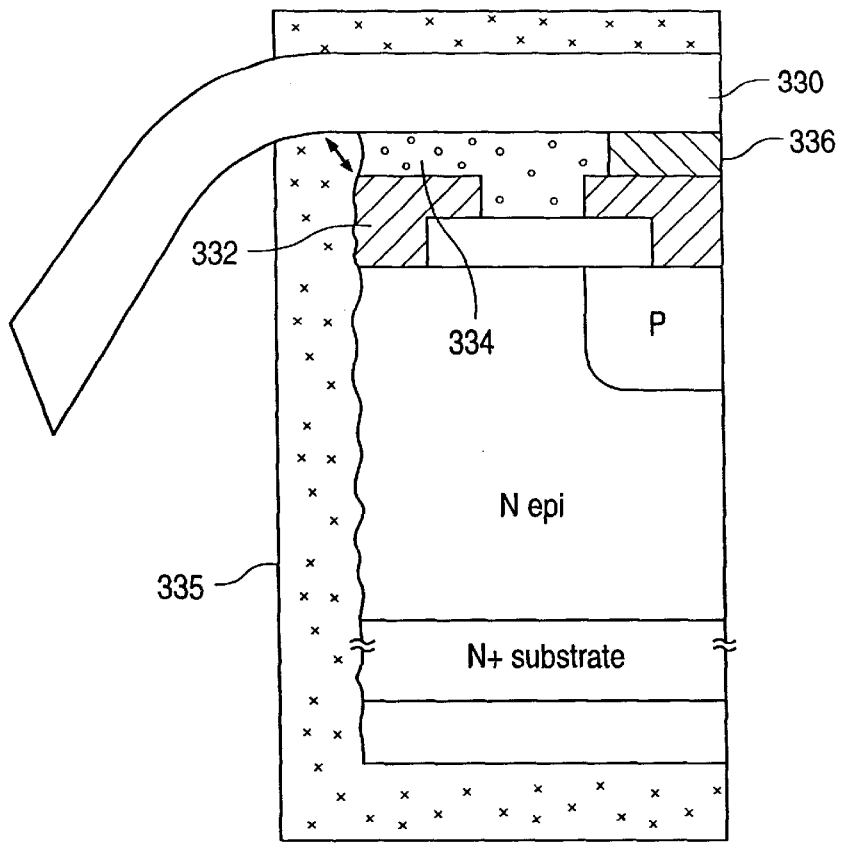
FIGS. 16A and 16B illustrate problems that can occur at the edge of a bondwireless package.

FIGS. 16A–16F illustrate a possible electrical short between the top leadframe 330 and the die edge or EQR 332 and various designs to minimize its likelihood of occurrence. In FIG. 16A, a passivation layer 334 covers the top of the EQR to minimize the shorting risk. The encapsulating plastic is indicated at 335. Another feature of this embodiment is a planarizing metal layer 336 positioned level with the top of the passivation layer in the pad windows. This layer improves the electrical contact between the BDL leadframe and the die metalization. The filler metal may be tungsten, deposited by chemical vapor deposition, and etched back flat. Otherwise the layer can be copper deposited thick and ground flat using CMP (chemical mechanical polishing).

Figure 16B:
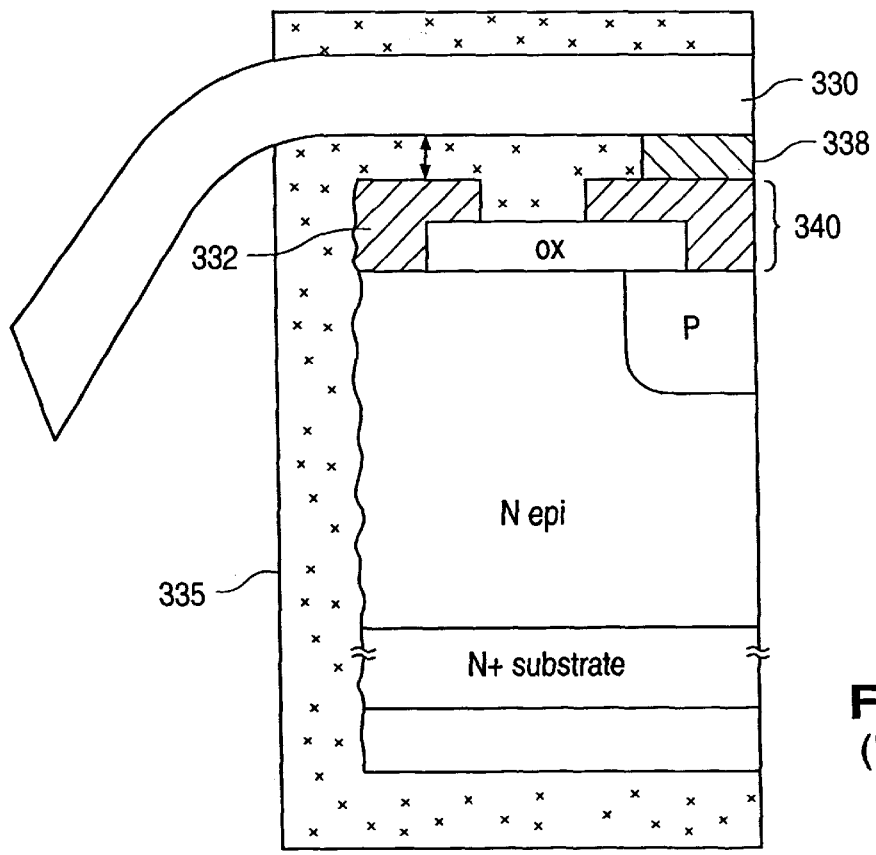

In FIG. 16B an unpassivated die is attached to a BWL leadframe, relying on injected plastic 335 to avoid a short between the leadframe and the EQR or die edge 332. In this version a second layer of metal 338 holds the leadframe away from touching the metal 1 layer 340 until the plastic can be introduced into the gap.

Figure 16C:
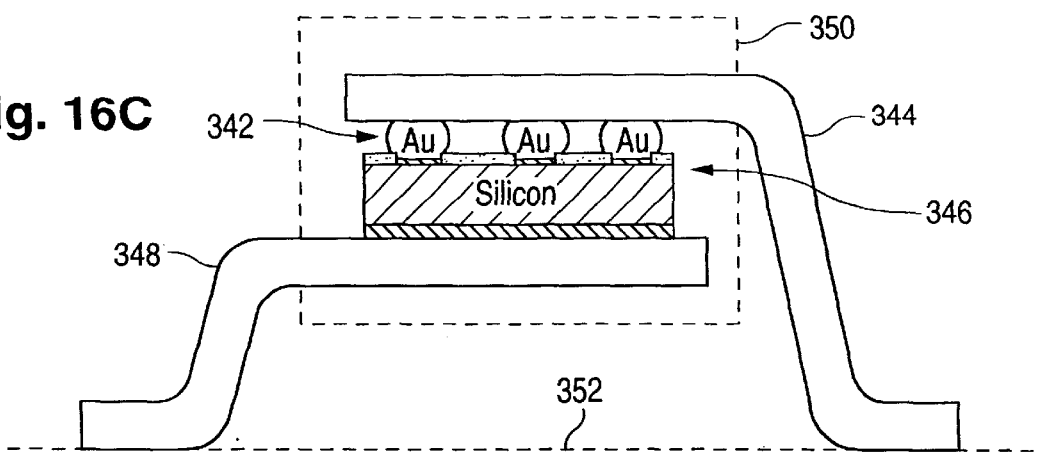
FIG. 16C illustrates a cross-sectional view of a package in which gold bumps hold the leadframe away from the edge of the die.
Figure 16D:
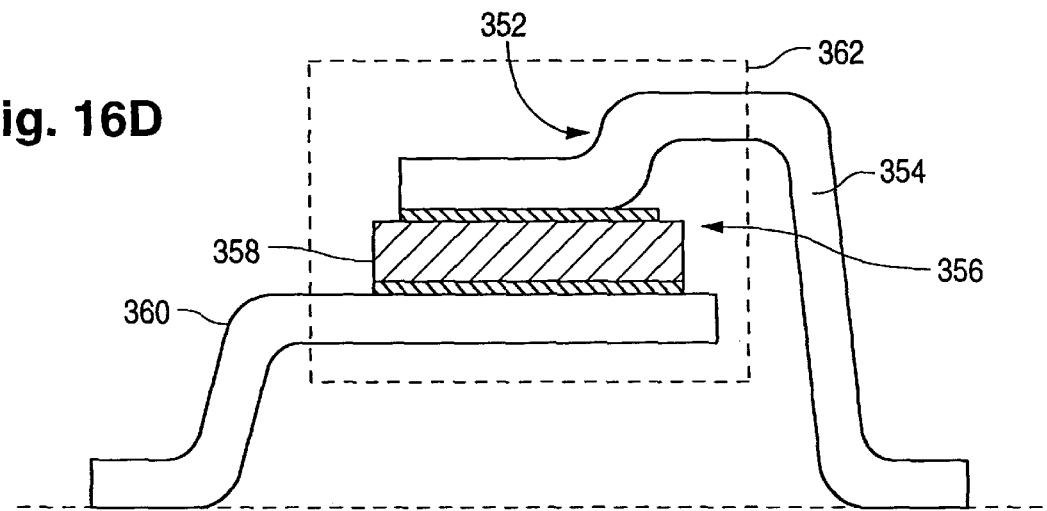
FIG. 16D illustrates a cross-sectional view of a package in which a downset in the leadframe separates the leads from the edge of the die.

Alternatively, the gold bumps 342 of FIG. 16C can be used to hold the leadframe 344 away from the die edge 346, here shown with leadframes 344 and 348 exiting the package 350 at two different levels relative to the board 352. In FIG. 16D, a downset 352 in the top leadframe 354 is used to avoid the die edge 356. The leadframe 354 does not extend over the other edge of the die 358 so no shorting risk occurs in that vicinity. In this design however, the metal leads 354 and 360 exit the package 362 at different heights, and must therefore use the torque balancing method to avoid die and plastic cracking.

Figure 16E:
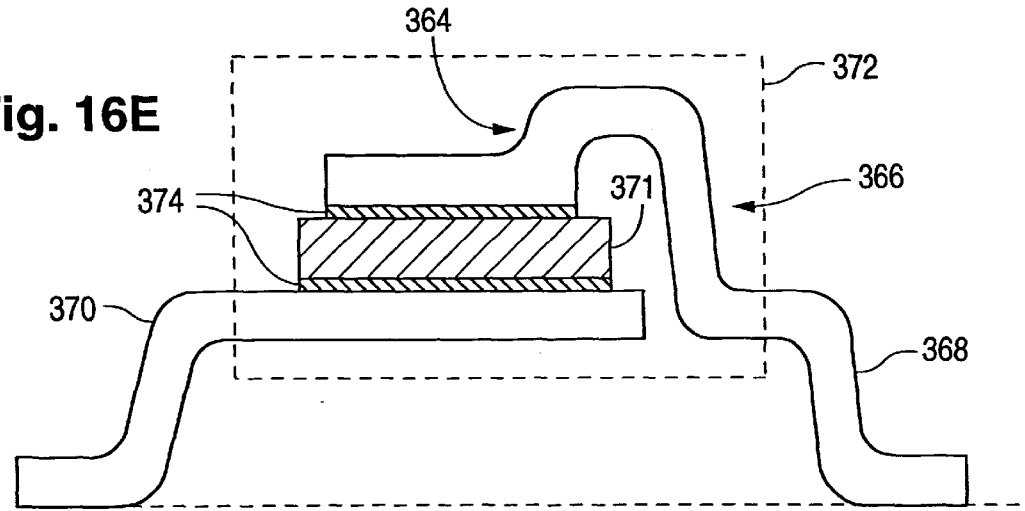
FIG. 16E illustrates a cross-sectional view of a package in which a downset is combined with a step in the leadframe to separate the leads from the edge of the die.
Figure 16F:
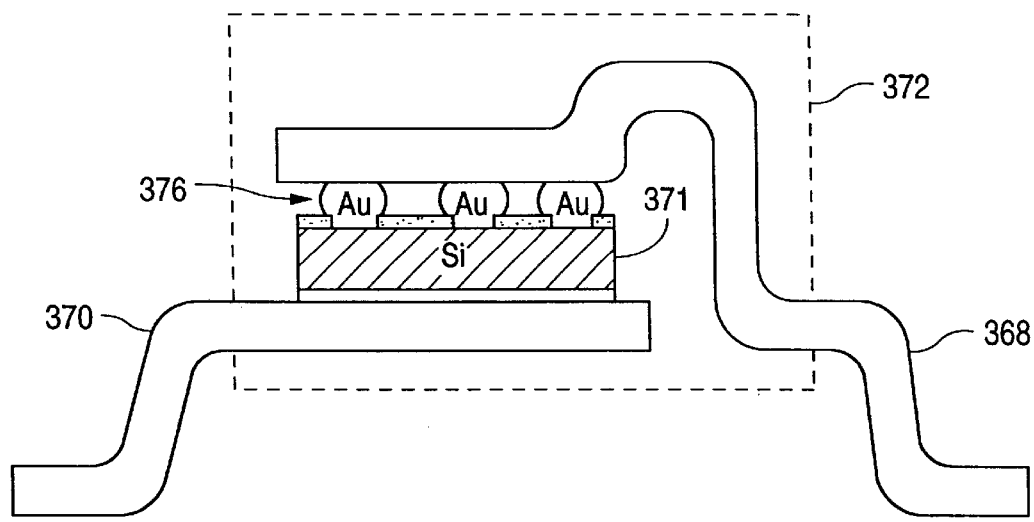
FIG. 16F illustrates a cross-sectional view of a package in which a downset and a step in the leadframe are combined with gold bumps to separate the leads from the edge of the die.

This torque problem is minimized in the design of FIG. 16E by a loop design combining a downset 364 with a step 366 so that the leads 368 and 370 exit the package 372 at the same height on both sides of the package. FIG. 16E depicts the use of a conductive epoxy 374 to attach leadframes 368 and 370 to the die 371. FIG. 16F shows the same package 372 using gold bumps 376 to attach leadframe 368 to die 371.

Three Terminal Bond-Wireless Packages

While applying zero torque and constant uniform pressure during the BWL packaging (as described above) is adequate for production of two-terminal vertical devices, the assembly of three terminal devices such as vertical power MOSFETs in BWL packages is not nearly as straightforward.

Figure 17A:
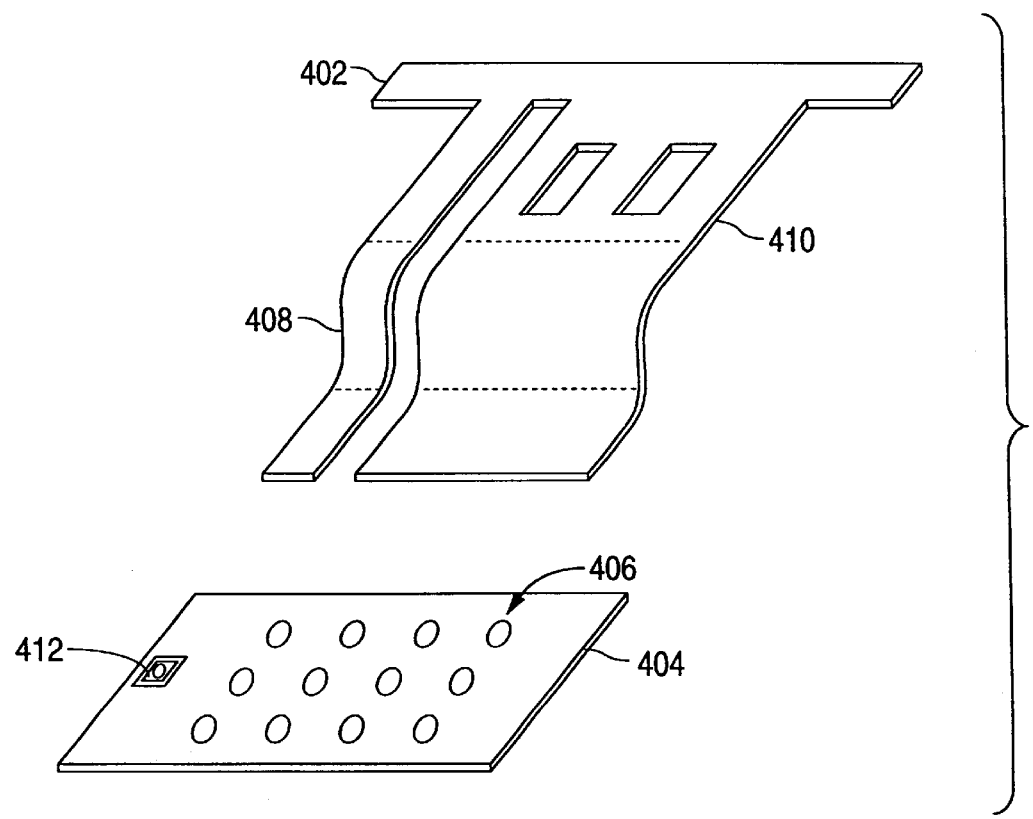

FIGS. 17A–17J illustrate one major problem in 3-terminal BWL packaging-lead coplanarity. In FIG. 17A, a down set leadframe 402 and a silicon die 404 (with conductive epoxy adhesive 406 applied) are aligned and brought in contact as in FIG. 17B. Ideally constant pressure and minimal torque will squeeze both the gate lead 408 (the thin isolated lead) and the wider source metal 410 onto the die surface with equal force. But in fact it is difficult to guarantee that attach surfaces of the two leads 408 and 410 are coplanar, meaning at the same level. It is easy for the tie bar (not shown) to bend a small amount so that the attach surface of the gate lead 408 may, for example, be located slightly above the attach surface of the source lead 410. As shown in FIG. 17C, the consequence of this coplanarity problem is the gate lead 408 does not press onto the die 404 with sufficient force to redistribute the epoxy. As a result the gate lead 408 will exhibit a poor (or no) contact to the gate pad 412 (shown in FIG. 17A).

Figure 17F:
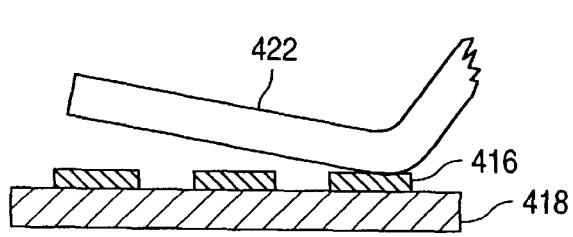
Figure 17G:
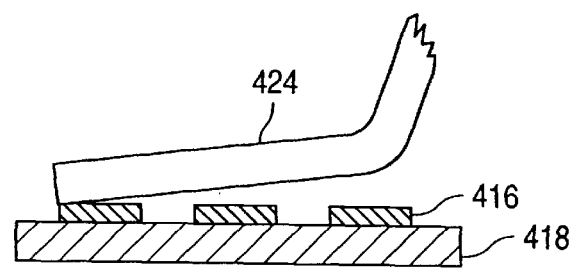
Figure 17H:
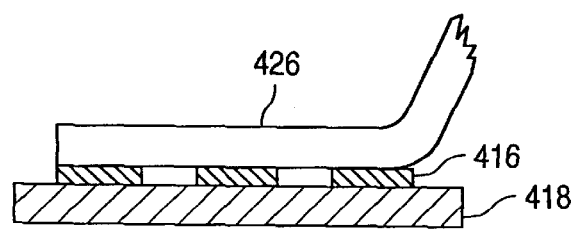

To further clarify this issue, FIG. 17D illustrates a downset lead 414 pressed properly onto the epoxy interlayer 416 to make good contact with a pad 418. In FIG. 17E, the downset lead 420 is parallel to the surface of the pad 418 but never touches, resulting in open circuit and a failed device. In FIG. 17F, the lead 422 is twisted touching only on its heal while in FIG. 17G, only the toe of lead 424 touches epoxy 416. In FIG. 17H lead 426 barely touches the epoxy 416, but the contact is so light that it does not redistribute the epoxy 416 properly, resulting in a poor electrical contact.

Figure 17I:
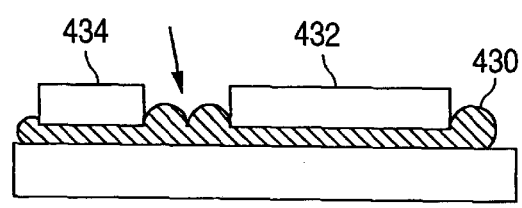
FIGS 17I and 17J illustrate the manner in the epoxy or solder used in making a connection can spread outward and thereby cause a short between adjacent leads.
Figure 17J:
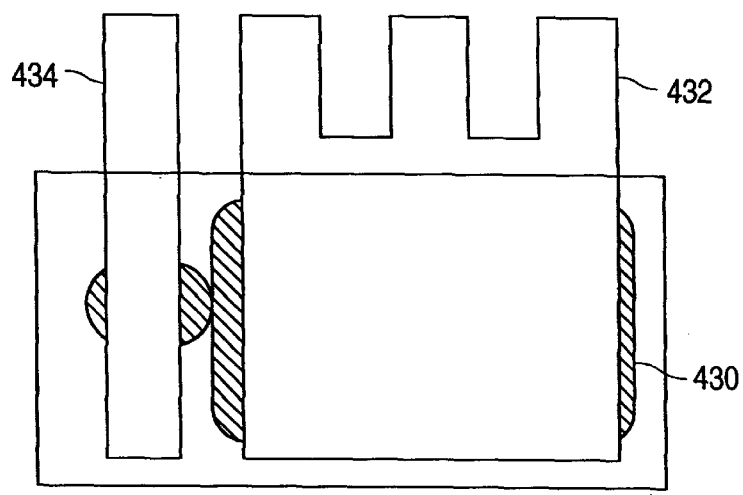

In the cross section of FIG. 17I, the epoxy 430 is squeezed with too much force (or too much epoxy was applied), resulting in a lateral short between the source leadframe 432 and the gate leadframe 434, shown in plan view in FIG. 17J.

Figure 18A:
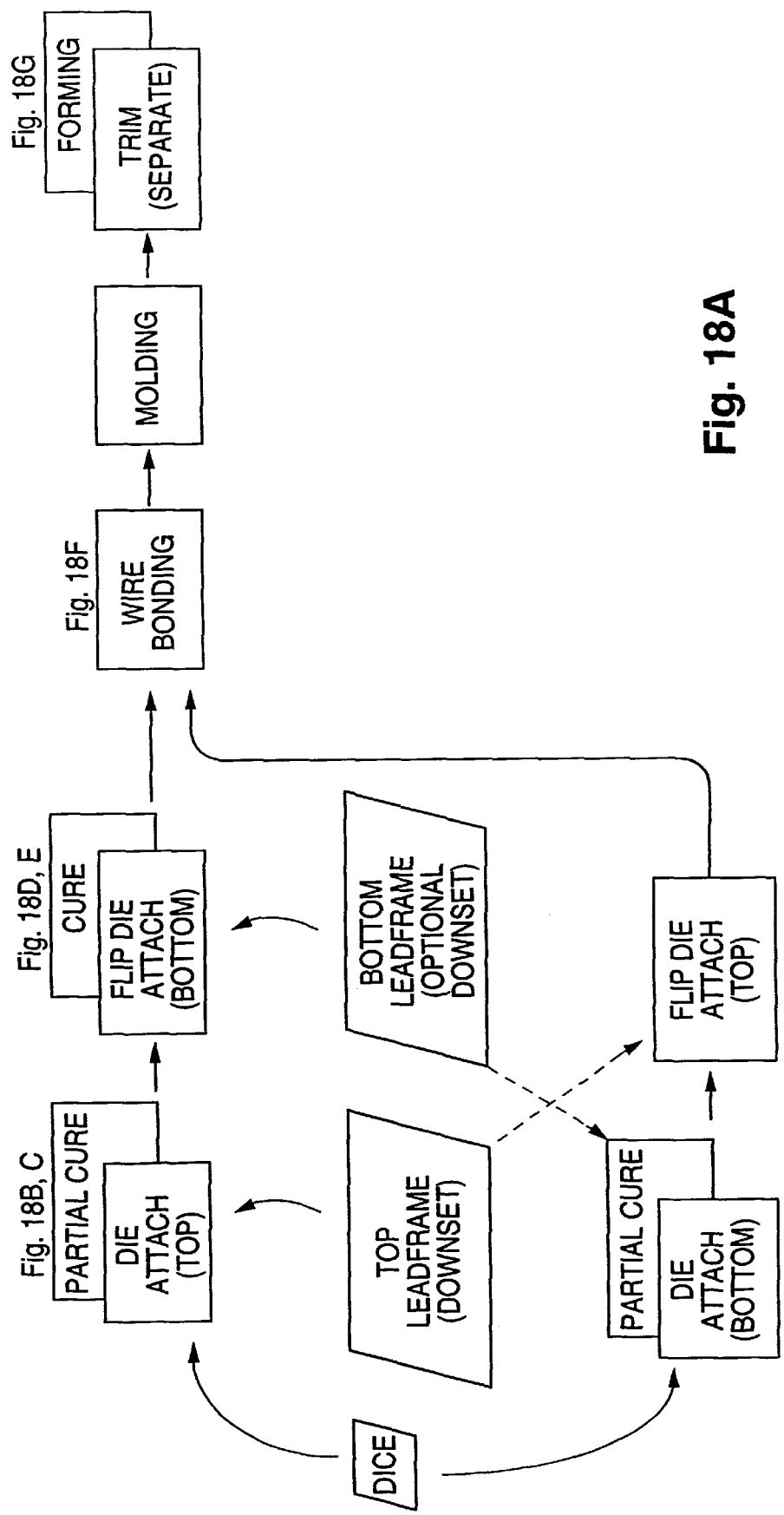
FIG. 18A is a flow diagram of a known process for fabricating a power MOSFET package containing a bond-wireless source connection and a bond wire gate connection.

So daunting is the coplanarity problem that many companies gave up on a bond-wireless gate contact and reverted to using a gate bond wire, combined with a bond-wireless source connection. Such a hybrid process flow is shown in FIG. 18A. In this flow an epoxy die attach (and partial cure) between the die and the top leadframe is then followed by flipping the die over and attaching it via epoxy to the bottom leadframe. Without the controlled torque approach disclosed previously, maintaining a uniform interfacial epoxy layer is difficult at best.

Moreover, in this flow, wire bonding must occur after BWL die-attach. After wire bonding, molding, trimming and forming still must occur. FIG. 18B illustrates a top leadframe 440 epoxy-attached to die 442. The curved-metal camel hump leadframe 440 (i.e. the step-up and down set leadframe) makes a uniform die attach operation difficult. After die attach, the plan view of FIG. 18C illustrates the BWL portion 444 of the top leadframe 440 and the shorter "diving board" piece 446 used for wire bonding the gate. Even with a tie bar tied to one side, holding leadframe 440 stable during wire bonding is difficult.

Figure 18F:
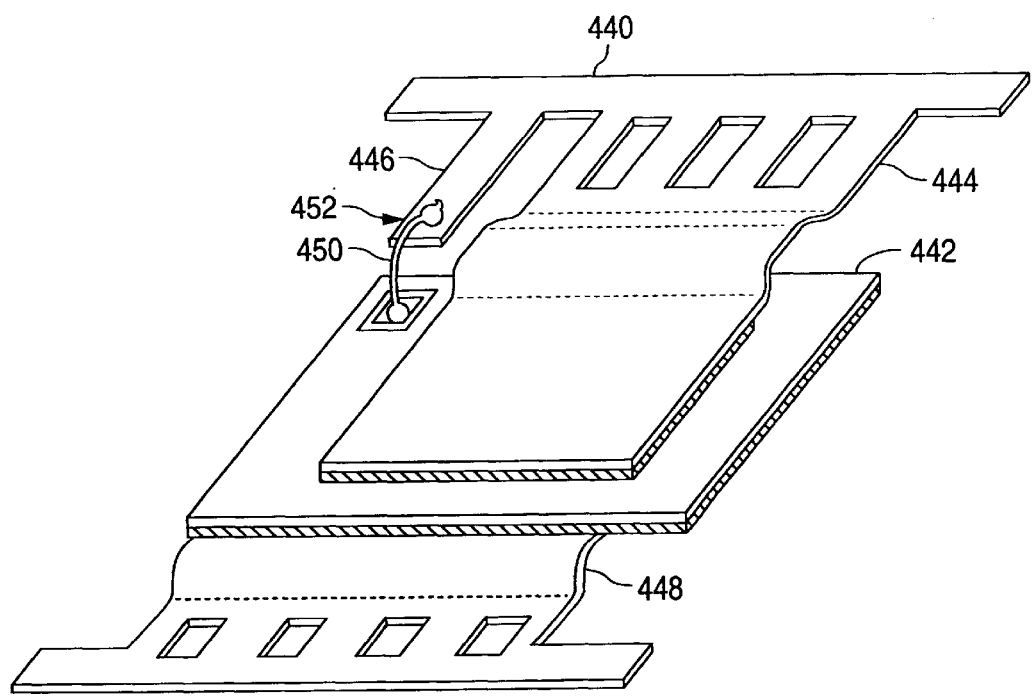
Figure 18G:
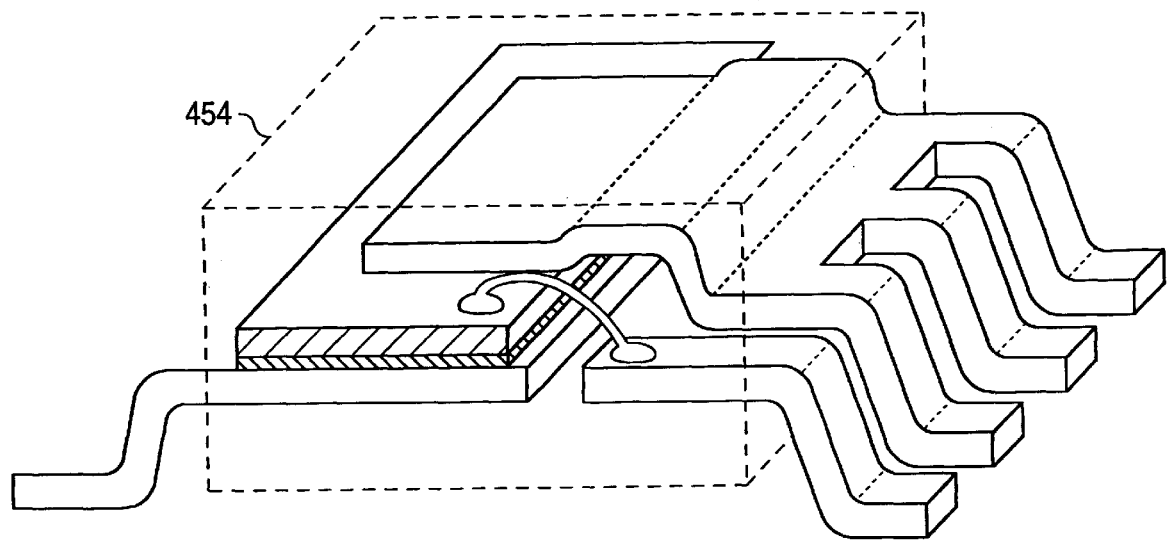

After the top leadframe 440 is attached to the die 442, the bottom leadframe 448 is die-attached using conductive epoxy, as shown in the cross-sectional view of FIG. 18D and the plan view of FIG. 18E. Again, controlling the torque and pressure during die attach and curing is critical to a reliable product. The gate lead 446 is then wired-bonded, using a bonding wire 450, as shown in the perspective drawing of FIG. 18F. Notice that gate lead 446 is mechanically analogous to a diving board with little support of its free end during wire-bonding. Its movement makes the quality of the gate bond 452 questionable and variable. FIG. 18G shows another perspective drawing after plastic molding (shown as a dotted line 454). The asymmetry of the design renders manufacturing of this approach challenging and irreproducible.

Figure 19A:
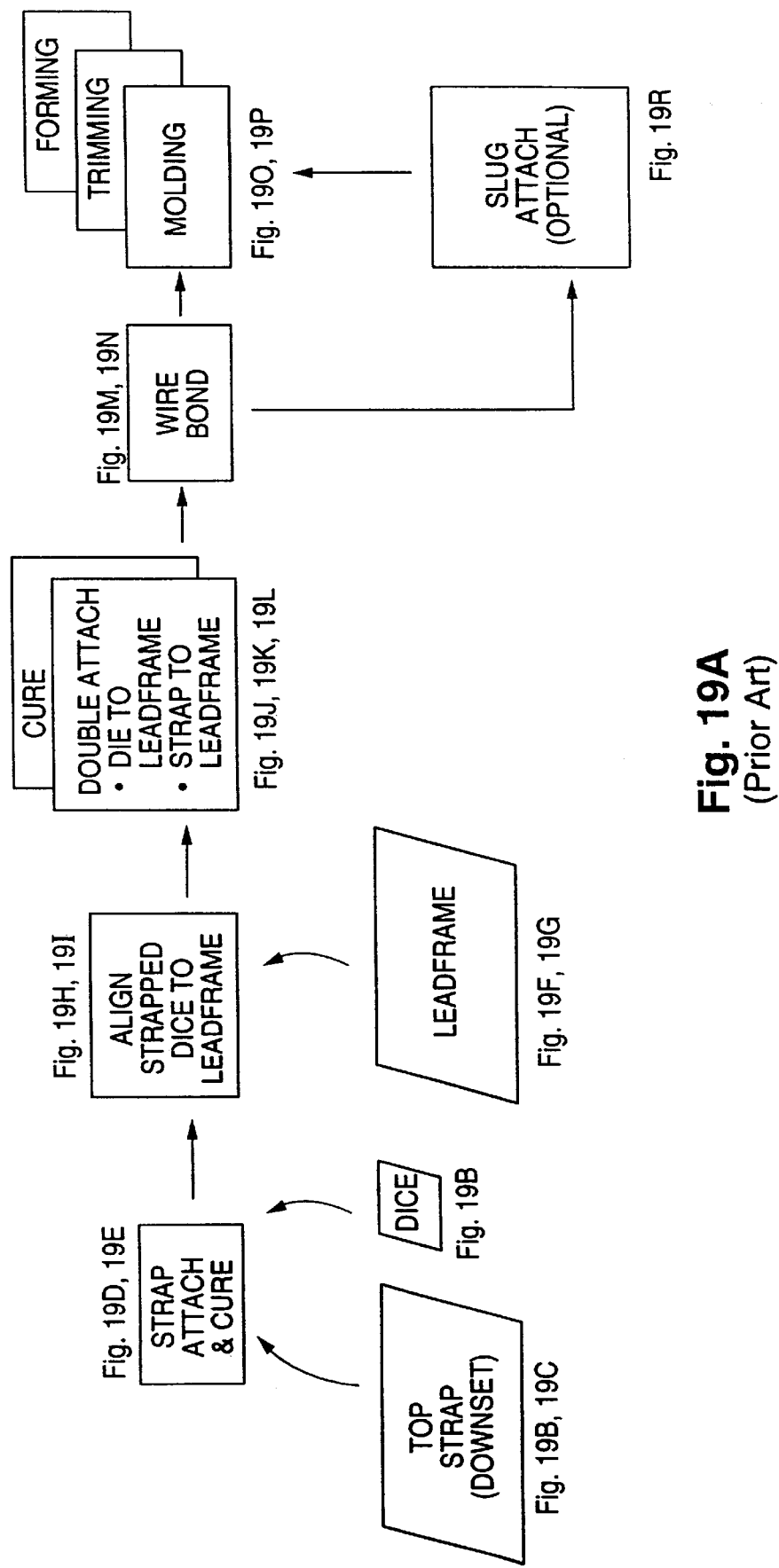
FIG. 19A is a flow diagram of a known process for fabricating a power MOSFET package containing a die-and-strap assembly.

Another approach to avoid the coplanarity problem is shown in the flow diagram of FIG. 19A. In this approach, the die is first attached to a copper strap layer to form a die and strap assembly, then subsequently the die and strap assembly is attached to a conventional leadframe. After this second attachment, the part still must be wire bonded to connect the gate of the device. Thereafter the structure is molded, trimmed and formed.

In FIG. 19B, again a camel hump piece of metal, in this case the "strap" 460 is aligned to the die 462. The strap 460 has a uniform width (see FIG. 19C) and therefore must be positioned so as to not cover the gate bonding pad 464 (see FIG. 19E) yet still contact the source. Strap 460 is shown in the cross-sectional view of FIG. 19D and the plan view of FIG. 19E as a source lead epoxy-attached to die 462 to form a die and strap assembly 461. It is critical that bottom surfaces of the foot 466 of the camel hump strap 460 and the die 462 be perfectly coplanar to avoid problems later in the process.

Figure 19F:
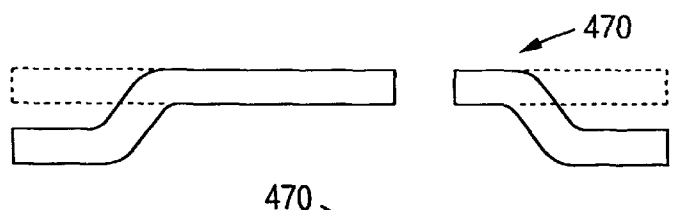
FIGS. 19B–19R are views illustrating the process of FIG. 19A.
Figure 19G:
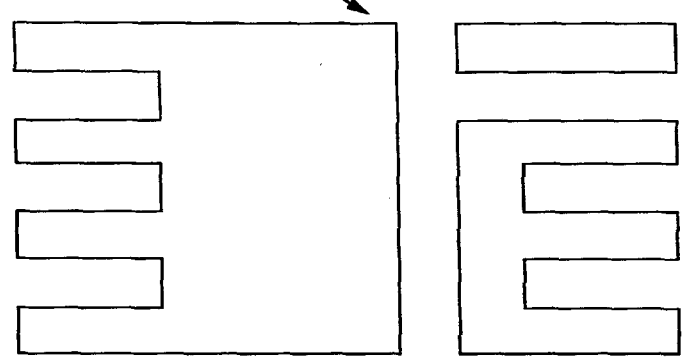

The bottom leadframe 470, shown in the cross-sectional view of FIG. 19F and the plan view in FIG. 19G, looks like a ordinary leadframe. Note that while lead frame appears to be in separate parts in FIGS. 19F–19R, in reality the parts are connected by a tie bar (not shown). Leadframe 470 is typically flat before it is attached to the die, although conceivably it could be pre-formed, i.e., already bent.

Figure 19H:
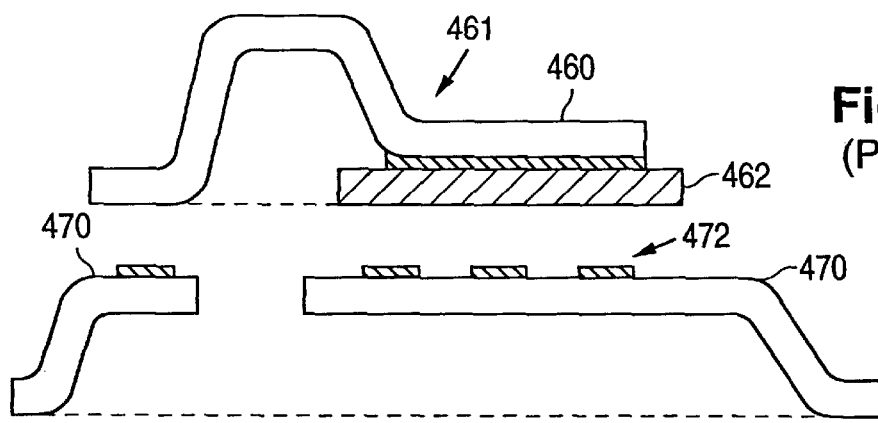
Figure 19I:
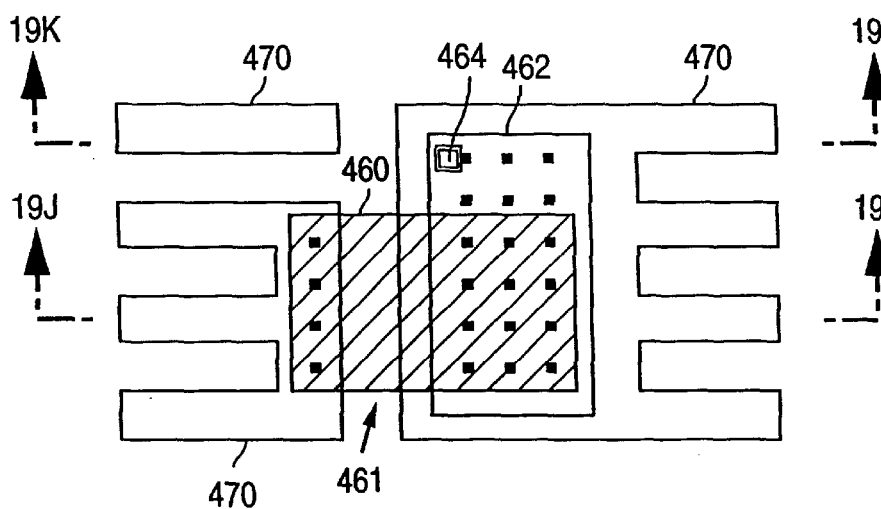
Figure 19J:
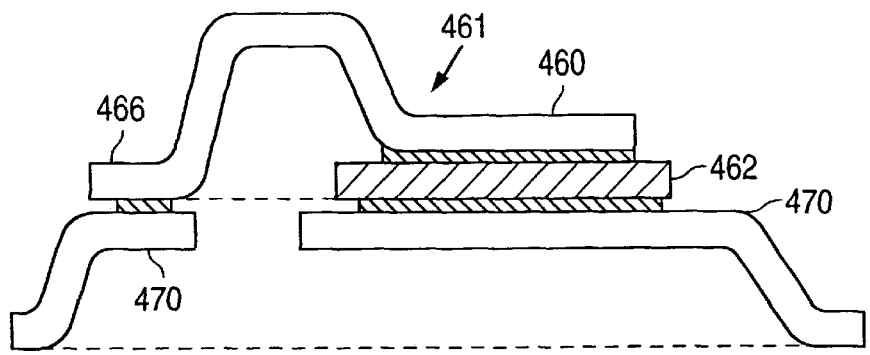
Figure 19K:
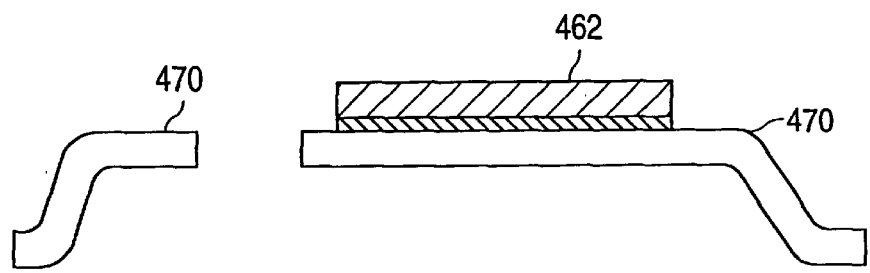

In FIG. 19H and FIG. 19I, the die and strap assembly 461, comprising the die 462 and copper strap 460, is aligned to the bottom leadframe 470, which is coated with epoxy 472. At this point, the epoxy 472 applied to the bottom lead frame 470 has no correspondence with surface features of the die, such as the gate pad 464. FIG. 19J is a view of the die and strap assembly 461 pushed onto the bottom leadframe 470, taken at cross-section 19J—19J shown in FIG. 19I. As is evident, the coplanarity of the bottom surfaces of die 462 and the foot 466 of strap 460 are crucial in achieving two good, low-resistance epoxy joints simultaneously, the one under the die 462 and the other under the foot 466. Since the second joint is of limited area, this region contributes to an increased resistance compared to the other 3-terminal BWL package discussed thusfar. A view of the gate bonding area, taken at cross-section 19K—19K in FIG. 19I, is shown in FIG. 19K.

Figure 19L:
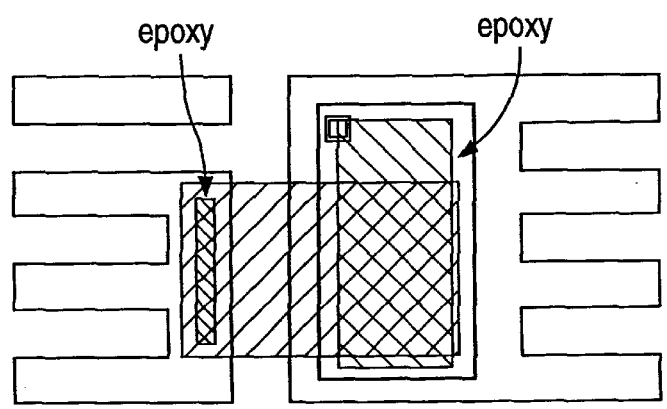
Figure 19M:
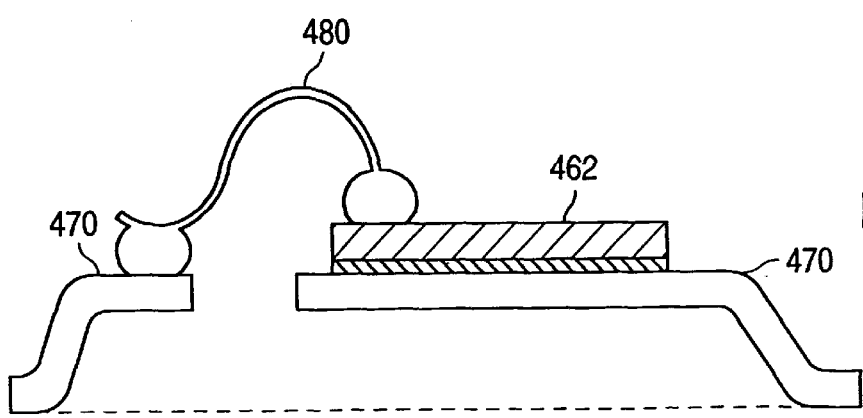
Figure 19N:
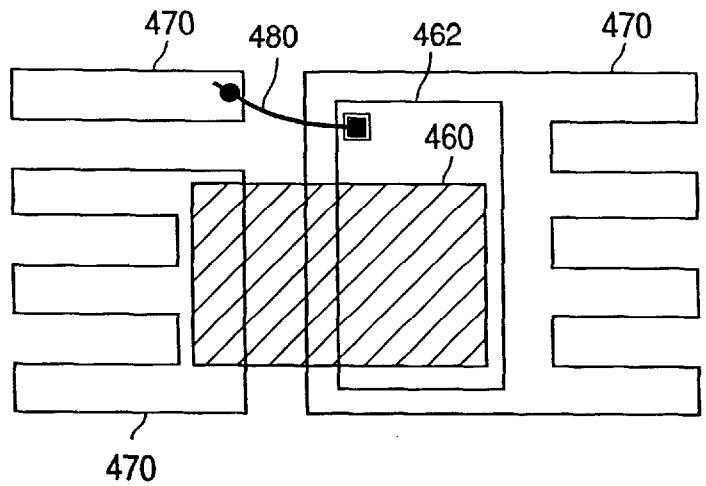
Figure 19O:
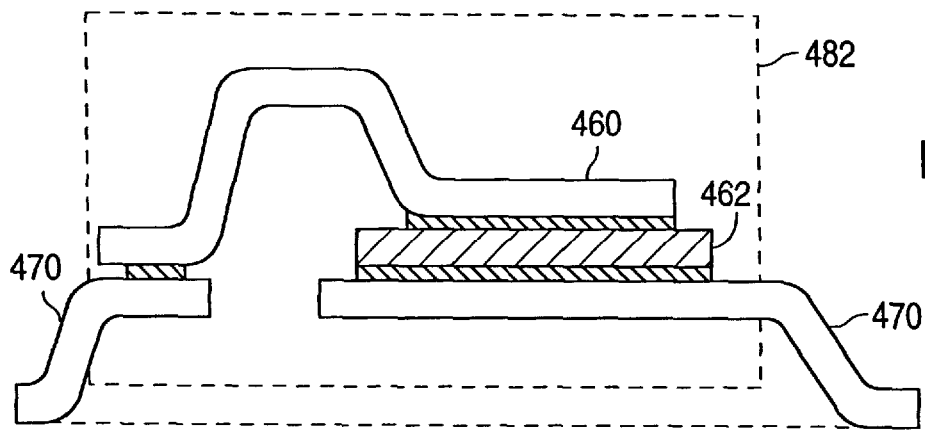
Figure 19P:
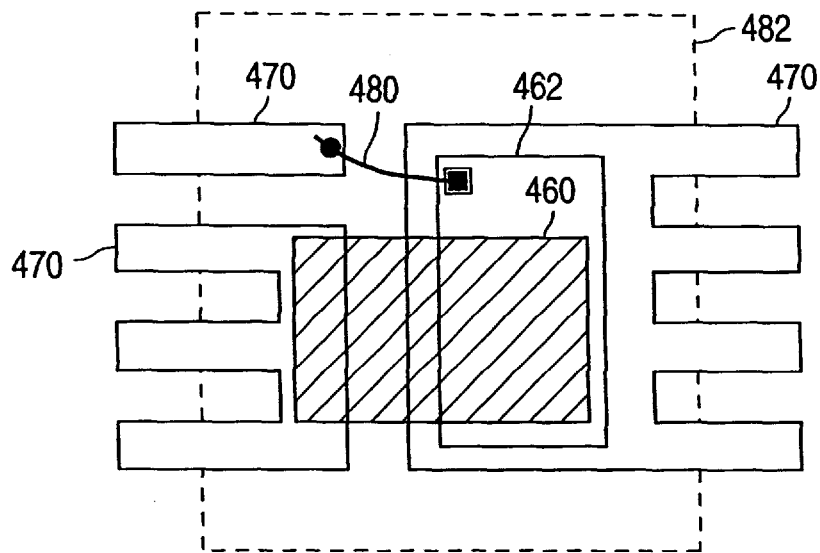

After squeezing the epoxy by pressure, the epoxy should ideally redistribute evenly across the bottom of the metal strap and under the die as shown in FIG. 19L. Since the assembly is totally asymmetrical however, uniform pressure is difficult to achieve reproducibly. As shown in the cross-sectional view of FIG. 19M and the plan view of FIG. 19N, a wire bond 480 is then made, followed by injection molding to form the plastic capsule 482 shown in FIG. 19O and 19P.

Figure 19Q:
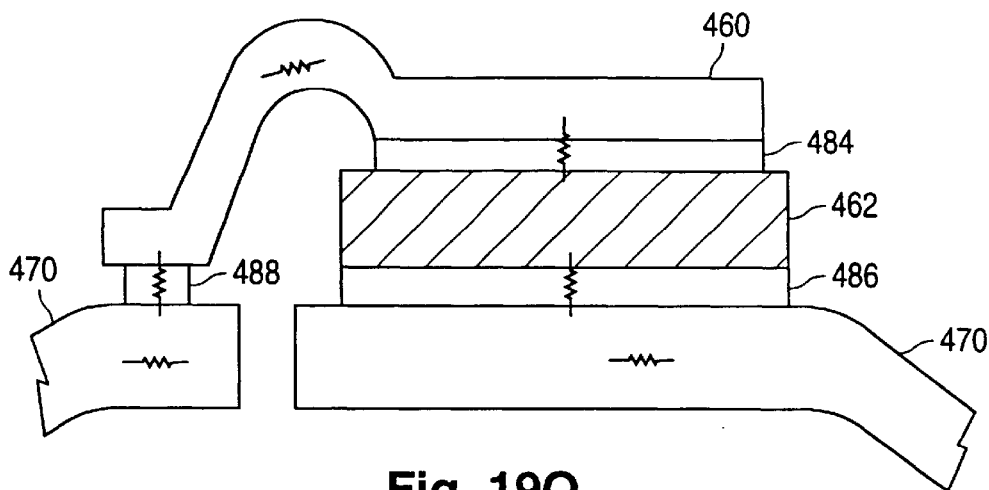
Figure 19R:
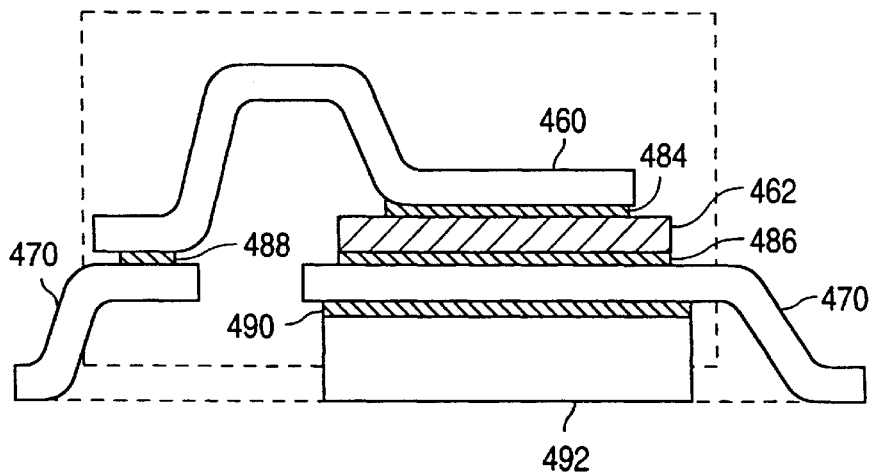

Clearly the number of epoxy layers carrying high currents is greater than other packaging approaches—three in the design shown in FIG. 19Q, i.e., epoxy layers 484, 486 and 488. An option to introduce a heat slug 492 under the leadframe 470, as shown in FIG. 19R involves another epoxy layer 490. The design relies completely on the epoxy layer 490 to hold the heat slug 492 against the leadframe 470, without any mechanism to "lock" it in place.

Again the asymmetry of the design, especially during the many epoxy die attach steps, make the high volume manufacturability of this design suspect. Clearly, the large number of processing steps makes it expensive. The non-planar surface of the split leadframe (i.e. the leadframe comprising gate and source connections) is especially problematic since any downset exacerbates the co-planarity problem during top-side die attach.

Asymmetrical Three-Terminal Bond- Wireless Packages Having Notched Leadframes

One major improvement comes from employing a flat top leadframe, i.e. a leadframe that remains substantially parallel to the die inside of the die outline. One way to accomplish this goal and still avoid the aforementioned die edge short problem is to thin or "notch" the leadframe wherever it passes over an edge of the die. By thinning or removing some of the metal from the surface of the leadframe facing the die, the distance between the facing surface of the leadframe and the die is increased, thereby reducing or eliminating the risk of a short to the die edge, the termination, or the equipotential ring. The thickness of the leadframe can be increased throughout to maintain acceptable thickness criteria in the notched areas. In one embodiment, the notched area has the thickness normally used for leadframes, namely 0.2 mm, and the un-notched regions are 15 to 70% thicker, depending on the depth of the notch. The notches can be formed, form example, by photolithographically patterning and etching the leadframe (sometimes referred to as "half etching") or by stamping the leadframe using a stamping machine with an appropriate die. Both of these techniques involve known processes and equipment.

Figure 20A:
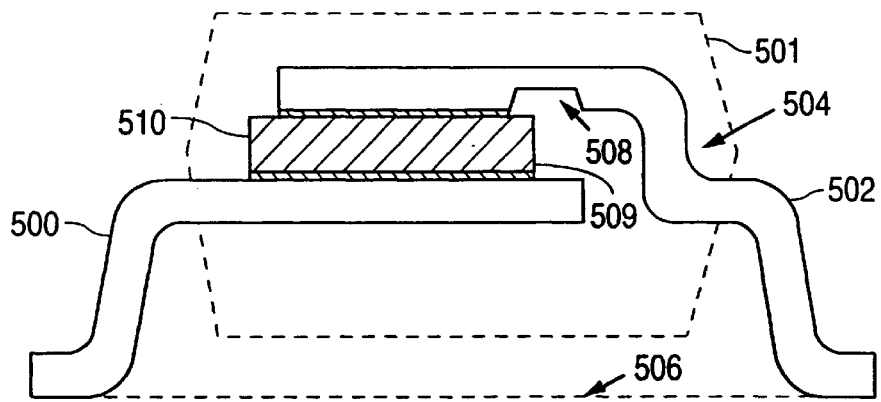
FIG. 20A is a cross-sectional view of a semiconductor package according to the invention wherein one the top leadframe is notched and contains a bend such that the leads exit the plastic capsule at the same level.

Assuming the top leadframe crosses the die edge on only one side, several fundamental design variants are possible as shown in the cross sections of FIGS. 20A–20D. In FIG. 20A, the bottom leadframe 500 is flat within the plastic 501 and the top leadframe 502 includes a bent portion 504 so that leadframes 500 and 502 exit the plastic 501 at the same height (relative the PCB 506 or lead foot). The top leadframe 502, comprising the gate and source leads, includes a notch 508, located where leadframe 502 crosses or passes over an edge 509 of die 510.

Figure 20B:
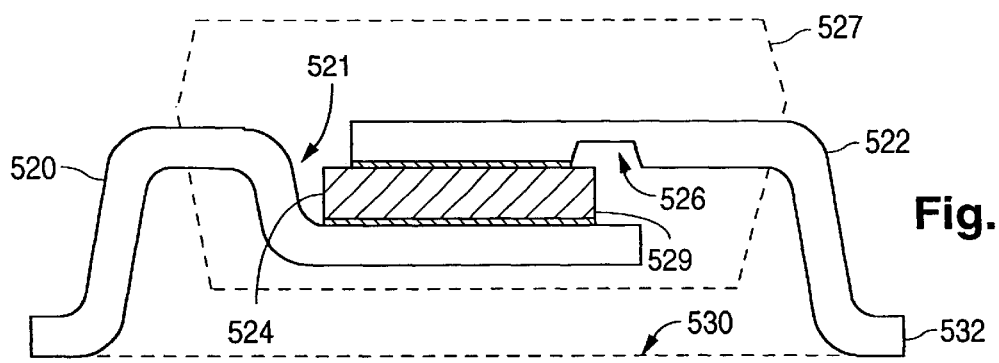
FIG. 20B is a cross-sectional view of a semiconductor package according to the invention wherein the top leadframe is notched and the bottom leadframe contain a downset such that the leads exit the plastic capsule at the same level.

In FIG. 20B, the bottom leadframe 520 includes a downset 521. Assuming that leadframe 520 has the same electrical potential as the die edge 524, there is no risk of a short between leadframe 520 and die edge 524, since they are at the same the same voltage. The top leadframe 522, comprising at least gate and source connections, is substantially planar (i.e. flat) except for the notch 526 where leadframe 522 crosses the die edge 529. Ideally, the top leadframe 522 and the bottom leadframe 520 exit the plastic 527 at the same height relative to the PCB 530 and the lead foot 532.

Figure 20C:
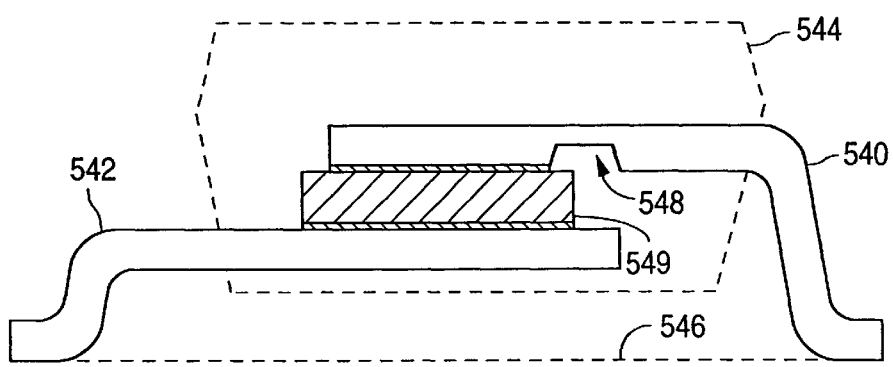
FIG. 20C is a cross-sectional view of a semiconductor package according to the invention wherein the top leadframe is notched and the leads do not exit the plastic capsule at the same level.

In FIG. 20C, neither top leadframe 540 nor bottom leadframe 542 includes a downset or bend within the plastic 544, but leadframes 540 and 542 exit the plastic 544 at a different height relative to the PCB 546. A notch 548 is present where leadframe 540 crosses the die edge 549.

Figure 20D:
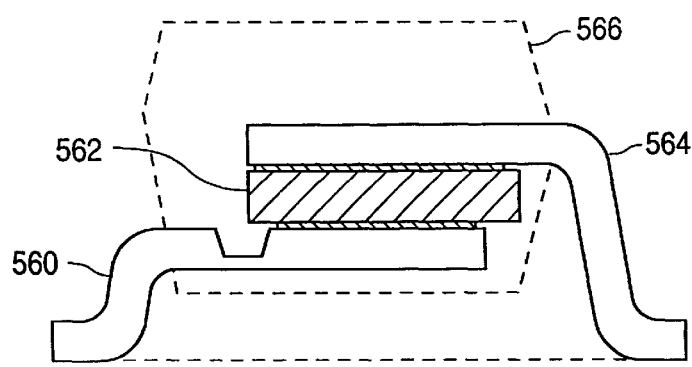
FIG. 20D is a cross-sectional view of a semiconductor package according to the invention wherein the bottom leadframe is notched and the leads do not exit the plastic capsule at the same level.
Figure 20E:
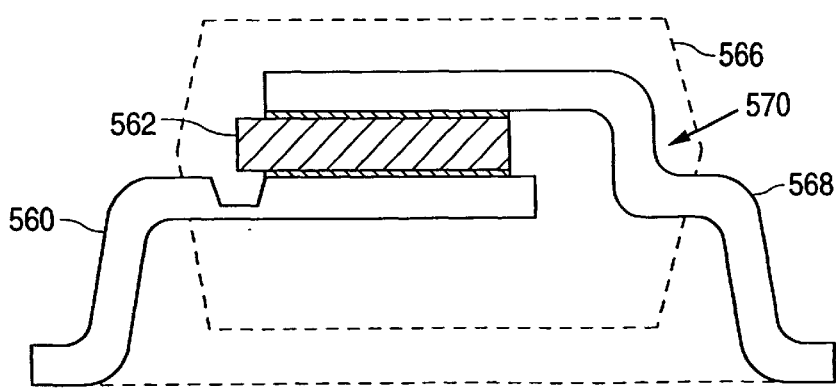
FIG. 20E is a cross-sectional view of a semiconductor package according to the invention wherein the bottom leadframe is notched and the top leadframe contains a downset such that the leads exit the plastic capsule at the same level.

FIGS. 20D and 20E illustrate possible "inverted die" designs where the notched multiple terminal leadframe 560 is positioned underneath the die 562, the multi-terminal side of the die 562 facing downward so as to connect to the corresponding connections on the leadframe 560. In FIG. 20D the top and bottom leadframes 564 and 560 exit the plastic package 566 at different heights while in FIG. 20E, the top and bottom leadframes 568 and 560 are co-planar since the top leadframe 568 includes a portion 570 bent upwards located within the confines of the plastic 566.

In the terminology used thus far the "top" leadframe is the leadframe where at least the gate and source terminals are present, i.e. the multi-terminal side of the die, and the "bottom" leadframe is a single solid piece. The design can of course be inverted with the multi-terminal leadframe employed as the underside leadframe and the top leadframe having a single electrical terminal. In a vertical discrete power MOSFET, the die would have its source side pointing down and its drain pointing up.

Figure 21:
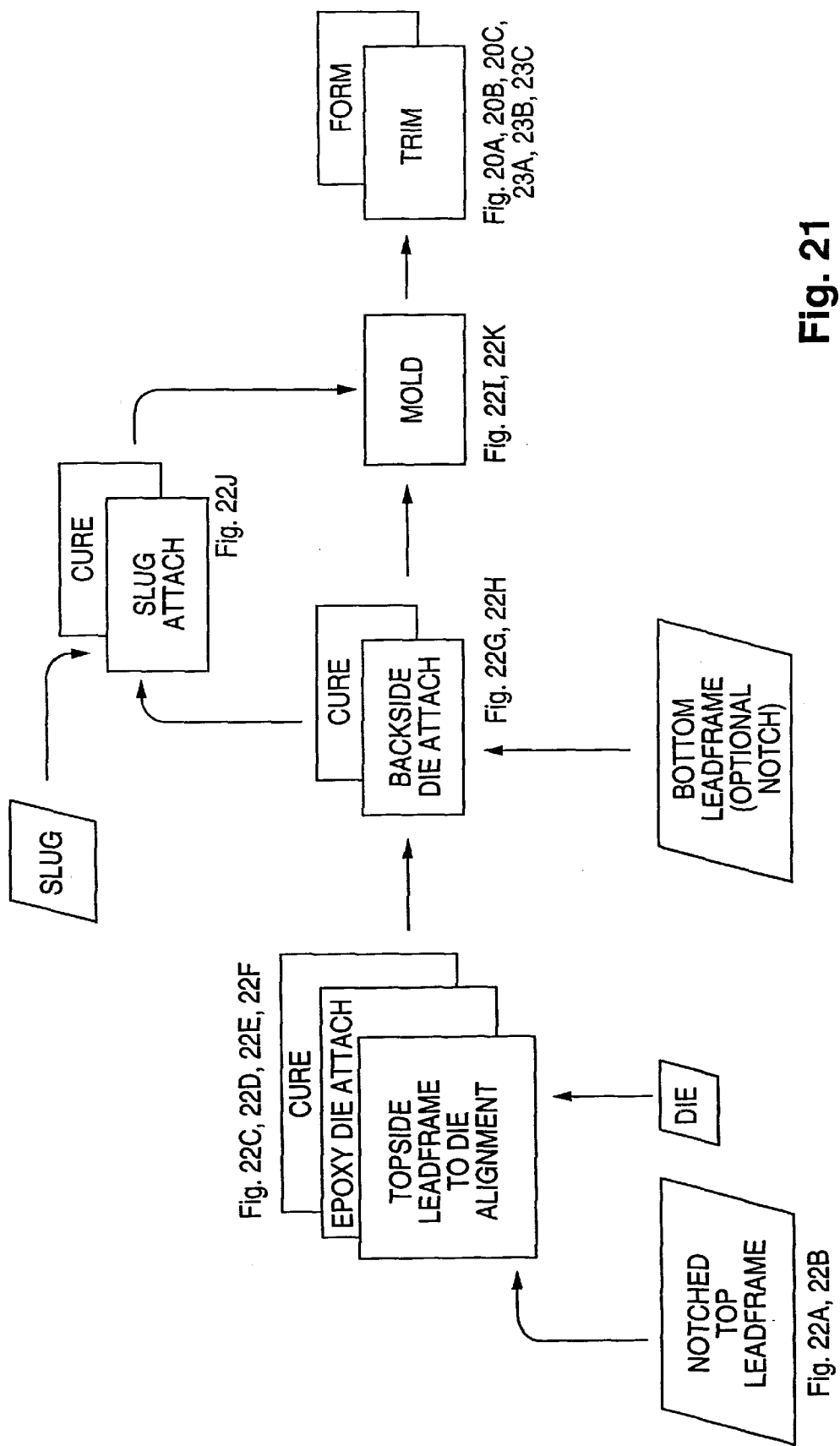
FIG. 21 is a flow diagram of a known process for fabricating a notched bond-wireless package.

FIG. 21 illustrates the process flow for manufacturing a notched bond-wireless (BWL) package, starting with a notched top leadframe and a silicon die, where by the two are aligned, epoxy die attached and cured (or partially cured), ideally under constant pressure (using methods described below). While soft solder can be used at this step to perform the top die attach, the chance of shorting a multi-terminal leadframe with solder is greater than the same risk using conductive epoxy since molten solder "wets", and may flow laterally along the die surface.

Next, the die-top-leadframe assembly is epoxy-attached to a bottom leadframe, and the conductive epoxy cured, ideally under constant pressure. Alternatively, soft solder can be employed for the die-attach. Optionally, a heat slug can be attached to the underside leadframe at this stage in the process, using epoxy die attach or optionally using soft solder.

The entire assembly, with or without the heat slug is then injection molded with plastic molding compound, the leads are then trimmed and then bent (formed).

These steps are shown in detail in FIGS. 22A–22K.

Figure 22A:
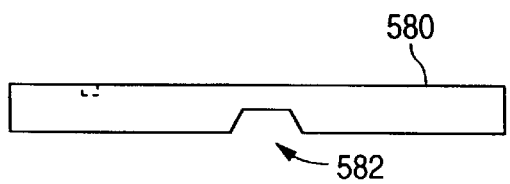
FIGS. 22A–22K are views illustrating the process of FIG. 21.
Figure 22B:
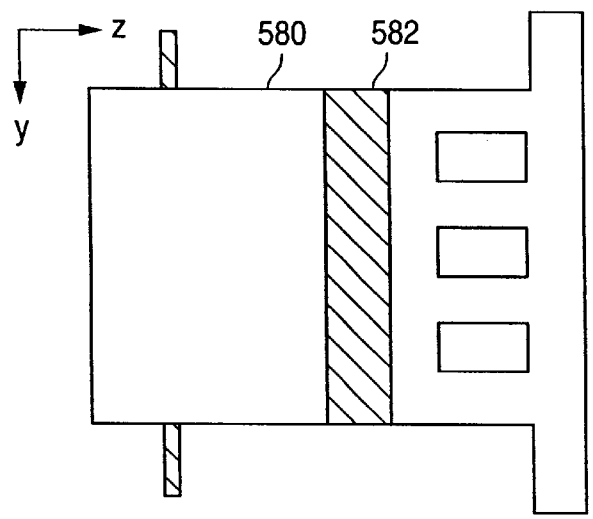
Figure 22C:
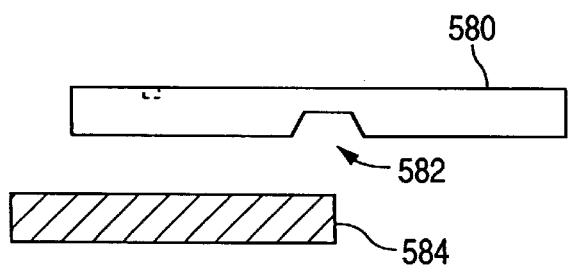
Figure 22D:
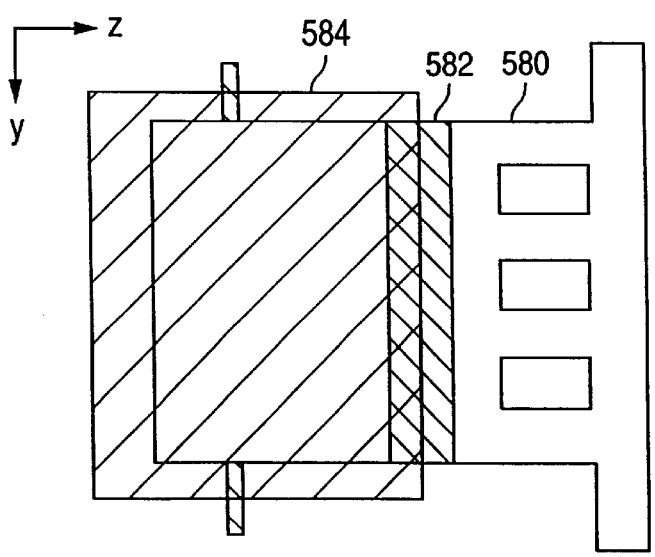

FIGS. 22A and 22B are cross-sectional and plan views, respectively, of a top leadframe 580 having a notch 582. FIGS. 22C and 22D are similar views showing top leadframe 580 positioned over a die 584, the notch 282 being located where leadframe 580 passes over an edge of die 584.

Figure 22E:
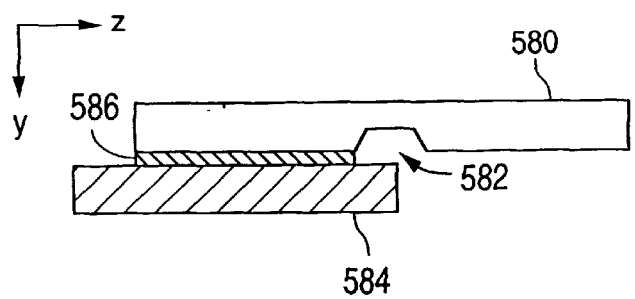
Figure 22F:
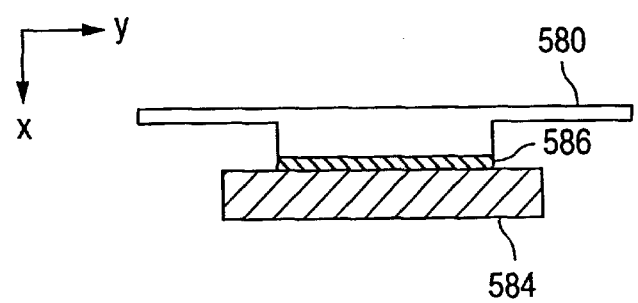

FIG. 22E is a cross-sectional view showing leadframe 580 attached to die 584 with a layer 586 of conductive epoxy. FIG. 22F is a cross-sectional view taken at a right angle to FIG. 22E.

Figure 22G:
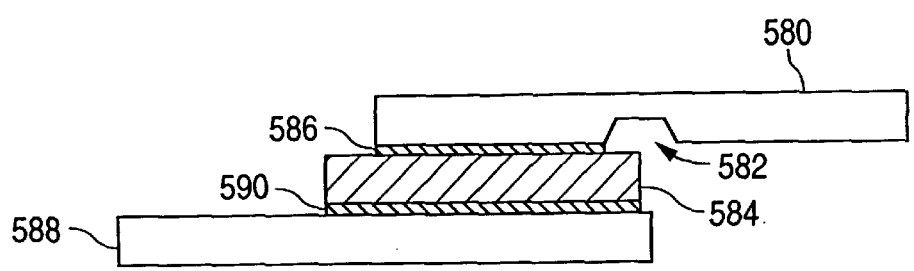
Figure 22H:
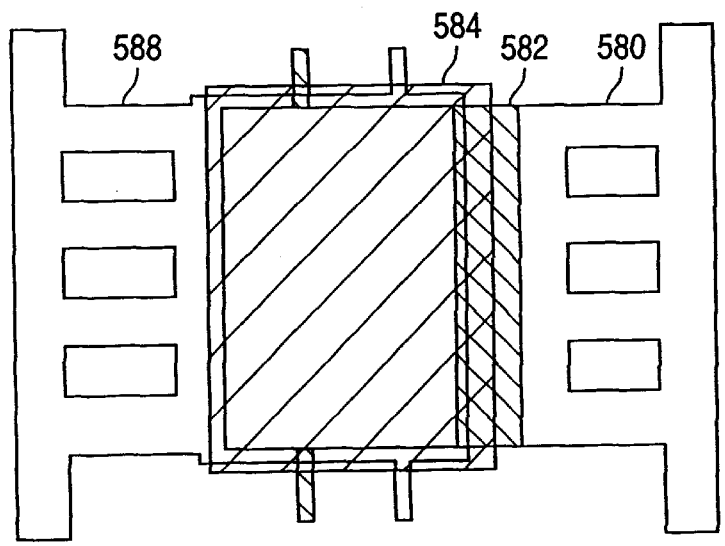
Figure 22I:
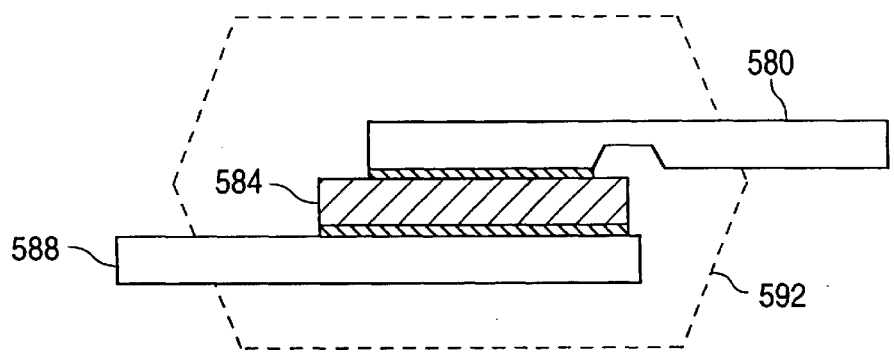

FIGS. 22G and 22H are cross-sectional and plan views, respectively, of the assembly after a bottom leadframe 588 has been attached to die 584 with a layer 590 of conductive epoxy. FIG. 22I shows the leadframes 580 and 588 and die 584 after injection molding into a plastic casing 592.

Figure 22J:
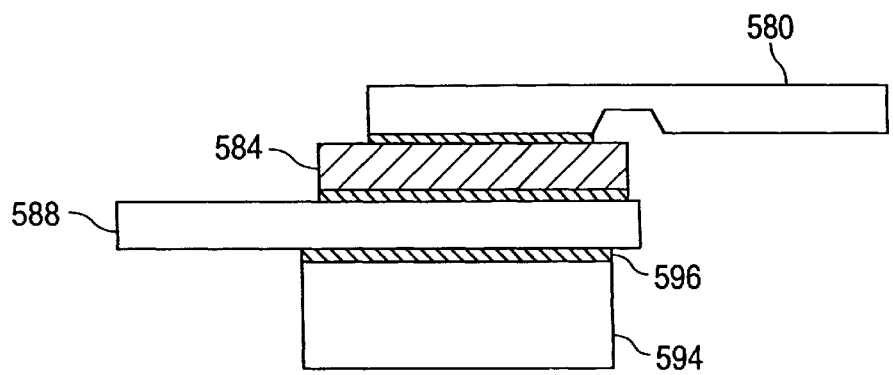
Figure 22K:
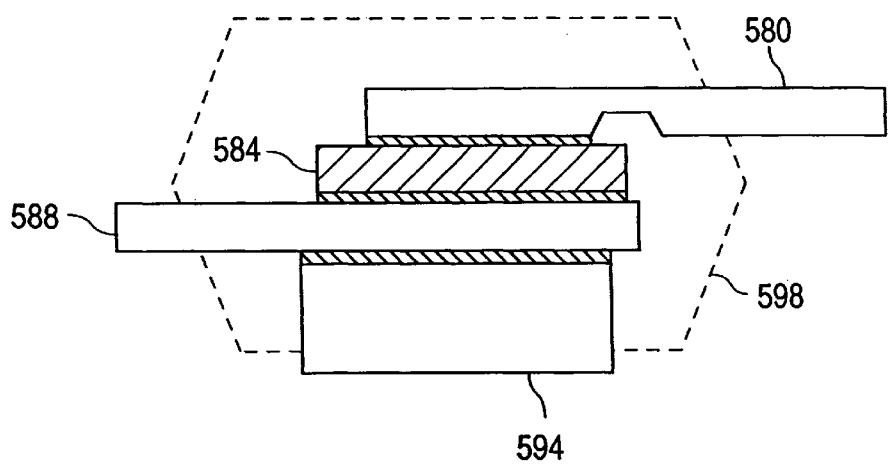

FIG. 22J shows an alternative assembly where a heat slug or sink 594 is attached to bottom lead frame 588 with an epoxy layer 596. FIG. 22K shows the assembly of top leadframe 580, die 584, bottom leadframe 588 and heat slug 594 encapsulated in plastic 598.

Figure 23A:
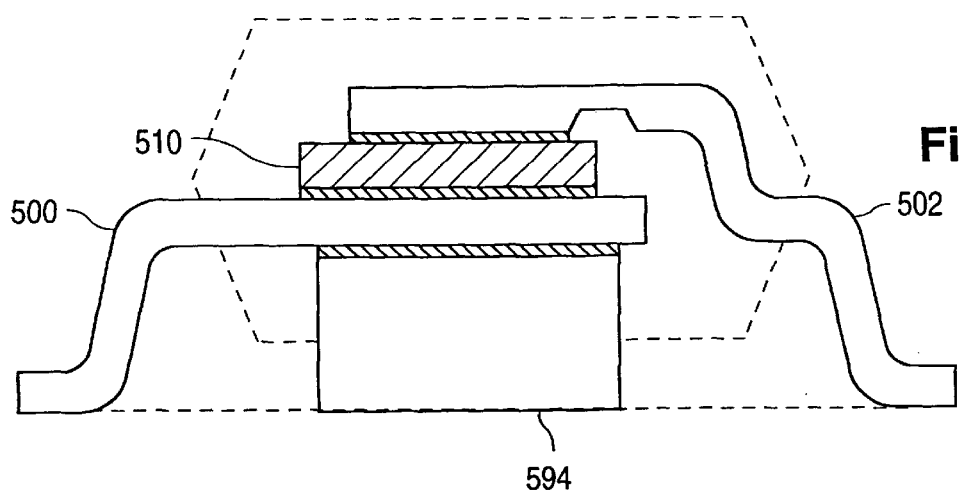
FIGS. 23A–23C are cross-sectional views illustrating variations of a notched bond-wireless package which includes a head slug attached to the bottom of the die.
Figure 23B:
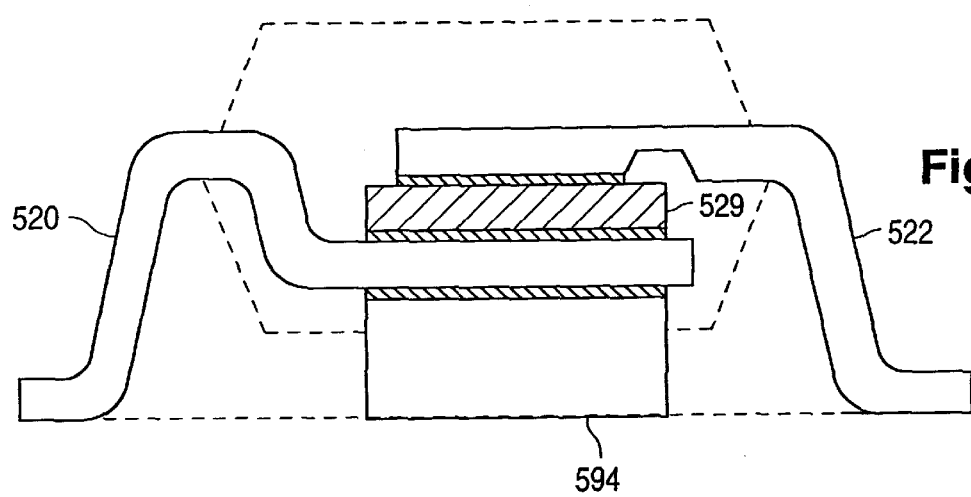
Figure 23C:
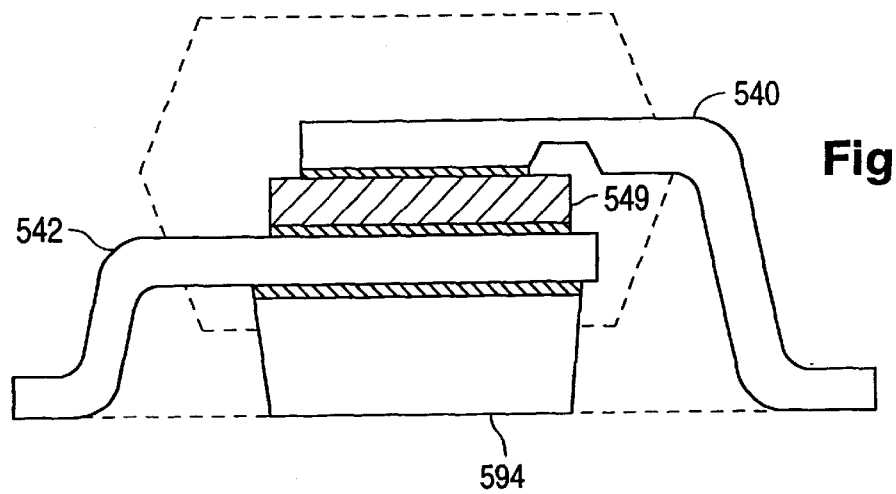

Variations of the slug leadframe design are shown in FIGS. 23A–23C, where FIG. 23A corresponds to a slugged version of FIG. 20A, FIG. 23B corresponds to a slugged version of FIG. 20B, and FIG. 23C corresponds to a slugged version of FIG. 20C.

Figure 24A:
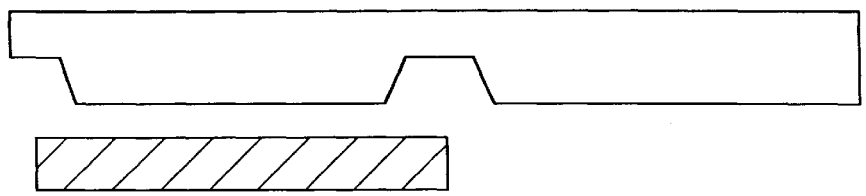
FIGS. 24A–24C illustrate a package in which the notch in the leadframe overlies the entire perimeter of the die.
Figure 24B:
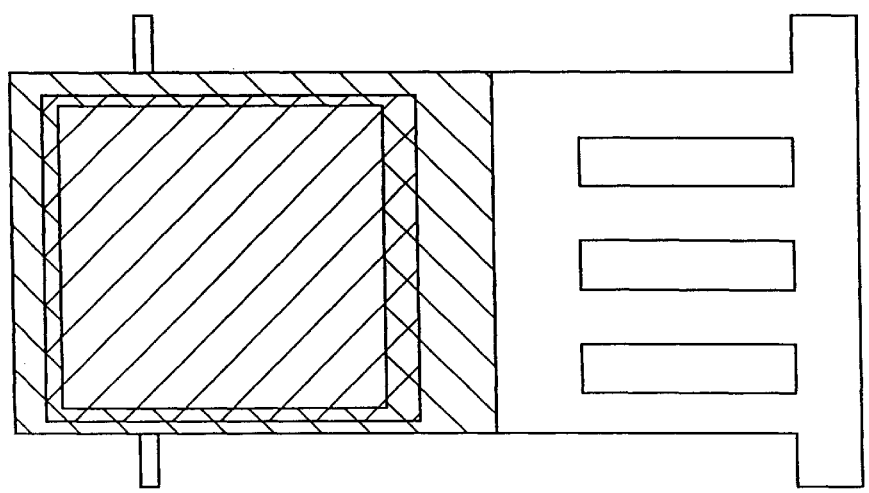
Figure 24C:
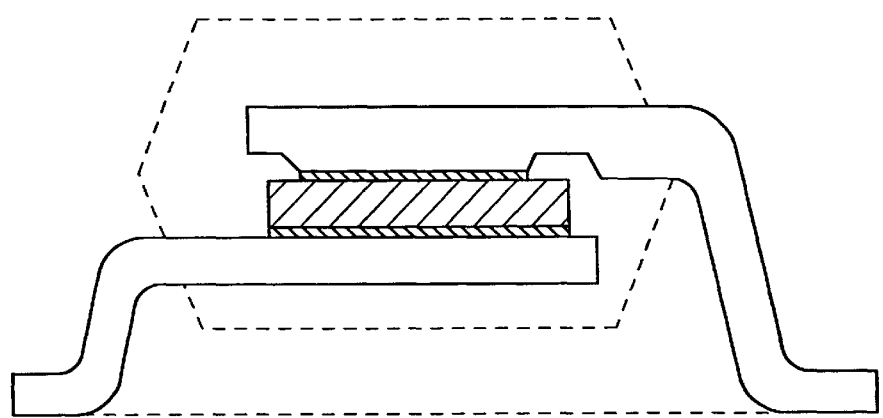
Figure 25A:
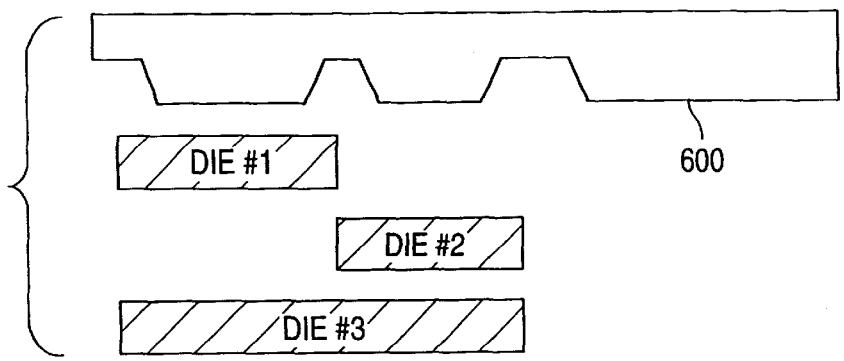
FIGS. 25A–25H illustrate leadframes that can be used to accommodate more than one size of die.
Figure 25B:
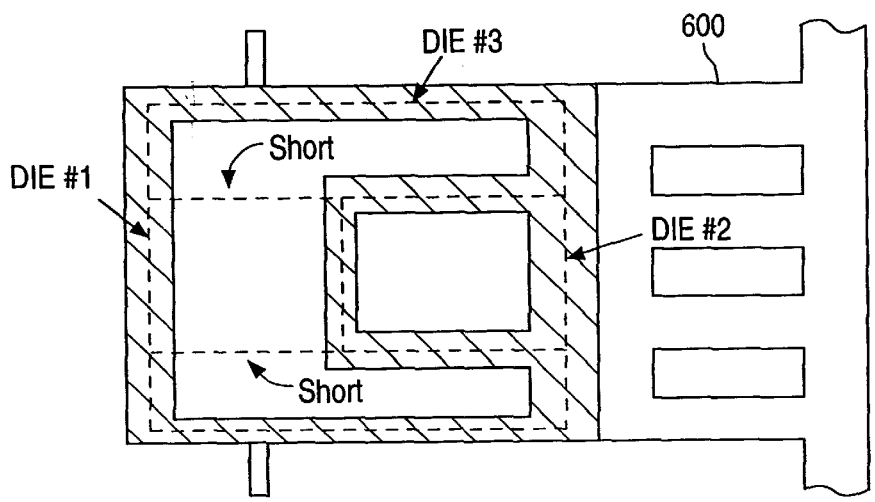
Figure 25C:
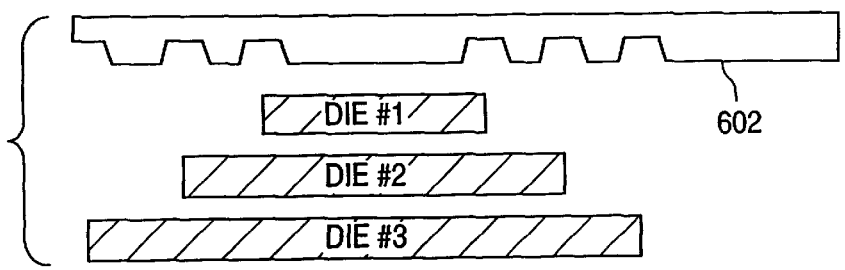
Figure 25D:
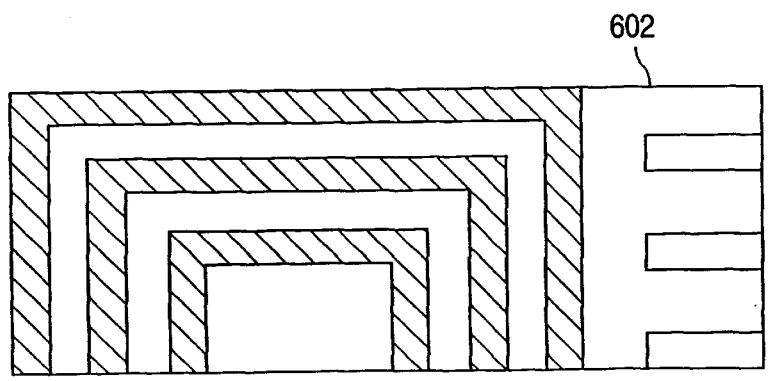
Figure 25E:
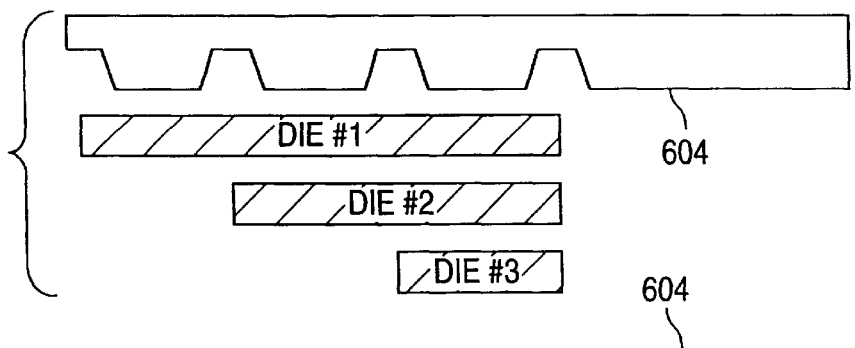
Figure 25F:
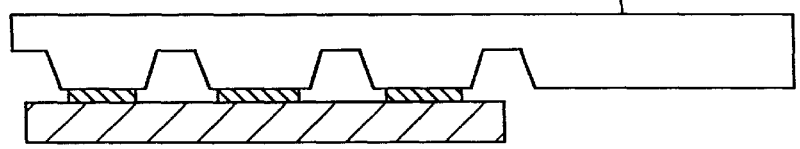
Figure 25G:
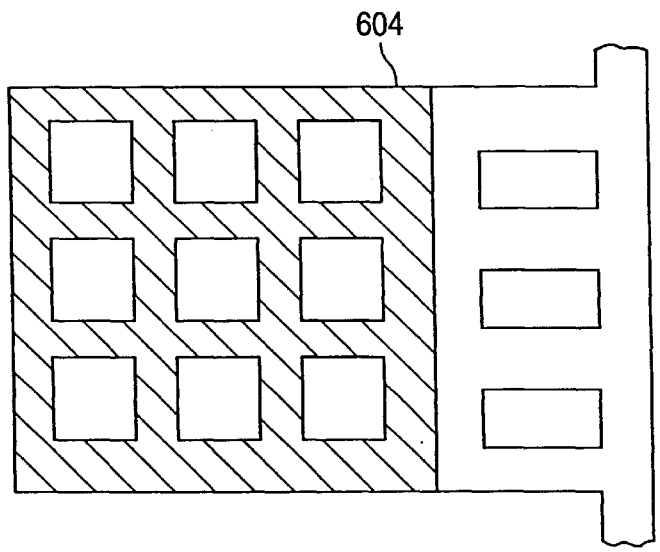
Figure 25H:
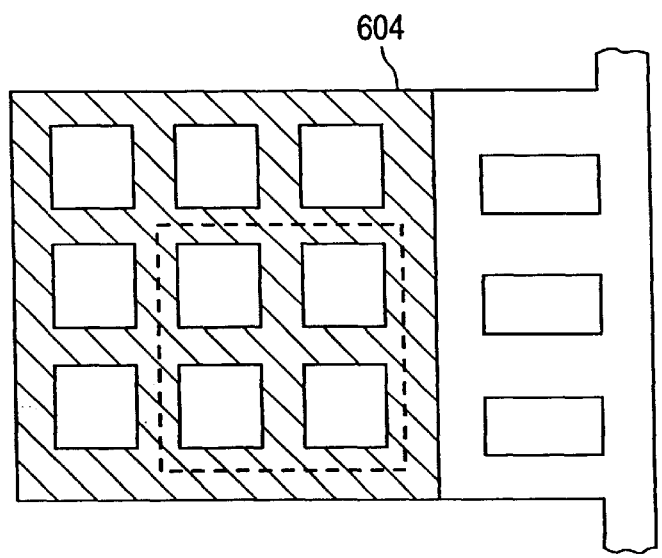

FIGS. 24A–24C illustrate the use of a leadframe notch surrounding the die edge on more than side of the die, avoiding edge shorts in any region where the two overlap. In each embodiment, single die size is matched to the leadframe. This has the disadvantage of requiring a new leadframe for each die size.

FIGS. 25A–25H illustrate leadframe designs which accept more than one size of die. Each leadframe includes multiple notches that can be used to accommodate different die sizes. In each plan view (FIGS. 25B, 25D, 25G and 25H), the hatched portions of the leadframes represent notches; and in each cross-sectional view (FIGS. 25A, 25C and 25E), Die #1, Die #2 and Die #3 represent dice that could each be used individually with the leadframe shown. In the two-ring leadframe 600 shown in FIGS. 25A and 25B however, the Die #1 design of FIG. 25A will not work since it will short in the two locations shown. The concentric design leadframe 602 of FIGS. 25C and 25D avoids this problem but only works for two-terminal devices. Aligning the die to one edge (FIG. 25F) or as a grid (FIG. 25G) makes it possible to adapt this two terminal design into a multi-lead design as shown in FIG. 26. FIG. 27 illustrates the 3-terminal grid version of FIG. 26G.

Figure 26A:
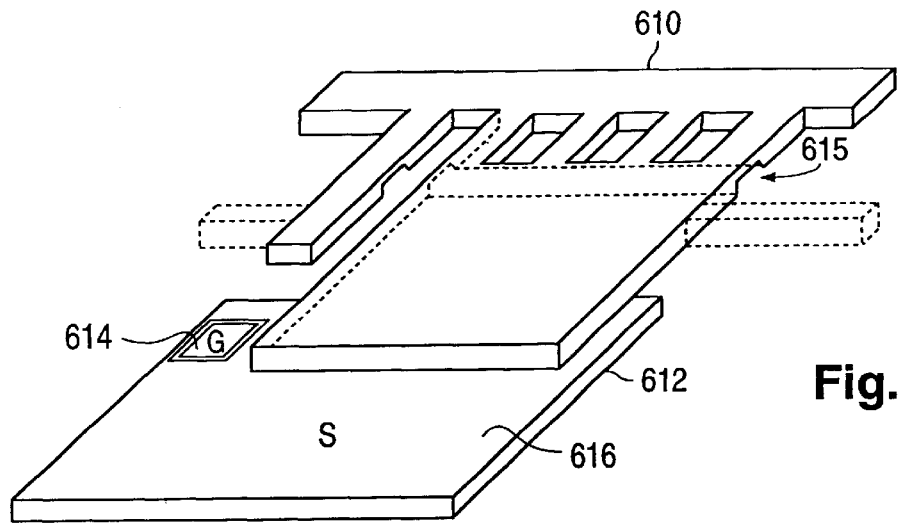
Figure 26B:
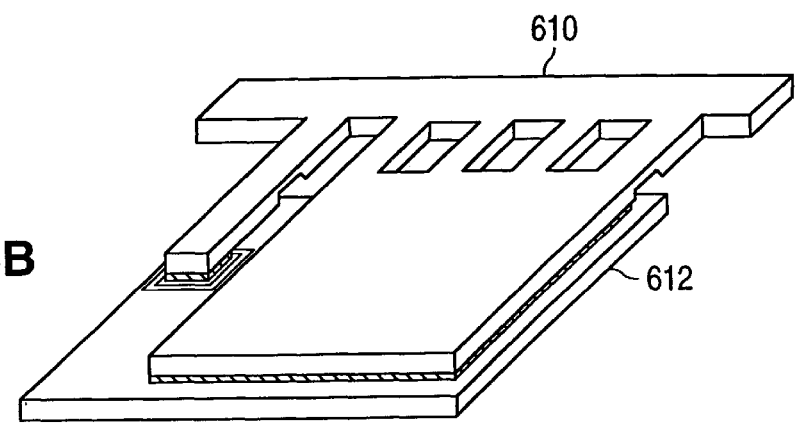
Figure 26C:
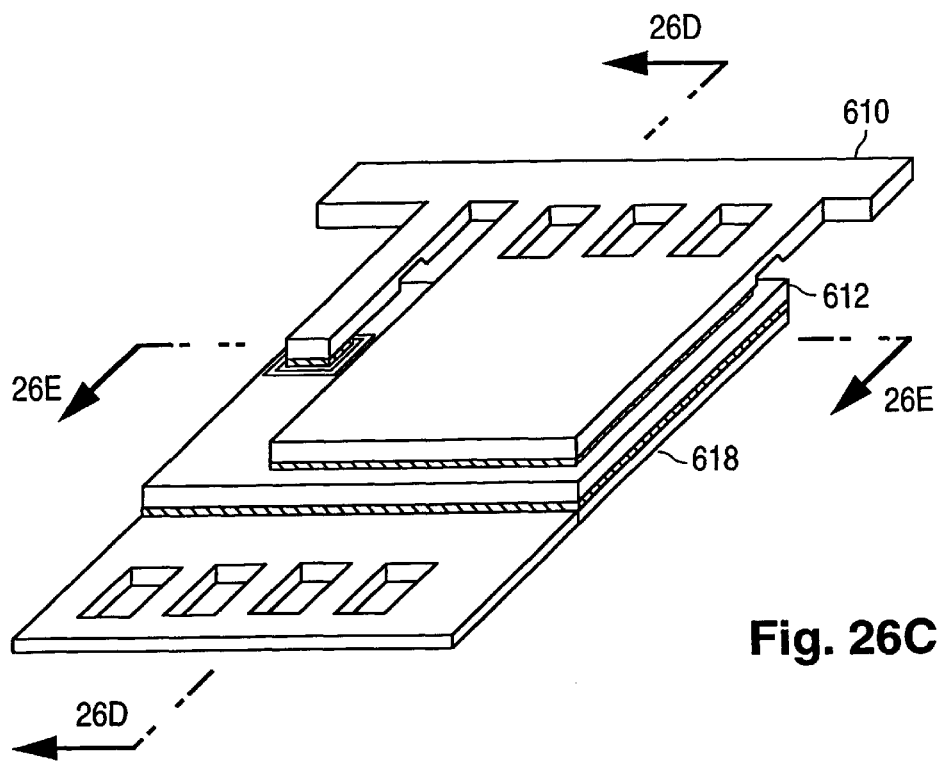

FIG. 26A illustrates a top leadframe 610 for use with a power MOSFET die 612 having a gate pad 614 and a source pad 616. A notch 615 overlies the edge of die 612. FIG. 26B shows the leadframe attached to the die 612, and FIG. 26C shows a bottom leadframe 618 attached to the drain terminal (not shown) of power MOSFET die 612. FIGS. 26D and 26E show cross-sectional views taken at sections 26D—26D and 26E—26E shown in FIG. 26C.

FIG. 27A shows a plan view of a die having a criss-cross pattern of notches that can be used to attach to a variety of die shapes and sizes (one example is shown by the dashed lines). The notches form in effect a pattern of mesas where the epoxy or solder dots can be placed. FIG. 27B is a cross-sectional view showing a die mounted on a leadframe of the kind shown in FIG. 27A.

Figure 28A:
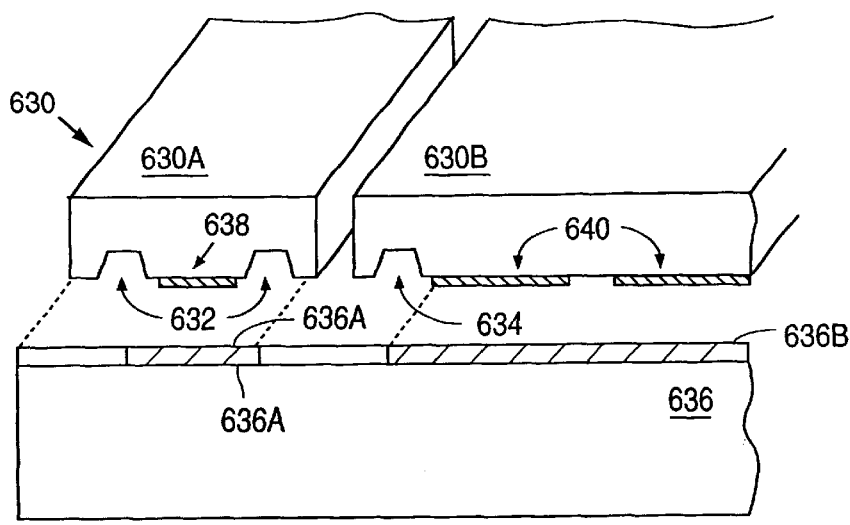
FIGS. 28A–28E illustrate the use of a moat in a leadframe to prevent epoxy or solder from spreading outward from under a lead to form a short with another lead.
Figure 28B:
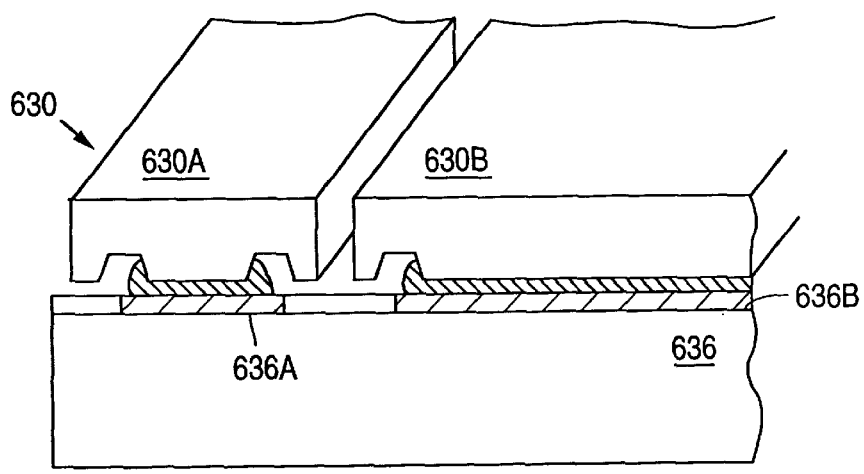
Figure 28C:
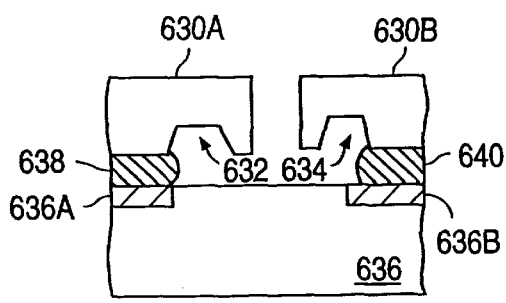
Figure 28D:
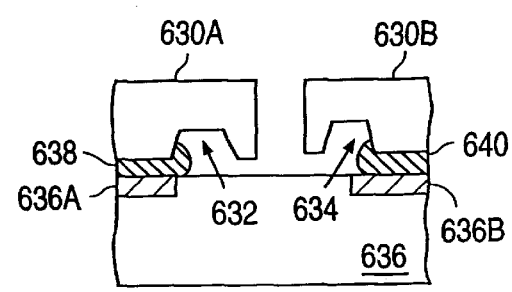
Figure 28E:
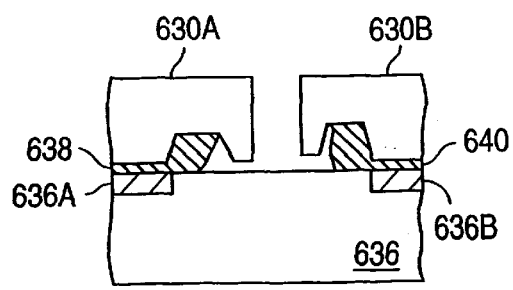
Figure 28F:
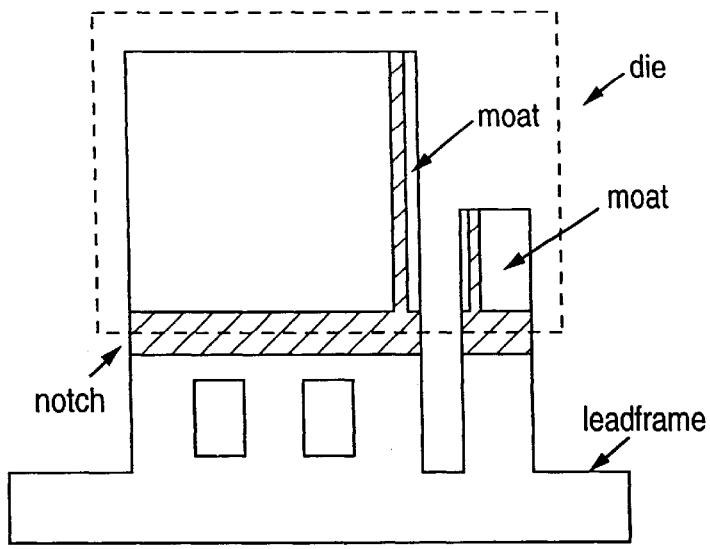
Figure 28G:
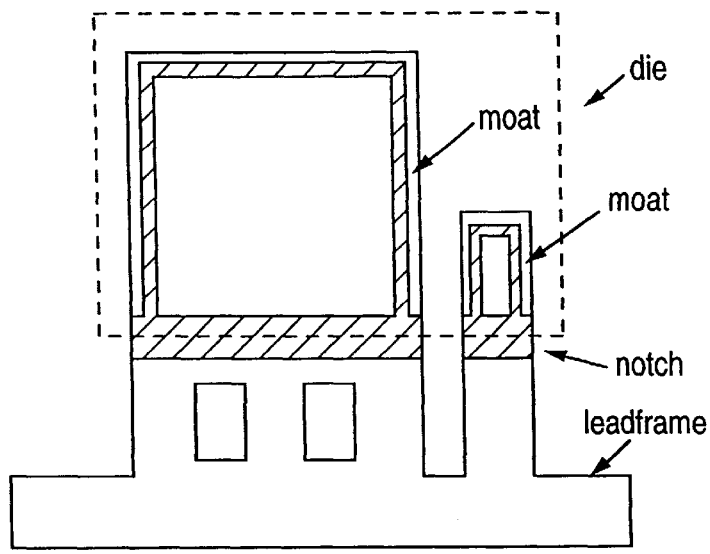
Figure 28H:
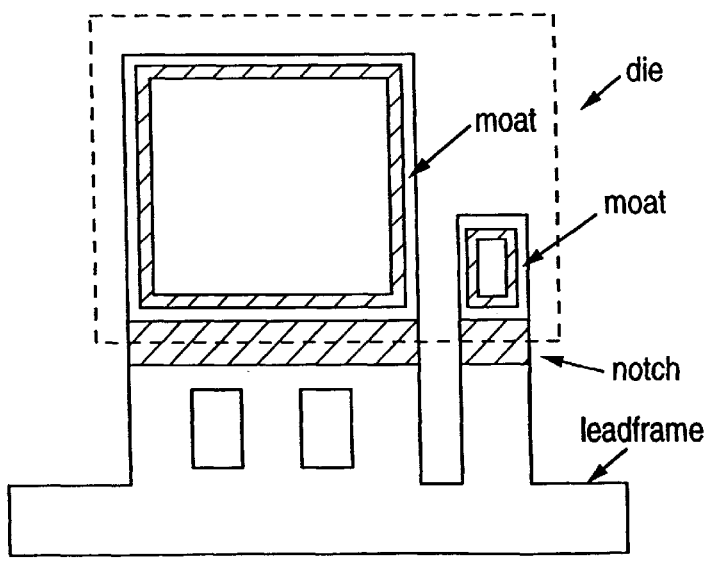
Figure 28L:
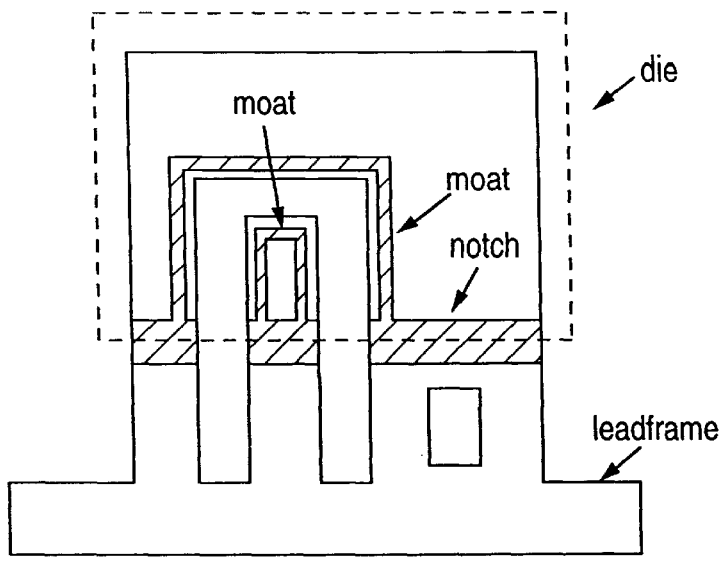

FIG. 28A illustrates the use of a notch as a moat to catch excess solder or epoxy to avoid lead-to-lead shorts. Leads 630A and 630B represent leads that are part of a leadframe 630 but are to be electrically isolated from each other when the package has been completed. (In other words, leads 630A and 630B are initially connected by tie bars that will be severed.) Lead 630A will be electrically connected to a pad 636A on a die 636, and lead 630B will be electrically connected to a pad 636B on die 636. Lead 636A includes moats 632, and lead 636B includes a moat 634. It will be apparent that when leadframe 630 is pressed against die 636, the epoxy layers 638 and 640 will tend to spread outward and, if unchecked, may cause a short between leads 630A and 630B. FIGS. 28C–28E illustrate the mechanism by which a short is prevented. As epoxy layers 638 and 640 are compressed, they flow into moats 632 and 634, respectively, instead of forming a conductive bridge between leads 630A and 630B.

FIGS. 28F–28L illustrate various patterns of moats and notches on leadframes in relation to dice. While the moats are shown as being narrower than the notches, this need not be the case.

Figure 29A:
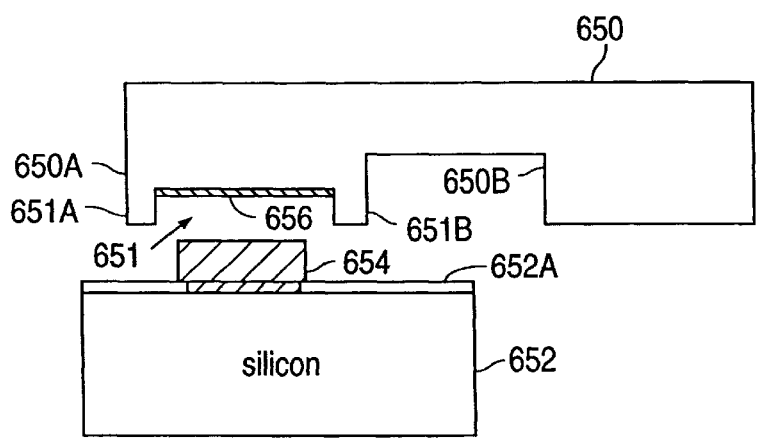
FIGS. 29A and 29B illustrate a leadframe which contains a pocker or cavity to prevent the epoxy or solder from spreading outward.
Figure 29B:
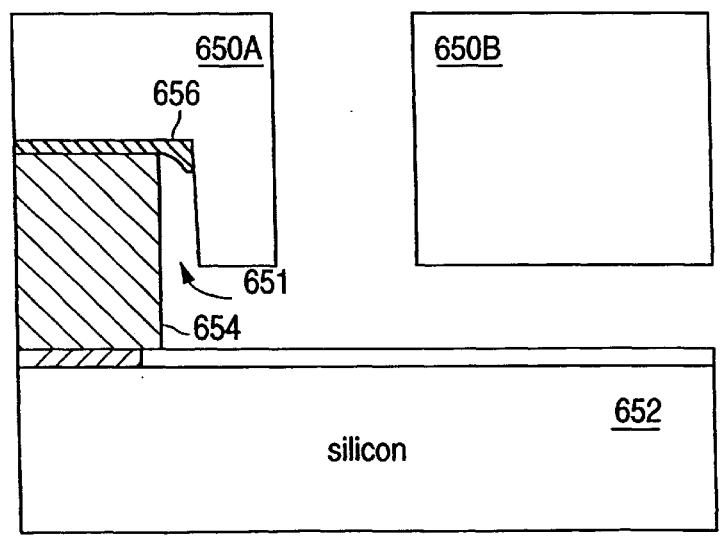

FIG. 29A illustrates a cross-sectional view of a leadframe 650 having leads 650A and 650B that are to be electrically isolated. Lead 650A contains a pocket 651 in which an epoxy layer 656 is deposited. Pocket 651 is positioned so as to mate with a raised pad 654 on a die 652. Walls 651A and 651B which enclose pocket 651 are dimensioned such that, when leadframe 650 is pressed against die 652, walls 651A and 6511B "seal" the epoxy into pocket 651, as shown in FIG. 29B.

Figure 30A:
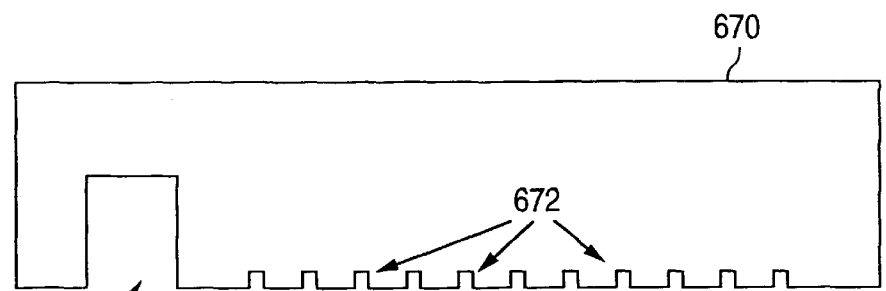
FIGS. 30A–30C illustrate a leadframe containing a plurality of pits or holes which prevent the epoxy or solder from spreading.
Figure 30B:
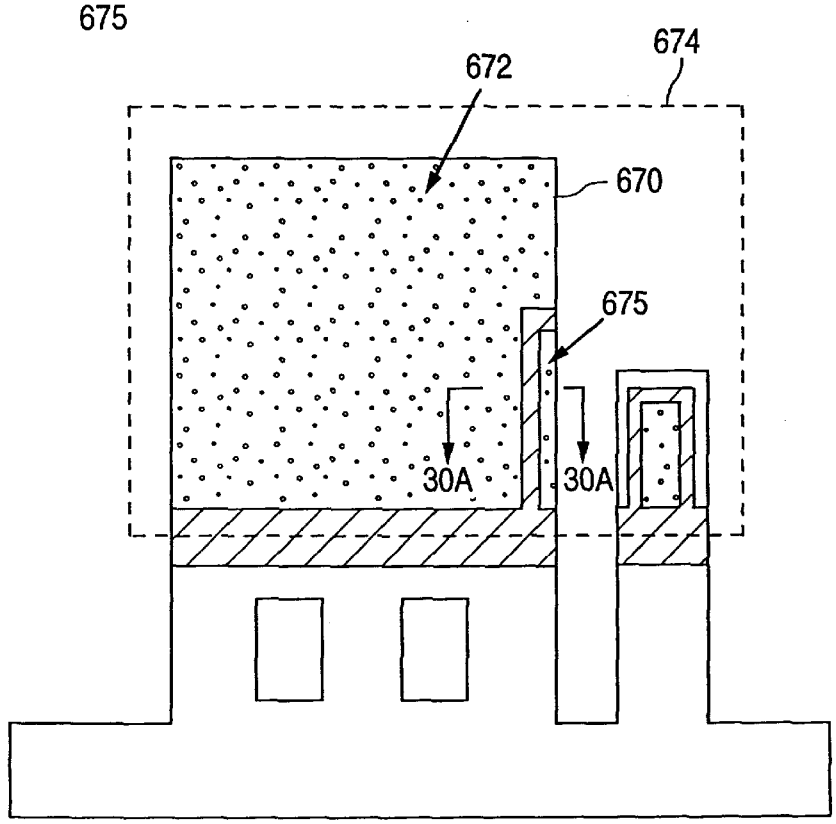
Figure 30C:
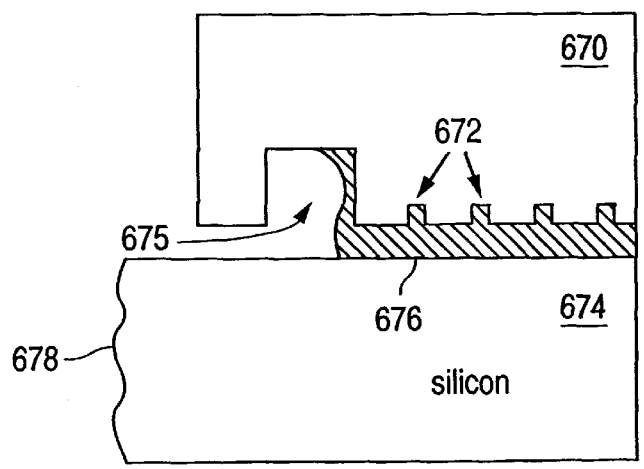

FIG. 30A shows a cross-sectional view of a leadframe 670 is which a number of holes or pits 672 are formed. FIG. 30B shows a plan view including the cross section 30A—30A at which FIG. 30A is taken. As shown in FIG. 30C, when epoxy 676 is applied to the surface of leadframe 670 and leadframe 670 is pressed against a die 674, the epoxy flows into the pits 672, thereby further preventing the epoxy from flowing outward and possibly causing a short. Each of the pits 672 acts as a reservoir for the epoxy. Leadframe 670 also contains an optional moat 675 for additional protection against shorts.

When specific embodiments of this invention have been described, it will be apparent to those skilled in the art that these embodiments are illustrative only and not limiting. Many alternative embodiments in accordance with this invention will be obvious to those skilled in the art from the descriptions herein.

We claim:

1. A die-leadframe combination comprising:
   a die having first and second principal surfaces;
   a first leadframe having a first tie bar connected to a portion of said first leadframe that exerts a pressure in a first direction against the first principal surface of the die;
   a second leadframe having a second tie bar connected to a portion of said second leadframe that exerts a pressure in a second direction opposite to the first direction against the second principal surface of the die;
   wherein the first and second tie bars are offset with respect to each other such that the pressure of the first and second leadframes against the die in the first and second directions, respectively, creates a torque on the die.

2. A method of mounting first and second leadframes to first and second surfaces of a semiconductor die such that substantially no torque is applied to the die during the mounting.

3. The method of claim 2 wherein the first leadframe comprises a first outer tie bar and a first center tie bar and the second leadframe comprises a second outer tie bar and a second center tie bar and wherein the first center tie bar is positioned laterally between the second center tie bar and the second outer tie bar during the mounting.

4. The method of claim 3 wherein the second center tie bar is positioned laterally between the first center tie bar and the first outer tie bar.

5. The method of claim 4 comprising applying a conductive epoxy to the first and second surfaces of the die and allowing the epoxy to cure.

6. The method of claim 5 wherein the die is subjected to substantially no torque while the epoxy is curing.

7. The method of claim 6 comprising trimming the leadframes so as to separate the outer tie bars from leads, wherein the die is subjected to substantially no torque during the trimming.

8. The method of claim 7 comprising bending one or more of the leads wherein the die is subjected to substantially no torque during the bending.

9. A semiconductor die package comprising a semiconductor die and a leadframe attached to a surface of the die, a plurality of leads extending from the surface beyond an edge of the die, a notch being formed in at least one lead at a location where the at least one lead passes over the edge of the die, the notch being formed on a side of the at least one lead facing the die.

10. The semiconductor package of claim 9 comprising a second leadframe attached to a second surface of the die, a second plurality of leads extending from the second surface beyond a second edge of the die, a second notch being formed in a second lead of the second leadframe at a location where the second lead passes over the second edge of the die, the second notch being formed on a side of the second lead facing the die.

11. The semiconductor package of claim 10 comprising a plastic capsule enclosing the die, the first and second pluralities of leads extending from the capsule at the same level.

12. The semiconductor package of claim 11 wherein the first plurality of leads are bent at a location within the capsule.

13. A leadframe for use in forming an electrical connection with a semiconductor die in a package, the leadframe comprising a lead, the lead having a plurality of notches such that the leadframe is capable of being used with dice of more than one size, one of the notches being positioned over an edge of each of the dice.

* * * * *